US012148747B2

(12) United States Patent
Then et al.

(10) Patent No.: US 12,148,747 B2
(45) Date of Patent: Nov. 19, 2024

(54) GALLIUM NITRIDE (GAN) THREE-DIMENSIONAL INTEGRATED CIRCUIT TECHNOLOGY

(71) Applicant: Intel Corporation, Santa Clara, CA (US)

(72) Inventors: Han Wui Then, Portland, OR (US); Marko Radosavljevic, Portland, OR (US); Pratik Koirala, Portland, OR (US); Nicole K. Thomas, Portland, OR (US); Paul B. Fischer, Portland, OR (US); Adel A. Elsherbini, Chandler, AZ (US); Tushar Talukdar, Wilsonville, OR (US); Johanna M. Swan, Scottsdale, AZ (US); Wilfred Gomes, Portland, OR (US); Robert S. Chau, Beaverton, OR (US); Beomseok Choi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 845 days.

(21) Appl. No.: 17/033,513

(22) Filed: Sep. 25, 2020

(65) Prior Publication Data
US 2022/0102339 A1    Mar. 31, 2022

(51) Int. Cl.
*H01L 27/06* (2006.01)
*H01L 21/765* (2006.01)
(Continued)

(52) U.S. Cl.
CPC ........ *H01L 27/0605* (2013.01); *H01L 21/765* (2013.01); *H01L 23/481* (2013.01);
(Continued)

(58) Field of Classification Search
CPC .. H01L 27/0605; H01L 21/765; H01L 23/481
See application file for complete search history.

(56) References Cited

U.S. PATENT DOCUMENTS 9,368,622 B1  6/2016  Boutros
11,342,248 B2 * 5/2022  Mcknight-Macneil ..................... H01L 23/53228
(Continued)

FOREIGN PATENT DOCUMENTS

CN      107230722     10/2017
EP      3905336       11/2021
WO      WO 2019066877  4/2019

OTHER PUBLICATIONS

International Preliminary Report on Patentability for International Patent Application No. PCT/US2021/047748, mailed Apr. 6, 2023, 8 pgs.
(Continued)

*Primary Examiner* — Thao P Le
(74) *Attorney, Agent, or Firm* — Schwabe, Williamson & Wyatt P.C.

(57) ABSTRACT

Gallium nitride (GaN) three-dimensional integrated circuit technology is described. In an example, an integrated circuit structure includes a layer including gallium and nitrogen, a plurality of gate structures over the layer including gallium and nitrogen, a source region on a first side of the plurality of gate structures, a drain region on a second side of the plurality of gate structures, the second side opposite the first side, and a drain field plate above the drain region wherein the drain field plate is coupled to the source region. In another example, a semiconductor package includes a package substrate. A first integrated circuit (IC) die is coupled to the package substrate. The first IC die includes a GaN device layer and a Si-based CMOS layer.

21 Claims, 64 Drawing Sheets

(51) Int. Cl.
    *H01L 23/00*     (2006.01)
    *H01L 23/48*     (2006.01)
    *H01L 23/498*     (2006.01)
    *H01L 23/64*     (2006.01)
    *H01L 25/00*     (2006.01)
    *H01L 25/065*     (2023.01)
    *H01L 27/092*     (2006.01)
    *H01L 29/06*     (2006.01)
    *H01L 29/20*     (2006.01)
    *H01L 29/205*     (2006.01)
    *H01L 29/40*     (2006.01)
    *H01L 29/423*     (2006.01)
    *H01L 29/66*     (2006.01)
    *H01L 29/778*     (2006.01)
    *H01L 29/786*     (2006.01)

(52) U.S. Cl.
    CPC ...... *H01L 23/49844* (2013.01); *H01L 23/642* (2013.01); *H01L 24/16* (2013.01); *H01L 25/0657* (2013.01); *H01L 25/50* (2013.01); *H01L 27/0688* (2013.01); *H01L 27/0922* (2013.01); *H01L 29/0673* (2013.01); *H01L 29/2003* (2013.01); *H01L 29/205* (2013.01); *H01L 29/402* (2013.01); *H01L 29/42392* (2013.01); *H01L 29/66462* (2013.01); *H01L 29/7786* (2013.01); *H01L 29/78696* (2013.01); *H01L 2224/16225* (2013.01); *H01L 2225/06541* (2013.01); *H01L 2924/10253* (2013.01); *H01L 2924/1033* (2013.01); *H01L 2924/13064* (2013.01); *H01L 2924/13091* (2013.01); *H01L 2924/19041* (2013.01); *H01L 2924/19103* (2013.01)

(56) References Cited

U.S. PATENT DOCUMENTS

| | | | |
|---|---|---|---|
| 11,887,945 B2 * | 1/2024 | Zhao | H01L 24/48 |
| 2012/0126287 A1 | 5/2012 | Aoki | |
| 2012/0217544 A1 | 8/2012 | Ohki | |
| 2013/0069173 A1 | 3/2013 | Chang | |
| 2013/0320350 A1 | 12/2013 | Oliver | |
| 2014/0092637 A1 | 4/2014 | Minoura | |
| 2019/0280092 A1 | 9/2019 | Lin | |
| 2020/0035683 A1 * | 1/2020 | Sharma | H01L 24/17 |
| 2020/0052103 A1 | 2/2020 | Tao | |
| 2020/0194427 A1 * | 6/2020 | Dewey | H01L 27/0605 |
| 2020/0373297 A1 | 11/2020 | Nidhi | |
| 2021/0005531 A1 * | 1/2021 | Disney | H01L 23/5226 |
| 2021/0098422 A1 * | 4/2021 | Elsherbini | H01L 23/5389 |
| 2021/0399096 A1 * | 12/2021 | Mishra | H01L 29/7789 |
| 2022/0093790 A1 * | 3/2022 | Glass | H01L 29/2003 |
| 2022/0102344 A1 * | 3/2022 | Then | H01L 27/0688 |

OTHER PUBLICATIONS

Notice of Allowance from Netherland Patent Application No. 2029033, mailed Jul. 27, 2022, 5 pgs.
Office Action from Netherland Patent Application No. 2029033, mailed May 25, 2022, 17 pgs.
Extended European Search Report for European Patent Application No. 21873162.8 mailed Sep. 3, 2024, 12 pgs.

* cited by examiner

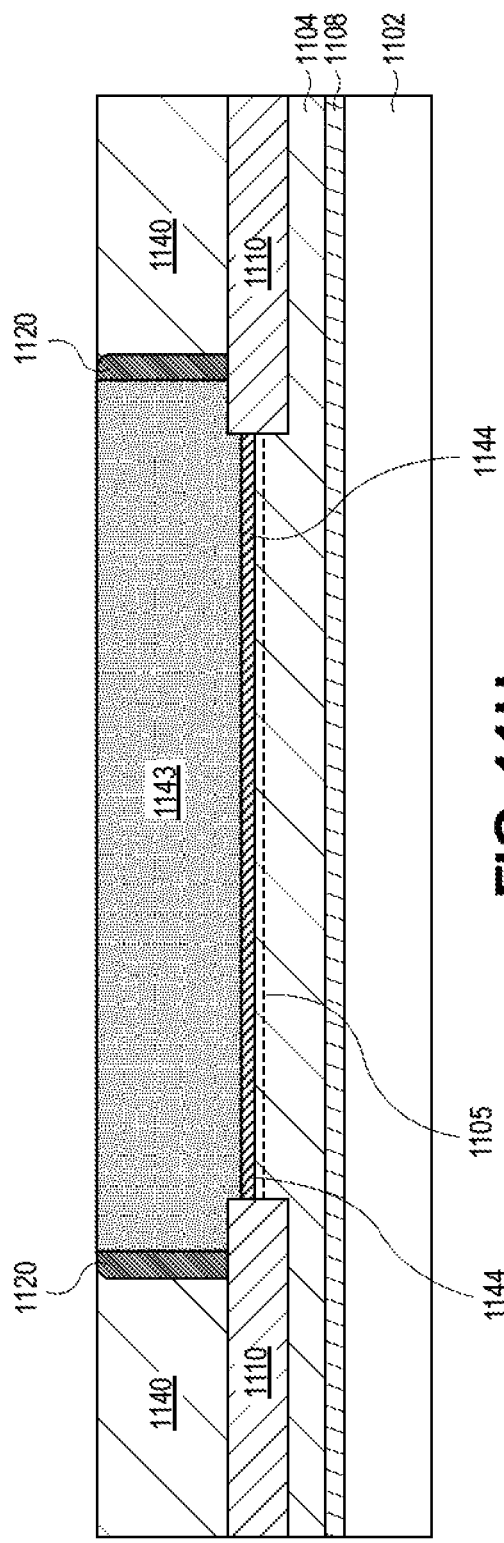
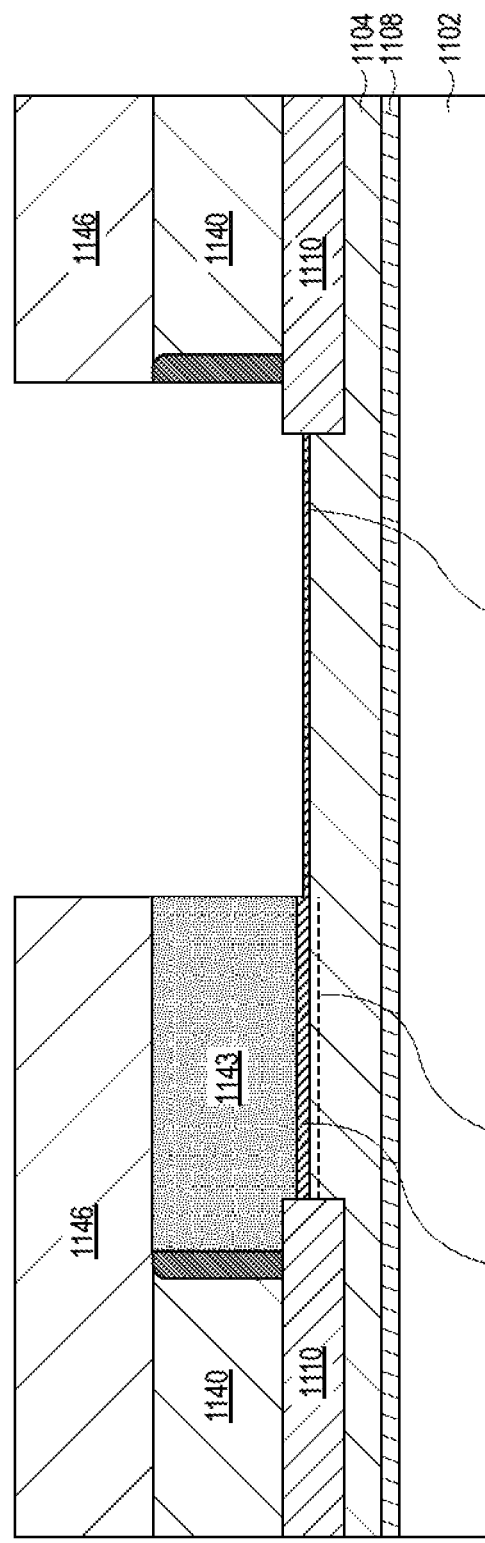

Compute Solutions

TSVs

GALLIUM NITRIDE (GAN) THREE-DIMENSIONAL INTEGRATED CIRCUIT TECHNOLOGY

TECHNICAL FIELD

Embodiments of the disclosure are in the field of advanced integrated circuit structure fabrication and packaging and, in particular, gallium nitride (GaN) three-dimensional integrated circuit technology.

BACKGROUND

Power delivery and RF communication are essential to every compute solution. Si and III-V technologies are facing fundamental limits in power and RF. Future compute solutions will require a better semiconductor technology to continue to deliver better energy efficiencies, better performance, and more functionalities in smaller form factors. Two industry trends are converging to transform power delivery and RF: 300 mm gallium nitride (GaN)-on-Si and monolithic 3D ICs. Amongst semiconductor technologies today, GaN is best for power delivery and RF due to its wide bandgap qualities. Monolithic 3D integration is a powerful way to integrate dissimilar best-in-class semiconductor technologies on the same silicon to deliver the best performance, improved density, and more functionalities.

BRIEF DESCRIPTION OF THE DRAWINGS

FIGS. 11A-11K illustrate cross-sectional views of a method of fabricating a GaN transistor having multiple threshold voltage in accordance with embodiments of the present disclosure.

FIG. 16A illustrates a III-V semiconductor layer formed over a substrate;

FIG. 16B illustrates the structure of FIG. 16A following formation of shallow trench isolation regions;

FIG. 16C illustrates the formation of a sacrificial gate and a seed layer on the structure of FIG. 16B;

FIG. 16D illustrates the formation of a hard mask over the transistor region of the structure of FIG. 16C;

FIG. 16E illustrates the formation of recesses in the structure of FIG. 16D;

FIG. 16F illustrates the formation of a source region, and drain region, a first contact and a second contact on the structure of FIG. 16E;

FIG. 16G illustrates the formation of an interlayer dielectric over the structure of FIG. 16F and the removal of the sacrificial gate structure from the structure of FIG. 16F; and FIG. 16H illustrates the formation of a gate stack on the structure of FIG. 16G.

DESCRIPTION OF THE EMBODIMENTS

Figure 1:
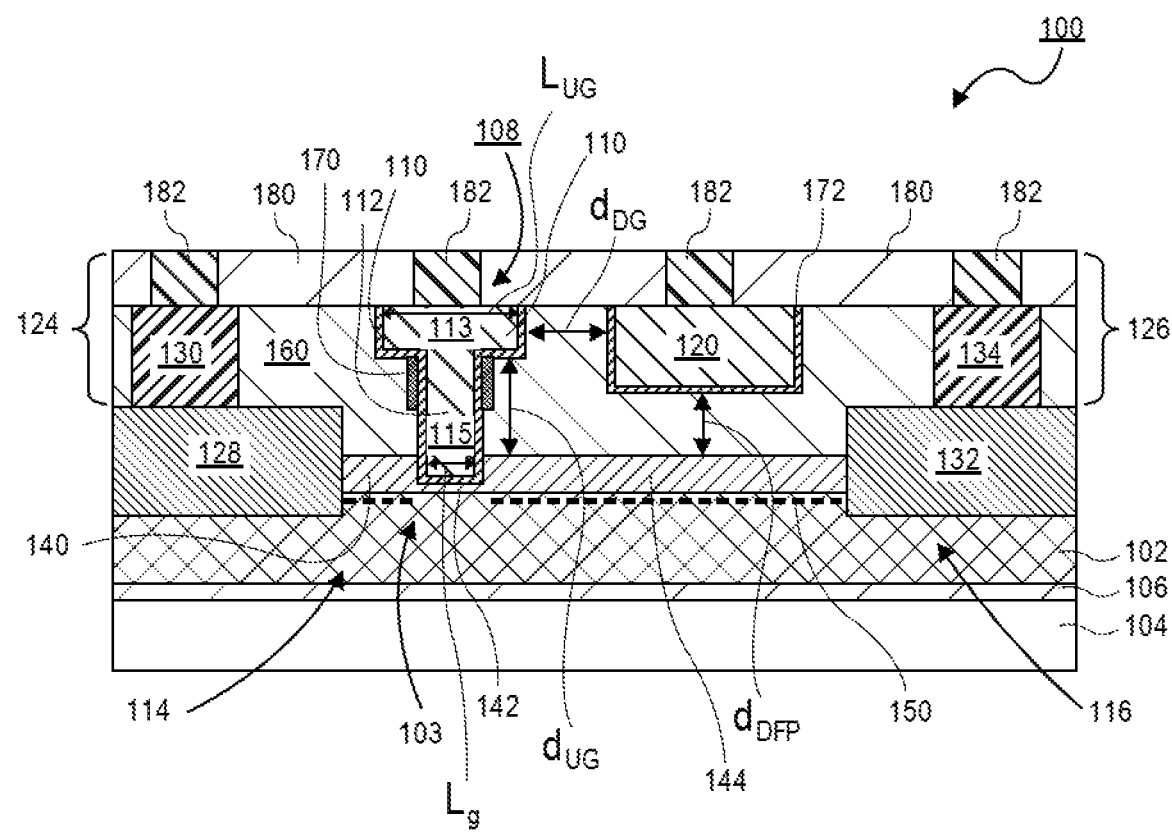
FIG. 1 illustrates a cross-sectional view of a transistor having a drain field plate, in accordance with embodiments of the present disclosure.

Gallium nitride (GaN) three-dimensional integrated circuit technology is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with embodiments of the present disclosure, monolithic 3D integration of GaN NMOS and Si CMOS enables full integration of energy-efficient, truly compact power delivery and RF solutions with CMOS digital signal processing, logic computation and control, memory functions and analog circuitries for next generation power delivery, RF (5G and beyond) and SoC applications. Various scenarios of implementing power delivery in the package, substrate, and chip are contemplated for various types of multi-chip packages.

Inflection points: (a) Today, products are pushing the envelope of power delivery towards 2000 W and beyond. This demands compact high power solutions that only GaN 3D IC can provide. Power delivery experts can now be empowered to re-think the entire power delivery chain from 48V-to-1V, from servers to clients, how to achieve higher efficiencies as well as higher frequencies to shrink inductor size. (b) Emergence of new communication standards at ever higher frequencies and larger bandwidths, e.g. WiFi 7, and convergence of 5G wireless and WiFi, demand cost effective, efficient and compact high-power RF frontend solutions that only 300 mm GaN 3D IC can provide. In a 5G basestation/picocell, a phase array solution based on Si or SiGe technology would require>1000 RF power amplifiers (PAs) to produce the same RF output power that can be achieved with about 100 GaN RF PAs. Moreover, the phase array based on GaN 3D IC could be about 10× cheaper and consume up to about 35% less power.

Customers will require compact, efficient power and RF solutions along with compute solutions. 300 mm GaN 3D IC offers high power delivery and RF output at high frequency which no other technology can deliver. It is about 50× cheaper than today's 4" GaN-on-SiC, 30-50% more efficient and about 10× smaller than Si/III-V technologies. Before GaN 3D IC, there is not one technology that can meet the diverse needs of RF frontends. These solutions come in multiple separate chips that must be made to work together in a bulky package. With GaN 3D IC, single-chip RF frontend solutions can be enabled that integrates all these functionalities onto a single die. Therefore, GaN 3D IC could enable features that were not possible before, for e.g., tiny power delivery chiplets, and fully integrated RF FE for 5G picocells and basestation.

Three-dimensional (3D) co-integration of GaN power transistors with Si CMOS can be readily detected by conventional cross-section and/or material analysis techniques. For example, Transmission Electron Microscopy (TEM)) can be used to identify 3D structural arrangements of GaN and Si transistors. Electron Energy Loss Microscopy (EELS) can be used to identify elemental composition of transistor channels to show the presence of Ga and Si in the transistors.

In a first aspect, high voltage scaled GaN devices are described.

To provide context, RF power amplifiers (RF PAs) are needed to transmit RF signals between mobile devices and base stations located at far distances away, such as greater than 1 mile. The efficiency of these RF PAs is a key determinant of battery life in mobile handsets and power consumption (cost) in RF base stations. Good linearity of the RF power amplifier is required for modern communication standards such as 4G LTE and 5G standards. RF PAs typically operate at several dB back-off from its saturated mode in order to meet the linearity requirements. Thus, the efficiency suffers and in most PAs, it may degrade by a factor of 2-3×.

Due to its wide bandgap and high critical breakdown electric field, gallium nitride (GaN) transistors are considered for high voltage applications such as power converters, RF power amplifiers, RF switch and high voltage applications. Simple transistor architecture, namely, having a single gate, source and drain, falls short of realizing the full potential of GaN in achieving the maximum breakdown voltage as dictated by its material properties. This is because the drain electric field concentrates at the edge of the gate and causes premature breakdown.

Embodiments of the present disclosure relate to gallium nitride (GaN) transistors having drain field plates. In embodiments, the transistors of the present disclosure have a gallium nitride (GaN) layer disposed above a substrate. A gate structure is disposed above the GaN layer. A source region and a drain region are disposed on opposite sides of the gate structure. The drain field plate may be biased to an electrical potential which is different than a gate voltage and/or VSS offering a greater degree of control of the drain field. The transistors of the present disclosure may enable new circuit architectures, such as a cross-coupled pairs. Additionally, the distance the drain field plate extends above the drain can be independently adjusted to improve the effect the field plate has on the drain field distribution, and hence increase breakdown voltage and linearity. In an embodiment, the transistor is operated in an enhancement mode. In an embodiment the gate structure may have a "T" shape in order to reduce the electrical resistance of the gate structure. In an embodiment, the transistor may include a second gate structure or multiple gate structures disposed between the gate structure and the drain field plate to provide a multigate switch for, for example, an RF voltage divider.

FIG. 1 illustrates as transistor 100 having a drain field plate in accordance with embodiments of the present disclosure. Transistor 100 includes a GaN layer 102 disposed above a substrate 104. A buffer layer 106 may be disposed between GaN layer 102 and substrate 104. A gate structure 108 is disposed above GaN layer 102 as illustrated in FIG. 1. Gate structure 108 may include a gate dielectric 110, such as a high k gate dielectric, such as but not limited to hafnium oxide (e.g., $HfO_2$) and aluminum oxide (e.g., $Al_2O_3$), and a gate electrode 112, such as a metal gate electrode. A source region 114 and a drain region 116 are disposed on opposite sides of gate structure 108 as illustrated in FIG. 1.

Transistor 100 includes a drain field plate 120 located above drain region 116. Drain field plate 120 is separated from drain region 116 by a distance ($d_{DFP}$) as illustrated in FIG. 1. Drain field plate 120 may be separated from gate structure 108 by a distance $d_{DG}$.

In an embodiment, source region 114 includes a source contact 124 and drain region 116 includes a drain contact 126. Source contact 124 may include a source semiconductor contact 128 and a source metal contact 130, and drain contact 126 may include a drain semiconductor contact 132 and a drain metal contact 134. In an embodiment as illustrated in FIG. 1, source semiconductor contact 128 and drain semiconductor contact 132 are formed from a III-N semiconductor, such as but not limited to indium gallium nitride (InGaN). In an embodiment, the III-N semiconductor has an N+ conductivity, such as, for example, containing Si dopant density greater than $1 \times 10^{18}$ atoms/cm$^3$. In an embodiment, the source metal contact 130 and the drain metal contact 134 include a metal, such as but not limited to titanium. In an embodiment, drain field plate 120 is located laterally between drain metal contact 134 and gate structure 108 as shown in FIG. 1.

Transistor 100 may include a polarization layer 140 disposed on GaN layer 102. Polarization layer 140 may be formed from a group III-N semiconductor, such as but not limited to aluminum gallium nitride (AlGaN), aluminum indium nitride (AlInN), aluminum indium gallium nitride (AlInGaN) and indium gallium nitride (InGaN). In an embodiment, polarization layer 140 is sufficiently thick in order to create a two-dimensional electron gas (2DEG) effect or layer 150 in the top surface of GaN layer 102 as illustrated in FIG. 1. In an embodiment, polarization layer 140 has a portion 142 beneath gate structure 108 which is thinner than portion 144 above source region 114 and drain region 116 so that a 2DEG layer or effect is not created in gallium nitride layer 102 beneath gate structure 108 as shown in FIG. 1. In an embodiment, polarization layer 140 is completely removed from under gate structure 108 and gate structure 108 is disposed directly on GaN layer 102. In an embodiment polarization layer 140 is multilayer film including a lower AlN film and an upper AlInN for example. In an embodiment, transistor 100 is operated in an enhancement mode.

Drain field plate 120 and gate structure 108 are disposed within dielectric layer 160 as illustrated in FIG. 1. In an embodiment, the top surface of drain field plate 120, is coplanar with the top surface of gate structure 108 as illustrated in FIG. 1. In an embodiment, the top surface of dielectric layer 160 is coplanar with the top surface of gate structure 108, and drain field plate 120 as illustrated in FIG. 1. In an embodiment, the top surface of source metal contact 130 and the top surface of drain metal contact 134 are coplanar with the top surface of gate structure 108 and the top surface of drain field plate 120.

Transistor 100 has a gate length ($L_g$) in a first direction extending between the source region 114 and the drain region 116 as shown in FIG. 1. A channel region is located in GaN layer 102 beneath gate structure 108 and between source region 114 and drain region 116. Transistor 100 has a gate width (Gw) in a direction perpendicular (in and out of the page) to the gate length ($L_g$) direction. In an embodiment, transistor 100 has a gate width (Gw) between 0.010 microns-100 microns. In an embodiment, drain field plate 120 extends the entire gate width (Gw) of transistor 100. In an embodiment, gate structure 108 has a "T" shape as illustrated in FIG. 1. Gate structure 108 may include an upper gate portion 113 and a lower gate portion 115. Upper gate portion 113 is distal from GaN layer 102 while lower gate portion 115 is nearer GaN layer 102. In an embodiment, lower gate portion 115 has a length ($L_g$) in the gate length direction which defines the gate length ($L_g$) of transistor 100. In an embodiment, upper gate portion 113 has length ($L_{ug}$)

in the gate length direction which is at least two times, and in other embodiments at least three times, greater than the gate length ($L_g$) of lower gate portion 115. In an embodiment, as shown in FIG. 1 upper gate portion 113 extends a distance ($d_{UG}$) above drain region 116 which is greater than the distance $d_{DFP}$ that drain field plate 120 extends above drain region 116. A recessed drain field plate may provide improved control of the drain field. In an embodiment, a recessed drain field plate may exert a depletion effect on the 2DEG in the extended drain region. In an embodiment, upper gate portion 113 extends a distance ($d_{UG}$) above drain region 116 which is the same distance $d_{DFP}$ that drain field plate 120 extends above drain region 116. In an embodiment, gate dielectric 110 is disposed along the sidewalls and bottom of upper gate portion 113 and along the sidewalls and bottom of lower gate portion 115 as illustrated in FIG. 1.

In an embodiment, drain field plate 120 may be biased separately from a gate voltage (Vg) applied to gate structure 108. In an embodiment, drain field plate 120 may be biased to a potential different than Vss or ground. In an embodiment, drain field plate 120 may be biased differently than the voltage applied to source region 114. In an embodiment, drain field plate 120 may be biased differently than a voltage applied to drain region 116. In an embodiment, drain field plate 120 is not electrically connected to drain region 116.

In an embodiment, a pair of insulative spacers 170 are disposed along opposite sides of gate structure 108 as illustrated in FIG. 1. In an embodiment, insulative spacers 170 do not extend the entire height of gate structure 108. In an embodiment, insulative spacers 170 do not contact polarization layer 140 or GaN layer 102. In an embodiment, spacers 170 are formed beneath upper gate portion 113 and on sidewalls of lower gate portion 115 as illustrated in FIG. 1. In an embodiment, insulative spacers 170 are formed from an insulative material, such as but not limited to, silicon nitride and silicon oxynitride, which is different from the dielectric material of dielectric layer 160.

In an embodiment, a second dielectric layer 180 is disposed over dielectric layer 160. A plurality of conductive vias 182 may be disposed in dielectric 180 to enable independent electrical connections to and control of source region 114, drain region 116, drain field plate 120 and gate structure 108.

In an embodiment, a high k dielectric 172, such as but not limited to hafnium oxide (e.g., $HfO_2$) and aluminum oxide (e.g., $Al_2O_3$) may be disposed and on the sidewalls and bottom surface of drain field plate 120 as illustrated in FIG. 1. In an embodiment, high k dielectric 172 is the same high k dielectric material as gate dielectric layer 110 of gate structure 108.

Figure 2:
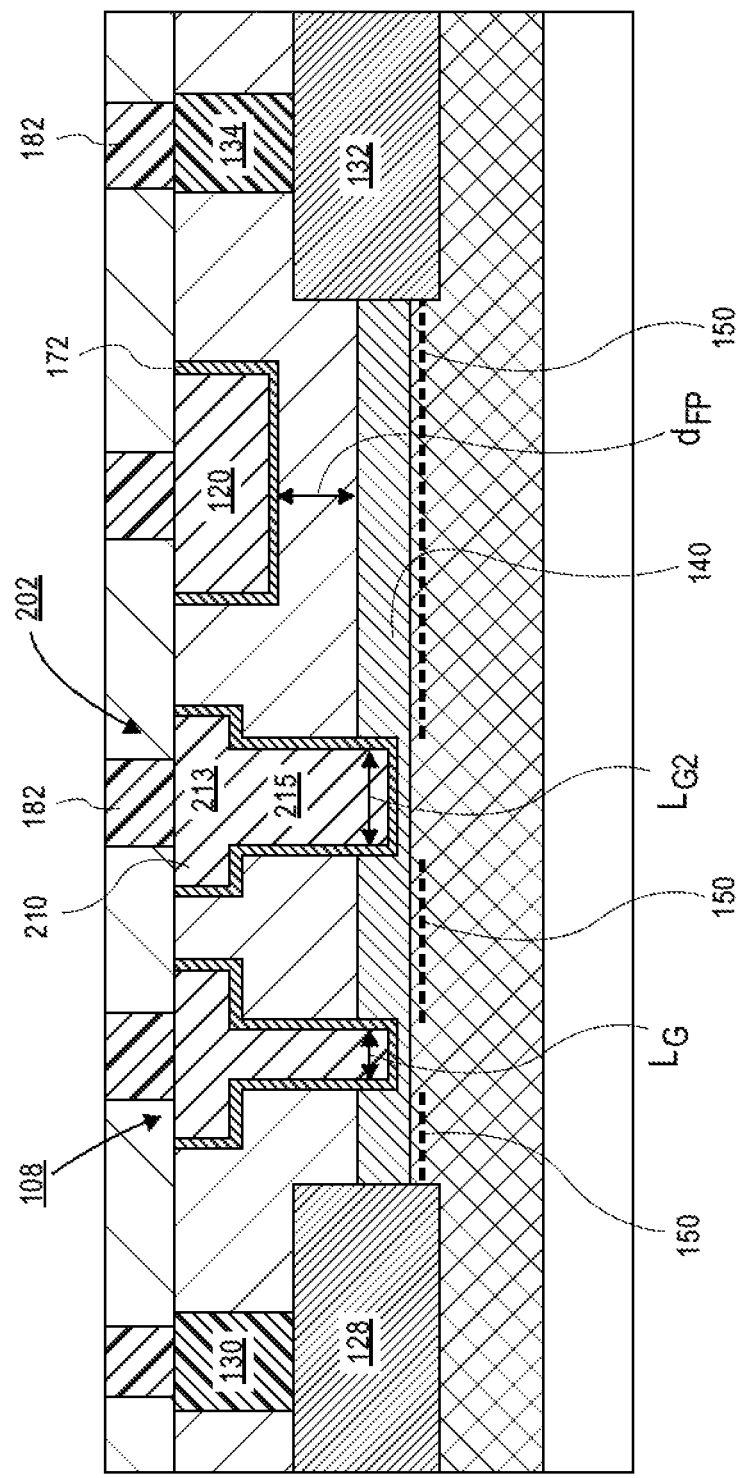
FIG. 2 illustrates a cross-sectional view of a GaN transistor having a drain field plate and having multiple gates, in accordance with embodiments of the present disclosure.

FIG. 2 illustrates a GaN transistor 200 having a drain field plate and multiple gates. Transistor 200 includes a second gate structure 202 above GaN layer 102 and between gate structure 108 and drain field plate 120 as illustrated in FIG. 2. Second gate structure 202 may be recessed into polarization layer 140 so that a 2DEG layer of effect is not formed under second gate structure 202 as illustrated in FIG. 2. Gate structure 202 may include a gate dielectric 210, such as a high k gate dielectric and a gate electrode 212 as described with respect to gate structure 108. In an embodiment, the second gate structure 202 has a larger gate length ($L_{G2}$) than the gate length ($L_g$) of gate structure 108. That is, in an embodiment, $L_{G2}$ is greater than $L_g$. In an embodiment, $L_{G2}$ is equal to $L_g$. In an embodiment, second gate structure 202 may have a "T" shape including an upper gate portion 213 and a lower gate portion 215 as illustrated in FIG. 2.

In an embodiment, two or more additional gate structures 202 may be disposed over GaN layer 102 and between gate structure 108 and drain field plate 120. In an embodiment, gate structure 108 and each of the additional gate structures 202 may be bias separately. In an embodiment, the multiple gates act as an RF voltage divider allowing each gate to be biased with a lower DC voltage. A single gate NMOS transistor may require a large negative gate voltage (Vg) to keep the transistor in an "OFF" state. In an embodiment, transistor 200 may be used in a cascoded power amplifier circuit. Transistor 200 may improve gain by reducing source resistance of the second gate. Having two gate electrodes may protect the corresponding gate oxides from increased voltages.

Figure 3A:
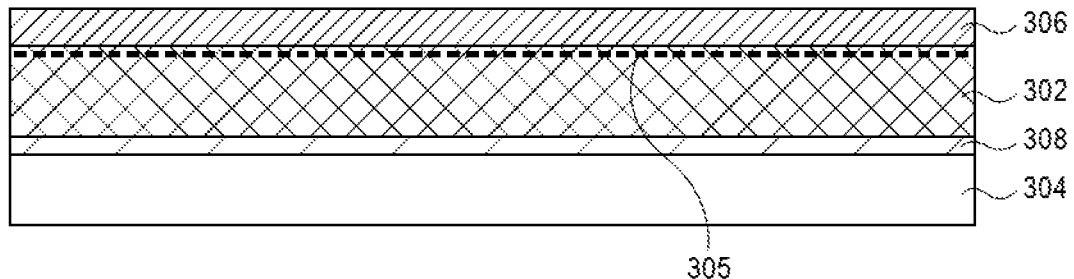
FIGS. 3A-3K illustrate cross-sectional views representing various operations in a method of forming a transistor having a source field plate and a drain field plate, in accordance with embodiments of the present disclosure.

FIGS. 3A-3K illustrate a method of forming a transistor having a drain field plate in accordance with embodiments of the present disclosure. A gallium nitride (GaN) layer 302 may be disposed above a substrate 304, such as but not limited to a monocrystalline silicon substrate, a silicon carbide substrate, and aluminum oxide ($Al_2O_3$) substrate. As shown in FIG. 3A, a polarization layer 306, such as but not limited to aluminum gallium nitride (AlGaN), aluminum indium gallium nitride (AlInGaN) and indium gallium nitride (InGaN) may be disposed on GaN layer 302. Polarization layer may be formed to a thickness, such as greater than 10 nm, sufficient to create a 2DEG layer 305 or effect in the top surface of GaN layer 302 as illustrated in FIG. 3A. In an embodiment, polarization layer 306 is a semiconductor, such as but not limited to aluminum gallium indium nitride ($Al_xGa_{1-x-y}In_yN$, where $0<x<=1$, $0<y<=1$) which is formed to a sufficient thickness to create a two dimensional electron gas (2-DEG) layer 305 in the top portion of GaN layer 302. In an embodiment, polarization layer 306 consists of multiple layers, such as $AlN/Al_{0.2}Ga_{0.8}N/Al_{0.83}In_{0.17}N$, where the AlN is to the bottommost layer. In an embodiment, the polarization layer 306 has a thickness of approximately 10 nanometers. In an embodiment, the top surface of GaN layer 302 is the (0001) plane or the c-plane of GaN. In an embodiment, polarization layer 306 is lattice matched to GaN layer 302.

A buffer layer 308 may be disposed between substrate 304 and GaN layer 302. Buffer layer 308 may contain one or more layers having a lattice constant between the lattice constant of substrate 304 and GaN layer 302.

In a specific embodiment, substrate 304 is a monocrystalline silicon substrate, buffer layer 308 includes an aluminum nitride layer having a thickness between 100-300 nm disposed on the monocrystalline silicon substrate and a graded aluminum gallium nitride layer with a higher aluminum concentration near the aluminum nitride layer. Integrated circuits, for example, a system-on-chip (SOC) or a microprocessor, may be formed from silicon transistors, such as nonplanar transistors, fabricated on portions of silicon substrate 304 not covered by the GaN layer 302. In another embodiment, substrate 304 is a silicon carbide (SiC) substrate and buffer layer 308 includes aluminum nitride having a thickness, for example, between 100-300 nm. Polarization layer 306, buffer layer 308, GaN layer 302 may be epitaxially deposited by any well-known technique, such as but not limited to chemical vapor deposition (CVD), metal organic chemical vapor deposition (MOCVD), and sputtering.

Figure 3B:
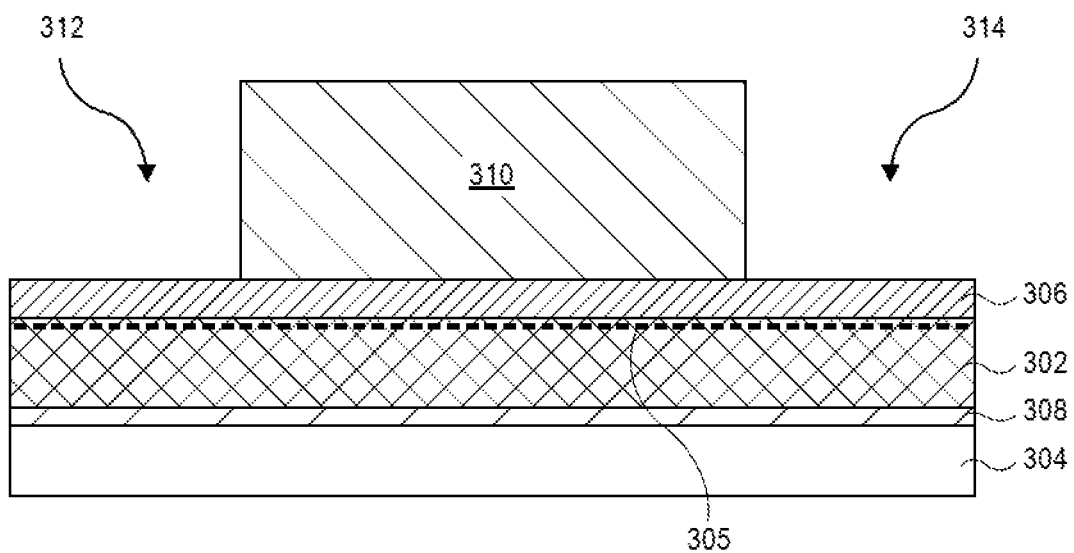

FIG. 3B illustrates the formation of a hard mask block 308 on the structure of FIG. 3A. Hard mask block 310 defines a source contact location 312, and a drain contact location 314. Hard mask block 310 may be formed of any suitable material, such as silicon nitride. Hard mask material 310 may be formed by blanket depositing a hard mask material, by for example, CVD or sputtering, and then patterning the hard mask material, by for example, lithographic patterning and etching.

Figure 3C:
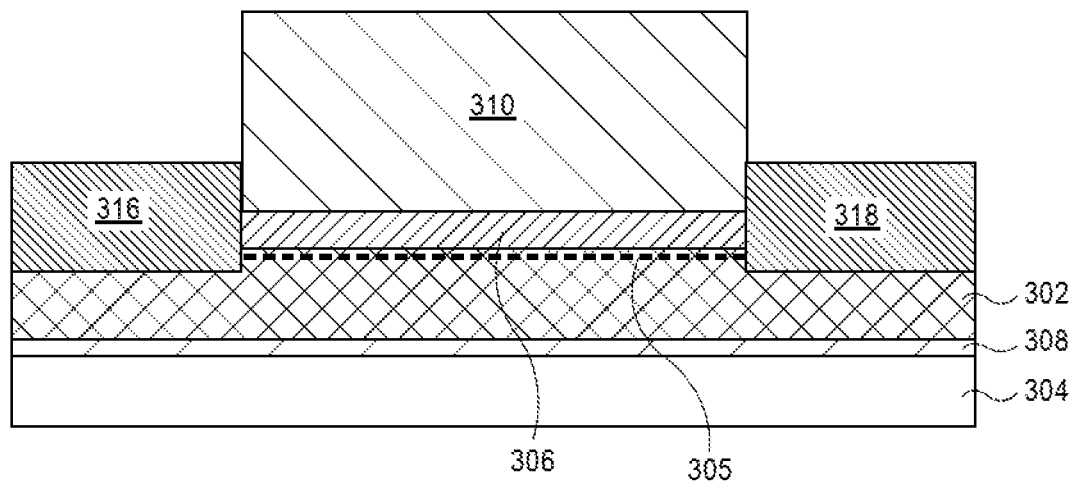

FIG. 3C illustrates the formation of a source semiconductor contact 316 and a drain semiconductor contact 318 on the structure of FIG. 3B. In an embodiment, source semiconductor contact 316 and drain semiconductor contact 318 are formed from a group semiconductor, such as but not limited to InGaN. In an embodiment, source semiconductor contact 316 and drain semiconductor contact 318 are doped to an N+ conductivity level with silicon. In an embodiment, source semiconductor contact 316 and drain semiconductor contact 318 are selectively epitaxially deposited by, for example, chemical vapor deposition (CVD) or metal organic chemical vapor deposition (MOCVD). In an embodiment, source semiconductor contact 316 and drain semiconductor contact 318 are single crystalline or near single crystalline semiconductor. In an embodiment, source semiconductor contact 316 and drain semiconductor contact 318 are formed from a III-N semiconductor having a smaller band gap then GaN. In an embodiment, source semiconductor contact 316 and drain semiconductor contact 318 are formed in a pair of recesses etched through polarization layer 306 and into GaN layer 302 as illustrated in FIG. 3C. Source semiconductor contact 316 and drain semiconductor contact 318 disposed in trenches in GaN layer 302 may apply stress to the channel region of the fabricated transistor in order to improve device performance.

Figure 3D:
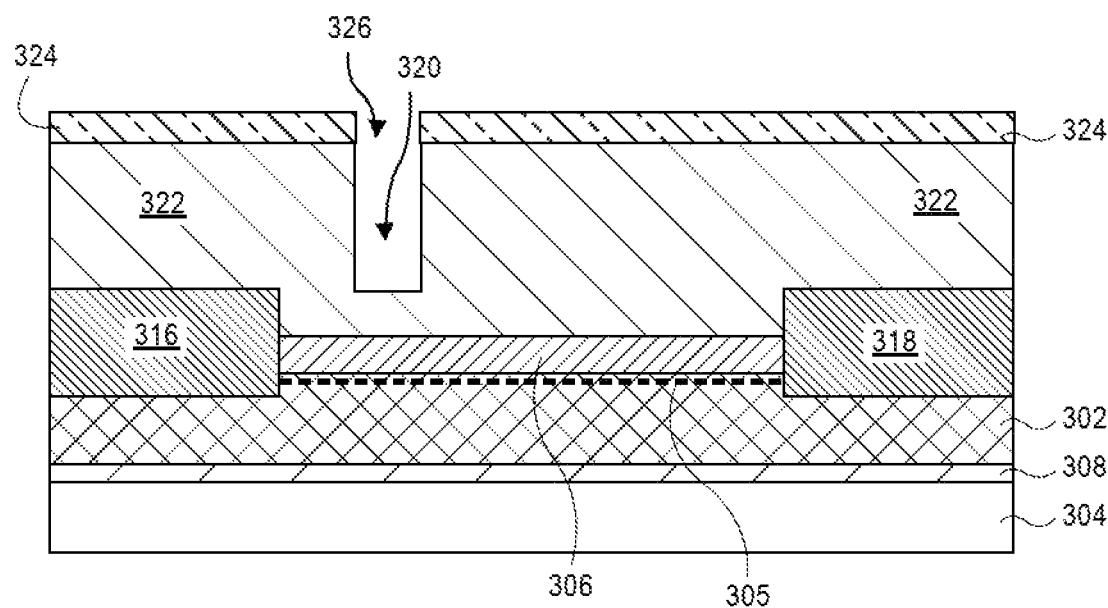

FIG. 3D illustrates a formation of a partial gate trench 320 in a dielectric layer 322. Dielectric layer 322 may be any well-known dielectric, such as but not limited to silicon oxide and carbon doped silicon oxide. A partial gate trench 320 may be formed by first forming a patterned photoresist mask 324 over dielectric 322 which has an opening 326 which defines the location desired for a subsequently formed gate structure. Partial gate trench 320 may then be form by, for example, etching in alignment with opening 326. Partial gate trench 320 does not extend to polarization layer 306 or GaN layer 302 as illustrated in FIG. 3D. In an embodiment, partial gate trench 320 may define the location and gate length (Lg) of a lower gate portion of a subsequently formed T-shaped gate structure. Additionally, it is to be appreciated, that if multiple gate structures are desired for the fabrication of a multigate transistor, such as transistor 200 illustrated in FIG. 2, multiple partial gate trenches 320 may be etched into dielectric 322 at this time.

Figure 3E:
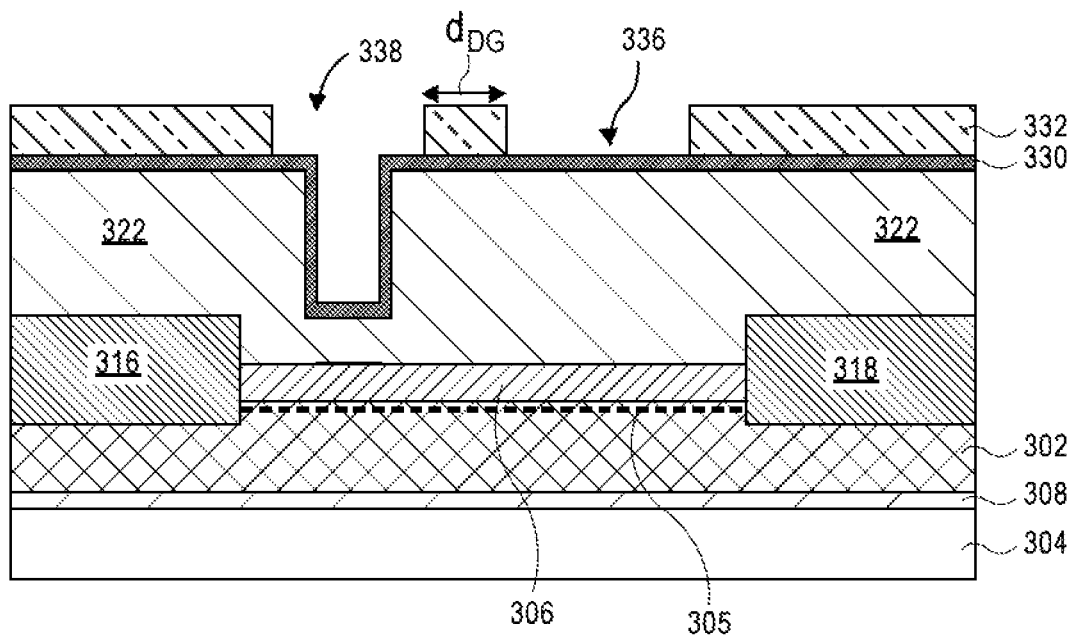

FIG. 3E illustrates the formation of a spacer/hard mask material 330 and a patterned photoresist resist layer 332. In an embodiment, spacer/hard mask material 330 is blanket deposited over the top surface of dielectric 322, along the sidewalls of partial gate trench 320 and onto the bottom surface of partial gate trench 320 as illustrated in FIG. 3E. In an embodiment, spacer/hard mask material layer 330 is formed of a material, such as but not limited to silicon nitride, which may be selectively etched with respect to dielectric 322. A photoresist layer may then be deposited over spacer/hard mask layer 330 and patterned to provide a patterned photoresist layer 332 having opening 336 which defines a drain field plate location and an opening 338 which defines an upper gate portion location as shown in FIG. 3E. Additionally, the location of opening 336 relative to the location of opening 338 may define the distance ($d_{DG}$) at which a subsequently formed "T" gate structure and drain field plate are separated from one another.

In an embodiment, opening 338 defining the upper gate portion may be wider than the opening of the partial gate trench 320 as illustrated in FIG. 3E, so that a gate electrode may be formed which has a "T" shaped gate structure. A "T" shaped gate structure may provide a low resistance gate structure.

Figure 3F:
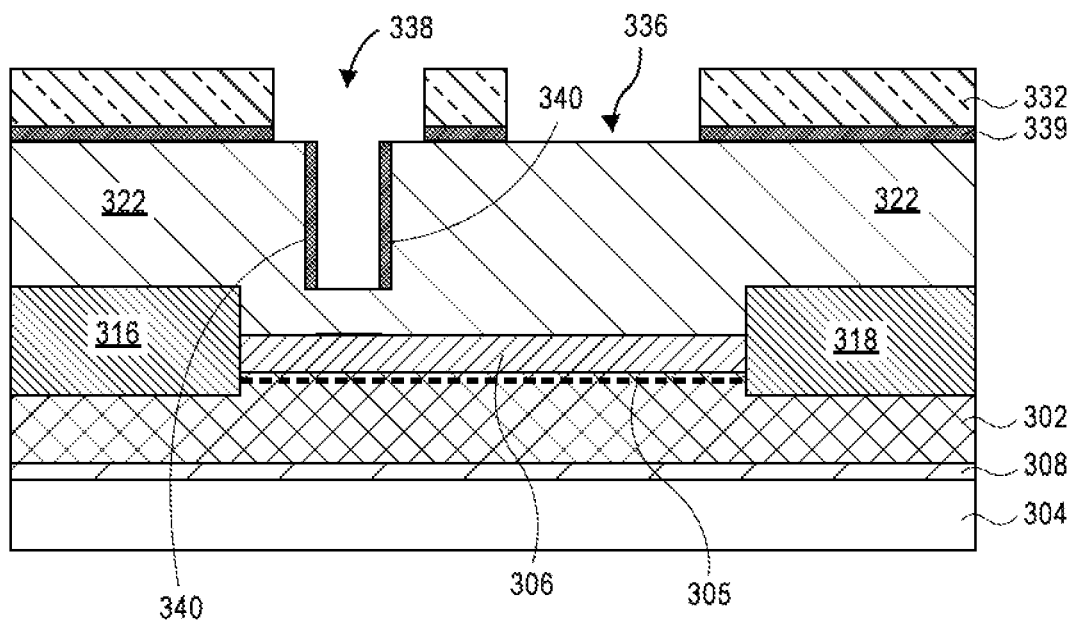

FIG. 3F illustrates the patterning of spacer/hard mask layer 330 of the structure of FIG. 3E. As illustrated in FIG. 3F, spacer/hard mask layer 330 is removed from drain field plate location 336 and upper gate portion location 338 by, for example, etching to form a patterned spacer/hard mask layer 339 as illustrated in FIG. 3F. Additionally, the spacer/hard mask layer 330 located on the bottom of the partial gate trench 320 is removed while leaving insulating spacers 340 along sidewalls of partial gate trench 320 as illustrated in FIG. 3F. An anisotropic dry etch process may be used to remove exposed portions of spacers/hard mask layer 330 from horizontal surfaces while leaving spacer/hard mask layer 330 on vertical sidewalls to form spacers 340 as illustrated in FIG. 3F.

Figure 3G:
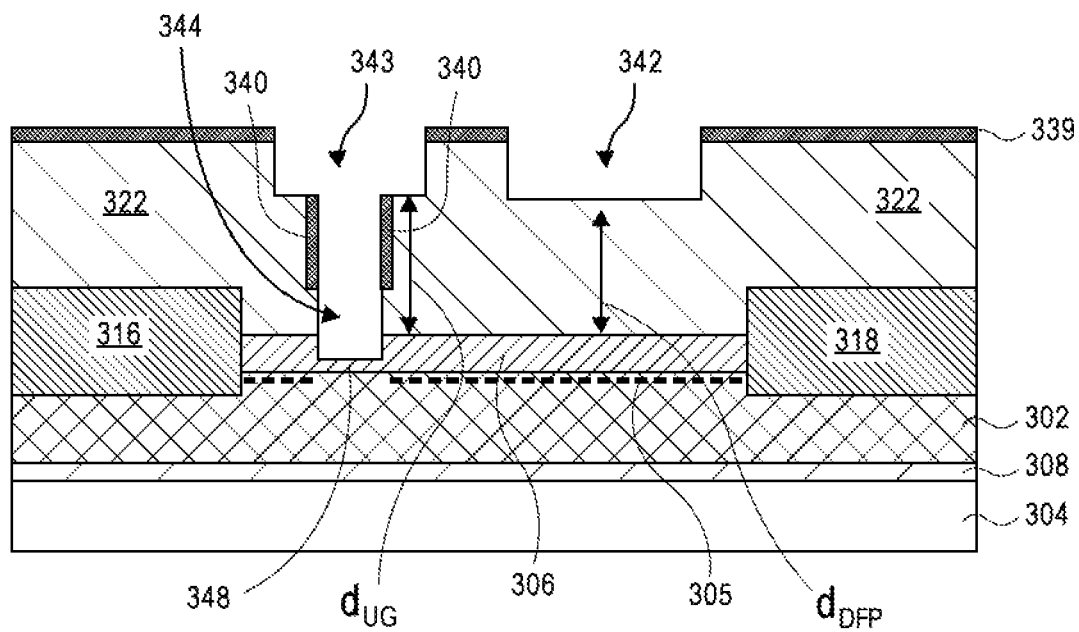

FIG. 3G illustrates the formation of a drain field plate trench 342 and an upper gate portion trench 343 formed in the structure of FIG. 3F. The drain field plate trench 342 and the upper gate portion trench 343 may be formed by etching dielectric layer 322 in alignment with patterned spacer/hard mask layer 339 as illustrated in FIG. 3G. The formation of upper gate portion trench 343 may also etch away a top portion of spacers 340 as illustrated in FIG. 3G. In an embodiment, the process used to form drain field plate trench 342 and upper gate portion trench may also be used to etch the dielectric layer 322 beneath the partial gate trench 320 to form lower gate portion trench 344 of the subsequently formed gate structure as illustrated in FIG. 3G. In an embodiment, lower gate portion trench 344 is partially etched into polarization layer 306 to create a recessed polarization layer 348 beneath lower gate portion trench 344. In an embodiment, recessed polarization layer 348 is of an insufficient thickness, such as less than two nanometers, to create a 2DEG layer or effect in the top surface of GaN layer 302 as illustrated in FIG. 3G. In an embodiment, lower gate portion trench 344 is formed completely through polarization layer 306 and exposes GaN layer 302.

The depth at which the upper gate portion trench 343 is formed in dielectric layer 322 may define the distance $d_{UG}$ which the upper gate extends above the source and drain region. The depth at which drain field plate trench 342 is formed in dielectric layer 322 may define the distance $d_{DFP}$ which the drain field plate extends above a drain region 352. In an embodiment, upper gate portion and drain field plate trench 342 have the same depth so that the upper gate portion is separated from the source and drain regions 350 and 352 by the same distance that the drain field plate is separated from the drain region 352 (i.e., $d_{UG}=d_{DFP}$).

Figure 3H:
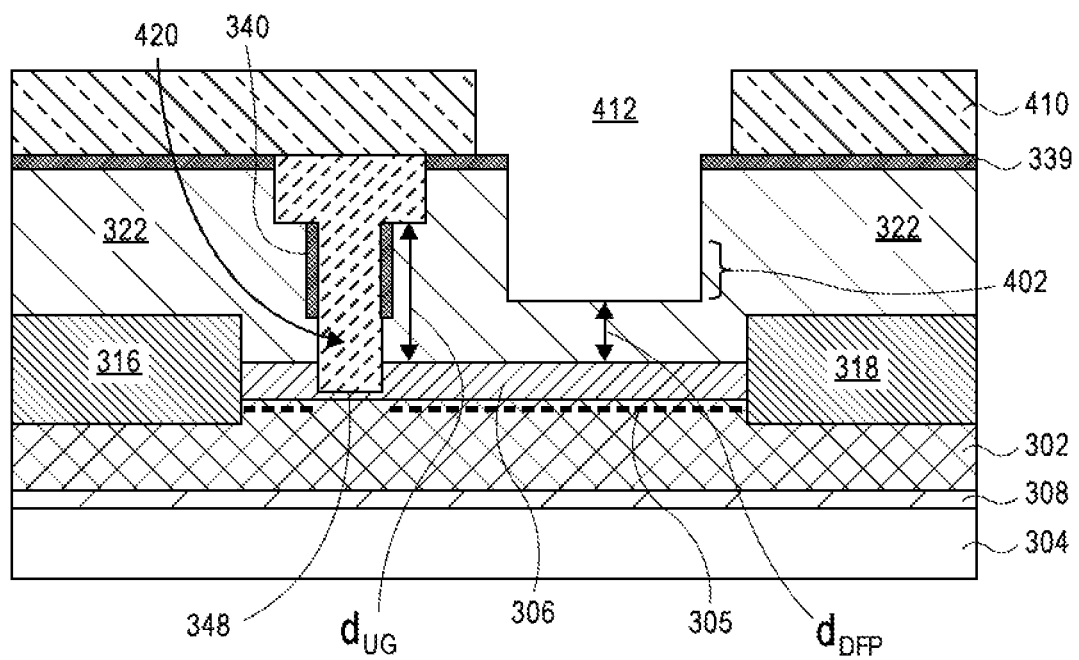

In an embodiment, it may be desirable to have the drain field plate extend a different distance above the drain region than the distance at which the upper gate portion extends above the source and drain regions (i.e., $d_{UG}$ does not equal $d_{DFP}$). For example, as illustrated in FIG. 3H, the drain field plate trench 342 may be etched an additional time to remove an additional portion 402 of dielectric material 322 to create a deeper trench. A patterned photoresist mask 410 may be disposed over upper gate portion trench 343, as shown in FIG. 3H, to protect it from further etching. In an embodiment, a material 420, such as a sacrificial light absorbing material (SLAM), may be blanket deposited and planarized to fill upper gate trench portion 343 and lower gate trench portion 344 and drain field plate trench 342 prior to the formation of patterned photoresist mask 410 in order to provide a planar surface upon which to form patterned photoresist mask 410 and improve lithography.

Figure 3I:
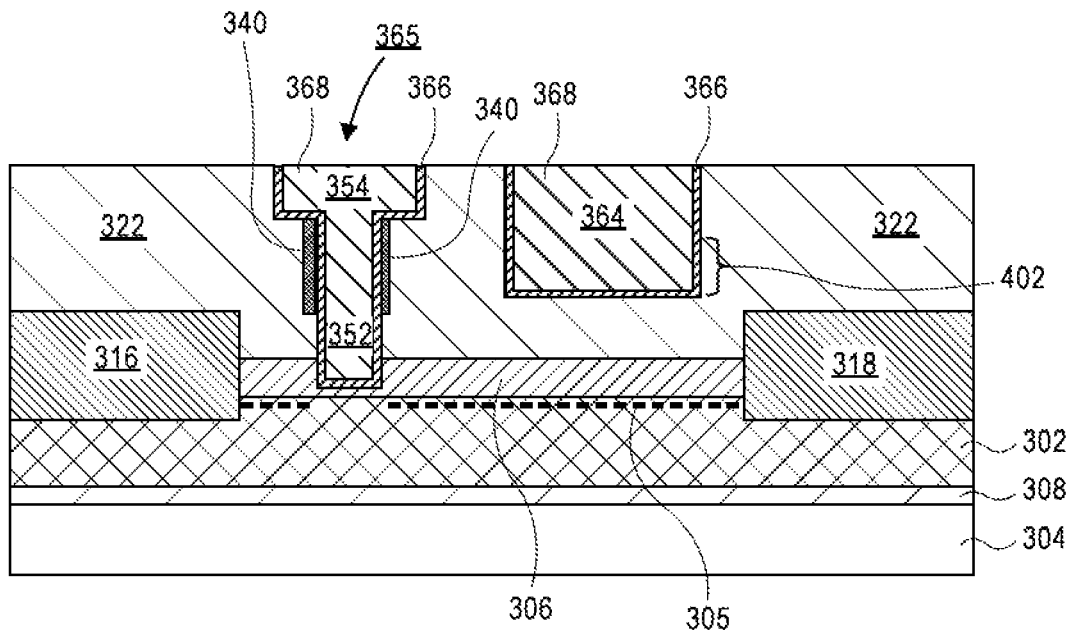

FIG. 3I illustrates the formation of a drain field plate 364 and a gate structure 365. In an embodiment, upper gate portion trench 343 and lower gate portion trench 344 are filled with a gate dielectric layer 366 and a gate electrode material 368 as illustrated in FIG. 3I. In an embodiment, the gate dielectric is a high k gate dielectric, such as but not limited to hafnium oxide (e.g., $HfO_2$), zirconium oxide ($ZrO_2$) and aluminum oxide (e.g., $Al_2O_3$). In an embodiment, the gate dielectric layer is deposited by, for example, atomic layer deposition so that the gate dielectric layer forms on the bottom and sidewalls of upper gate portion trench 343 as well as along sidewalls and bottom lower gate portion trench 344. In an embodiment, the gate dielectric 366 is in contact with sidewall spacers 340 disposed along sidewalls of lower gate portion trench 343. A gate electrode material 368, such as but not limited to titanium aluminide (TiAl), titanium nitride (TiN), or any other suitable metal or metals may be deposited by, for example, ALD or CVD on gate dielectric 366.

In an embodiment, the deposition process used to fill upper gate portion trench 343 and upper gate portion trench 344 is also used to fill drain field plate trench 342 as illustrated in FIG. 3I. Accordingly, the bottom and sidewalls of drain field plate trench 342 may be lined with gate dielectric layer 366 and filled with a gate electrode material 368 as illustrated in FIG. 3I. In an embodiment, gate dielectric 366 and gate electrode 368 are blanket deposited over dielectric layer 322 and into and filling drain field plate trench 342, upper gate portion trench 343 and lower gate portion trench 344. Excess gate electrode material 368 and gate dielectric layer 366 disposed on the top surface of dielectric layer 322 may be removed by a planarization process, such as but not limited to chemical mechanical polishing. The planarization process may make the top surface of the drain field plate 364 and the gate structure 360 as well as dielectric layer 322 all coplanar with one another as illustrated in FIG. 3H.

Figure 3J:
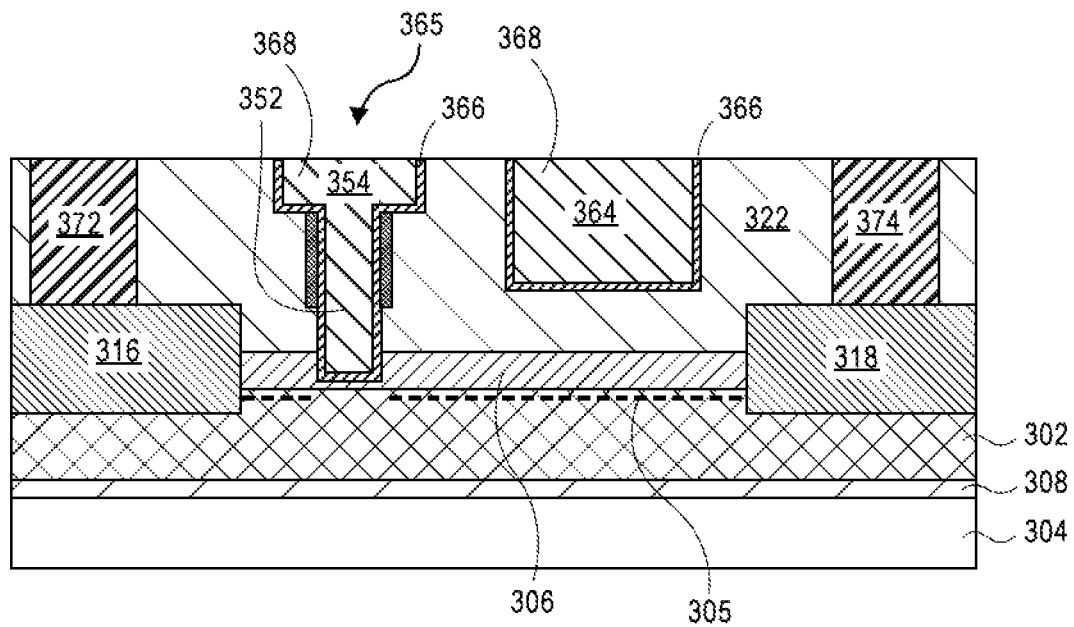

FIG. 3J illustrates the formation of a source metal contact 372 and a drain metal contact 374 in dielectric layer 322 and in contact with the source semiconductor contact 316 and drain semiconductor contact 318, respectively. Source metal contact 372 and drain metal contact 374 may be formed by etching a plurality of openings in dielectric layer 322 to expose source semiconductor contact 316 and drain semiconductor contact 318. A contact metal such as but not limited to titanium may then be deposited into the openings and polished back so that the top surfaces of source metal contact 372 and drain metal contact 374 are coplanar with gate structure 365 and drain field plate 364 as illustrated in FIG. 3J.

Figure 3K:
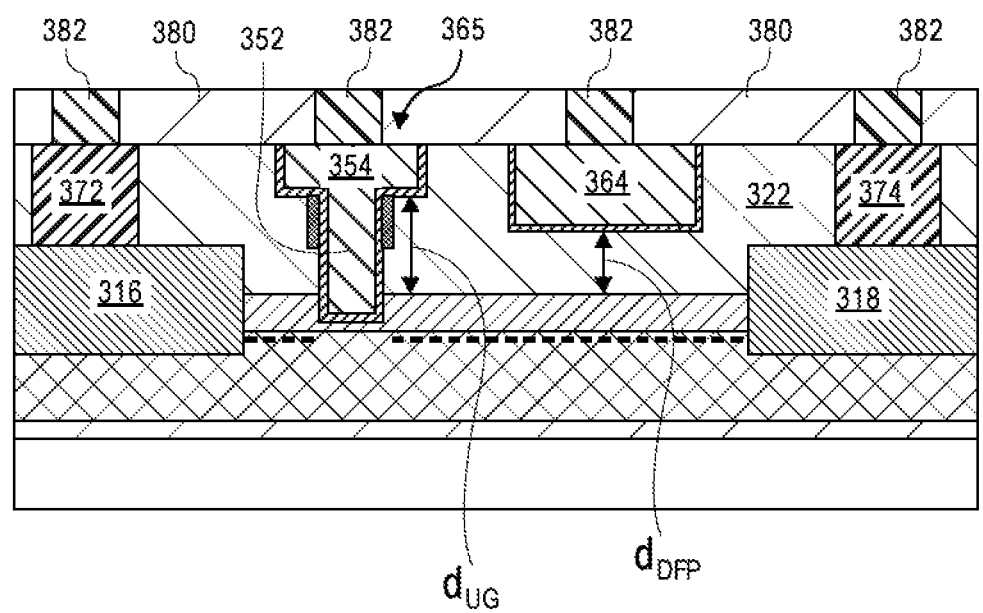

FIG. 3K illustrates the formation of a second dielectric layer 380 over the dielectric layer 322 and the formation of a plurality of via contacts 382 in the dielectric layer 380. In this way the source region, the drain region, gate structure 365, and drain filed plate 364 may all be independently biased or controlled.

To provide further context, GaN high voltage transistors in the market are not scaled. GaN transistors in the market today utilize long channel gates and thick p-GaN gate stack that may not be suitable for scaling the transistor to smaller dimensions to improve performance and low resistances. Moreover, coarse lithography techniques that are used may be limited as the industry remains working in 4 inch manufacturing lines that do not have access to the latest lithographic tools and techniques.

In accordance with one or more embodiments of the present disclosure, a heterostructure employing, p-InGaN and p-AlGaN layers in the gate of the GaN transistor, in addition to p-GaN, to enable scaling of the gate stack, thus enabling the further scaling of transistor channel length to improve performance: lower on-resistance and higher drive current. Other enabling features such as p-(III-N) field plate, multi-gate structures and hybrid trench plus implant isolation techniques are also disclosed herein to enable scaling of high voltage GaN transistor solutions. Such features can enable the ultimate scaling of high voltage GaN transistors to provide the highest performance in the smallest possible footprint.

In accordance with an embodiment of the present disclosure, a high voltage GaN transistor technology enables power delivery solutions that are more efficient than what is possible today. Servers and graphics products are powered by power delivery solutions with input voltages ranging between 48V to 72V. Discrete GaN transistors are used to step this high input voltage down to 5V on the board so that a second stage voltage conversion can be used in the subsequent power stages to convert the voltage to a desired supply voltage to integrated circuits, ranging from 3.3V to 0.5V, for example. Many stages of conversion are required using Si technology because at each stage, a different Si transistor technology is used. Dissimilar discrete technologies must thus be made to work together on the board or in bulky thick packages. GaN technology is unique in that it is the only technology that can be used across the entire power delivery value chain from 72V down to 0.6V. With a high voltage GaN transistor technology, power can ultimately be delivered at 48V to the socket of a microprocessor. Many benefits can be realized: the current level (I) on the board can be reduced, power dissipation (proportional to $I^2$) on the board can be significantly reduced, form factor can be significantly reduced (at least 2× shrink, up to 10× or more).

Figure 4:
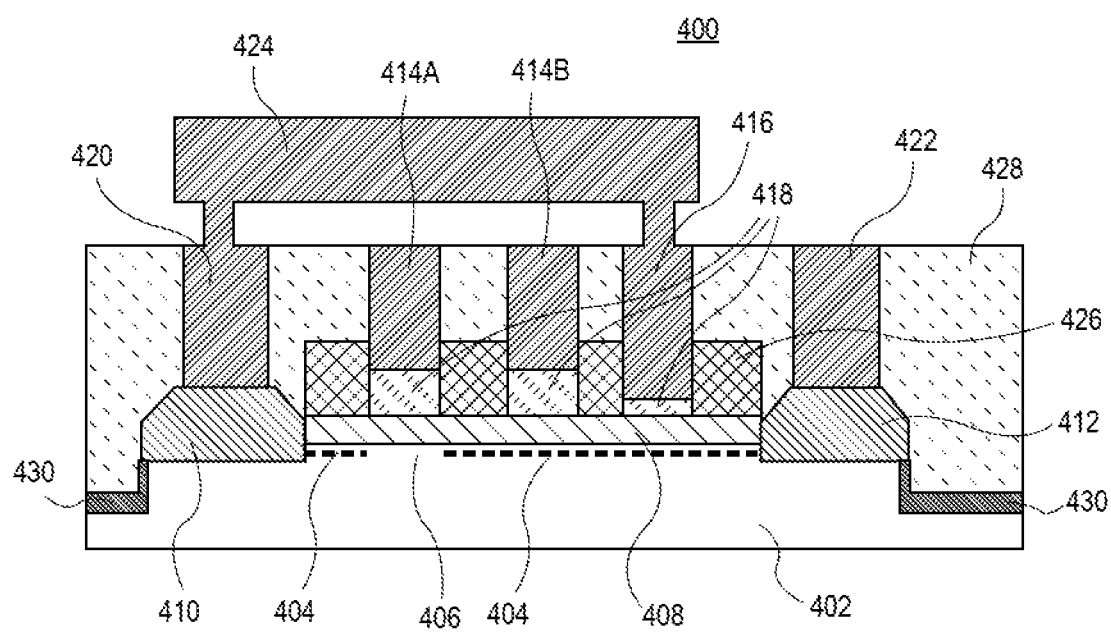
FIG. 4 illustrates a cross-sectional view of a high voltage scaled GaN device with multi-gate technology, in accordance with an embodiment of the present disclosure.

FIG. 4 illustrates a cross-sectional view of a high voltage scaled GaN device with multi-gate technology, in accordance with an embodiment of the present disclosure.

Referring to FIG. 4, a high voltage scaled GaN device 400 includes a GaN layer 402 including 2DEG regions 404 and non 2DEG regions 406. A p-GaN/p-InGaN/p-AlGaN field plating layer 408 is on the GaN layer 402 to provide a field-redistributing effect. N+ InGaN source or drain regions 410 and 412 are on the GaN layer 402. A p-GaN, p-InGaN, p-AlGaN regrown layer 418 is on the field plating layer 408. Gate electrodes 414A and 414B and a field plate electrode 416 are on the p-GaN, p-InGaN, p-AlGaN regrown layer 418. Source or drain contacts 420 and 422 are on the N+ InGaN source or drain regions 410 and 412. An interconnect line 424 couples the source or drain contact 420 and field plate electrode 416. An insulator layer 426, such as a silicon nitride (SiN) layer is included over the field plating layer 408. An inter-layer dielectric (ILD) layer 428 is over the structure. An H2-implant shallow-trench isolation layer 430 is on either side of the N+ InGaN source or drain regions 410 and 412.

Figure 5:
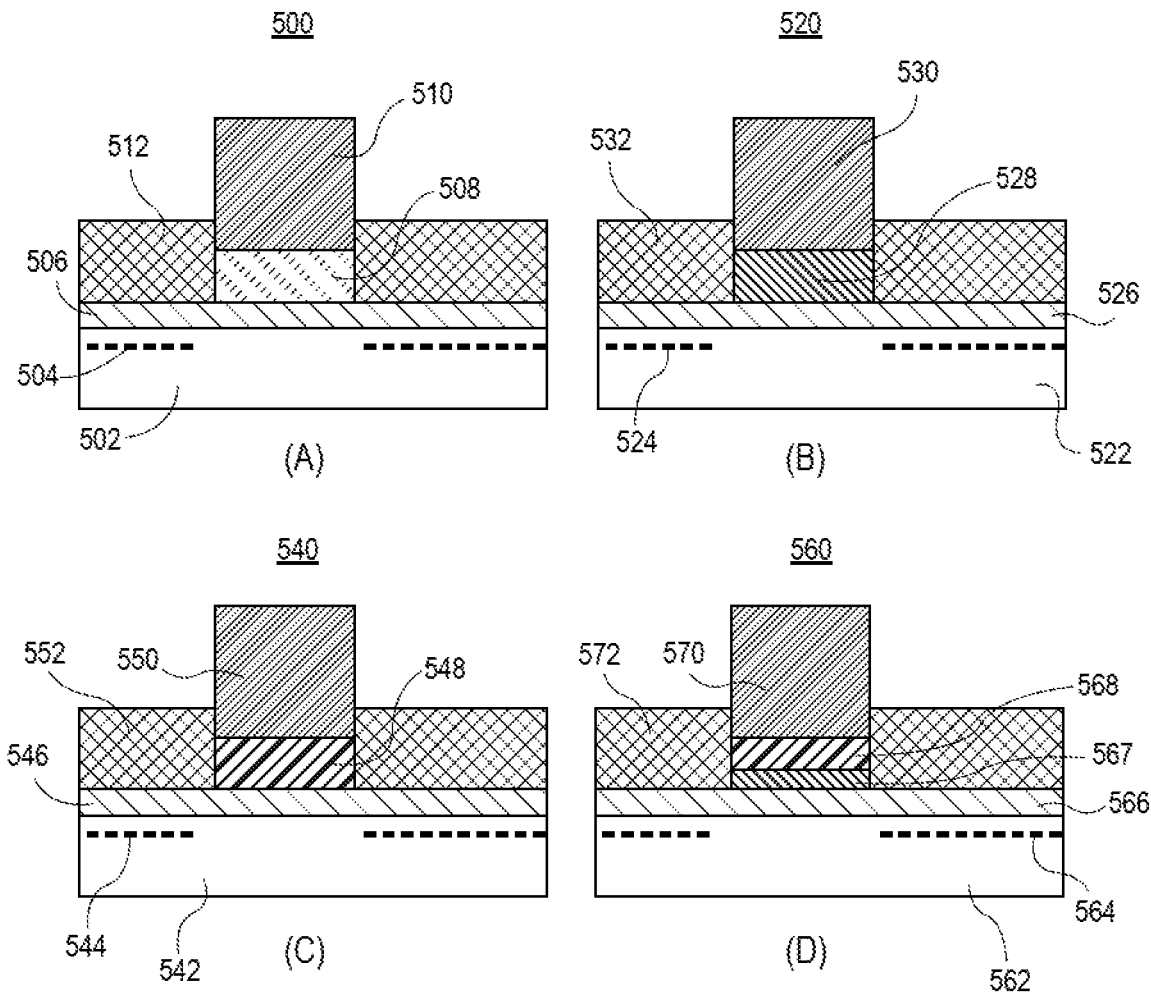
FIG. 5 illustrates cross-sectional views of various structural options for a high voltage scaled GaN device with multi-gate technology, in accordance with an embodiment of the present disclosure.

FIG. 5 illustrates cross-sectional views of various structural options for a high voltage scaled GaN device with multi-gate technology, in accordance with an embodiment of the present disclosure.

Referring to part (A) of FIG. 5, a gate structure 500 for a high voltage scaled GaN device includes a GaN layer 502 having a 2DEG layer 504. An AlGaN layer 506 is on the GaN layer 502. A p-GaN layer 508 is on the AlGaN layer 506. A gate electrode 510 is on the p-GaN layer 508. The gate electrode 510 and the p-GaN layer 508 are within a dielectric layer 512, such as a silicon nitride (SiN) layer.

Referring to part (B) of FIG. 5, a gate structure 520 for a high voltage scaled GaN device includes a GaN layer 522 having a 2DEG layer 524. An AlGaN layer 526 is on the GaN layer 522. A p-AlGaN layer 528 is on the AlGaN layer 526. A gate electrode 530 is on the p-AlGaN layer 528. The gate electrode 530 and the p-AlGaN layer 528 are within a dielectric layer 532, such as a silicon nitride (SiN) layer.

Referring to part (C) of FIG. 5, a gate structure 540 for a high voltage scaled GaN device includes a GaN layer 542 having a 2DEG layer 544. An AlGaN layer 546 is on the GaN layer 542. A p-InGaN layer 548 is on the AlGaN layer 546. A gate electrode 550 is on the p-InGaN layer 548. The gate electrode 550 and the p-InGaN layer 548 are within a dielectric layer 552, such as a silicon nitride (SiN) layer.

Referring to part (D) of FIG. 5, a gate structure 560 for a high voltage scaled GaN device includes a GaN layer 562 having a 2DEG layer 564. An AlGaN layer 566 is on the GaN layer 562. A p-AlGaN layer 567 is on the AlGaN layer 566. A p-InGaN layer 568 is on the p-AlGaN layer 567. A gate electrode 570 is on the p-InGaN layer 568. The gate electrode 570 and the p-InGaN layer 568 are within a dielectric layer 572, such as a silicon nitride (SiN) layer.

In an embodiment, using a p-InGaN layer can translate to higher active p-dopants being achieved. With higher active p-dopants compared to P-GaN, thinner p-InGaN can be used to deplete 2DEG in channel for e-mode. Thinner EOT enables shorter channel length, hence higher performance (lower Rory and higher drive current). In an embodiment, using a P-AlGaN layer can translate to higher barrier to electrons, although lower p-dopants. With higher energy barrier to electrons, p-AlGaN can be used to reduce the thickness of the p-doped barrier to enable shorter channel length as well as to increase the P-N junction turn-on voltage and reduce gate leakage. Heterostructures, e.g. P-InGaN/P-AlGaN/AlGaN/GaN channel can be used to achieve combinations of the characteristics described above.

Figure 6:
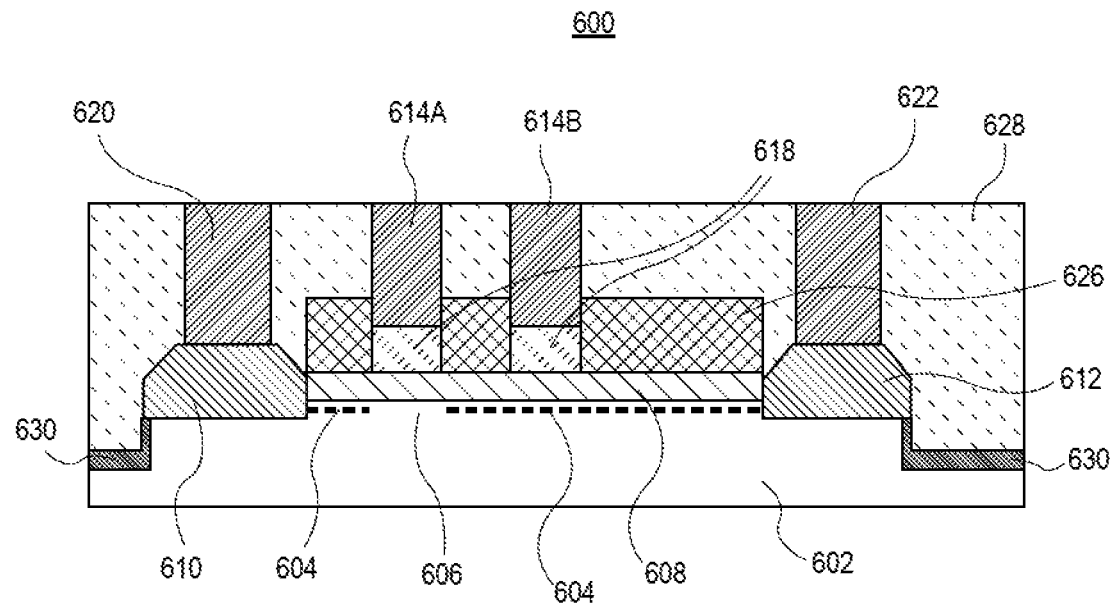
FIG. 6 illustrates cross-sectional views of various structural options for a high voltage scaled GaN device with multi-gate technology, in accordance with another embodiment of the present disclosure.

FIG. 6 illustrates cross-sectional views of various structural options for a high voltage scaled GaN device with multi-gate technology, in accordance with another embodiment of the present disclosure.

Referring to FIG. 6, a high voltage scaled GaN device 600 includes a GaN layer 602 including 2DEG regions 604 and non 2DEG regions 606. N+ InGaN source or drain regions 610 and 612 are on the GaN layer 602. A p-GaN, p-InGaN, p-AlGaN regrown layer 618 is on the polarization layer 608 to provide a field-redistribution effect. Gate electrodes 614A and 614B are on the p-GaN, p-InGaN, p-AlGaN regrown layer 618. Source or drain contacts 620 and 622 are on the N+ InGaN source or drain regions 610 and 612. An insulator layer 626, such as a silicon nitride (SiN) layer is included over the polarization layer 608. An inter-layer dielectric (ILD) layer 628 is over the structure. An H2-implant shallow-trench isolation layer 630 is on either side of the N+ InGaN source or drain regions 610 and 612.

In an embodiment, multi-gates can extend the voltage handling capability and incur minimal increase in on-resistance and transistor drive current. Multi-gates also improve drain induced barrier leakage (DIBL), and reduce off-state leakage.

Figure 7:
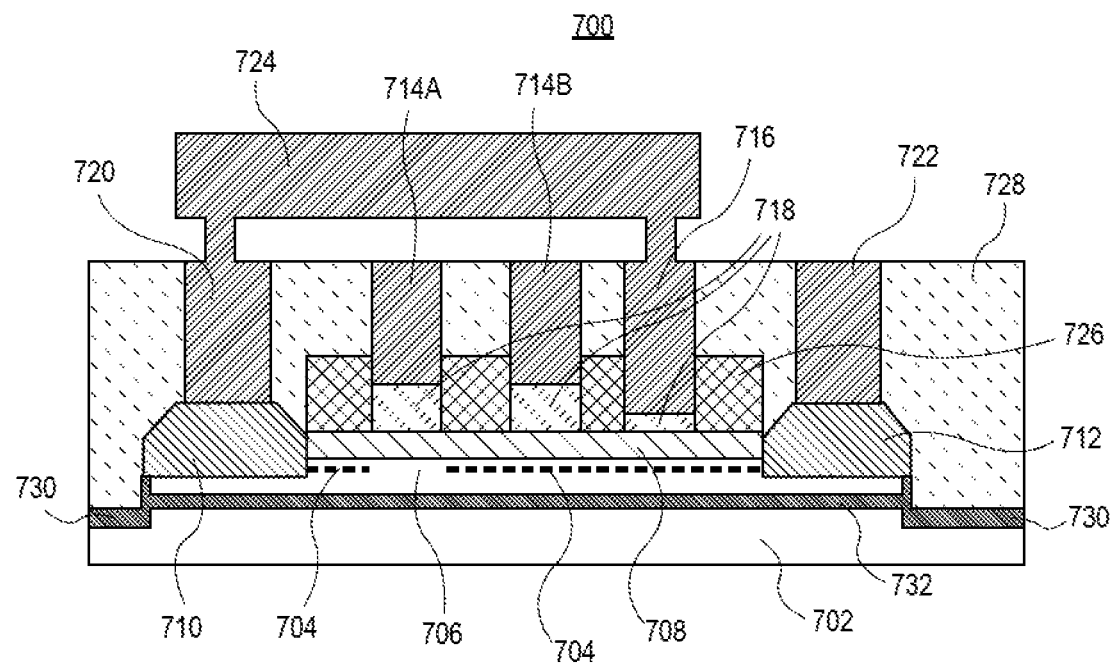
FIG. 7 illustrates cross-sectional views of various structural options for a high voltage scaled GaN device with multi-gate technology, in accordance with another embodiment of the present disclosure.

FIG. 7 illustrates cross-sectional views of various structural options for a high voltage scaled GaN device with multi-gate technology, in accordance with another embodiment of the present disclosure.

Referring to FIG. 7, a high voltage scaled GaN device 700 includes a GaN layer 702 including 2DEG regions 704 and non 2DEG regions 706. N+ InGaN source or drain regions 710 and 712 are on the GaN layer 702. A p-GaN, p-InGaN, p-AlGaN regrown layer 718 is on the polarization layer 708 to provide a field-redistribution effect. Gate electrodes 714A and 714B and a field plate electrode 716 are on the p-GaN, p-InGaN, p-AlGaN regrown layer 718. Source or drain contacts 720 and 722 are on the N+ InGaN source or drain regions 710 and 712. An interconnect line 724 couples the source or drain contact 720 and field plate electrode 716. An insulator layer 726, such as a silicon nitride (SiN) layer is included over the field plating layer 708. An inter-layer dielectric (ILD) layer 728 is over the structure. An H2-implant shallow-trench isolation layer 730 is on either side of the N+ InGaN source or drain regions 710 and 712. An H2-implant region 732 is under a channel region of the device 700.

In an embodiment, aside from providing a field-plate (FP) to redistribute the high lateral electric field on the drain side of the transistor, a p-GaN/p-InGaN/p-AlGaN field plate can inject compensating holes into the channel in the drain region to neutralized electrons that are trapped in the high field region on the drain side. High energy hydrogen atoms can be implanted in the shallow-trench isolation region to further isolate each GaN transistor active region from the rest of the wafer. Further, a hydrogen implant plane can be achieved underneath the GaN 2DEG for further isolation of GaN transistor active region from the GaN buffer and substrate. In one embodiment, voltage converter circuit topologies enabled by these devices include LLC resonant converter, switched capacitor converters, buck converters, and others.

Embodiments of the disclosure relate to gallium nitride (GaN) transistors having multiple threshold voltages and their methods of fabrication. A GaN transistor, in accordance with embodiments, includes a gallium nitride layer above a substrate, such as a silicon monocrystalline substrate. A gate stack is disposed above the GaN layer. A source region and a drain region are disposed on opposite sides of the gate stack. A polarization layer including a group III-N semiconductor is disposed on the GaN layer and beneath the gate stack. The polarization layer may have a first thickness, including a zero thickness, beneath a first gate portion of the gate stack and a second thickness greater than the first thickness beneath a second gate portion of the gate stack. The thickness of the polarization layer or lack of a polarization layer beneath the gate stack affects the threshold voltage of the overlying portion of the gate stack. By providing different thicknesses of the polarization layer beneath different portions of the gate stack, a transistor may be engineered to have two or more different threshold voltages. In an embodiment, a transistor has a threshold voltage in the range of 1V to −6V. A GaN transistor having multiple threshold voltages may be fabricated as a planar transistor or a nonplanar transistor. In embodiments of the present disclosure, a GaN transistor having two or more threshold voltages may be used to create a hybrid class A+AB power amplifier with improved linearity.

Figure 8A:
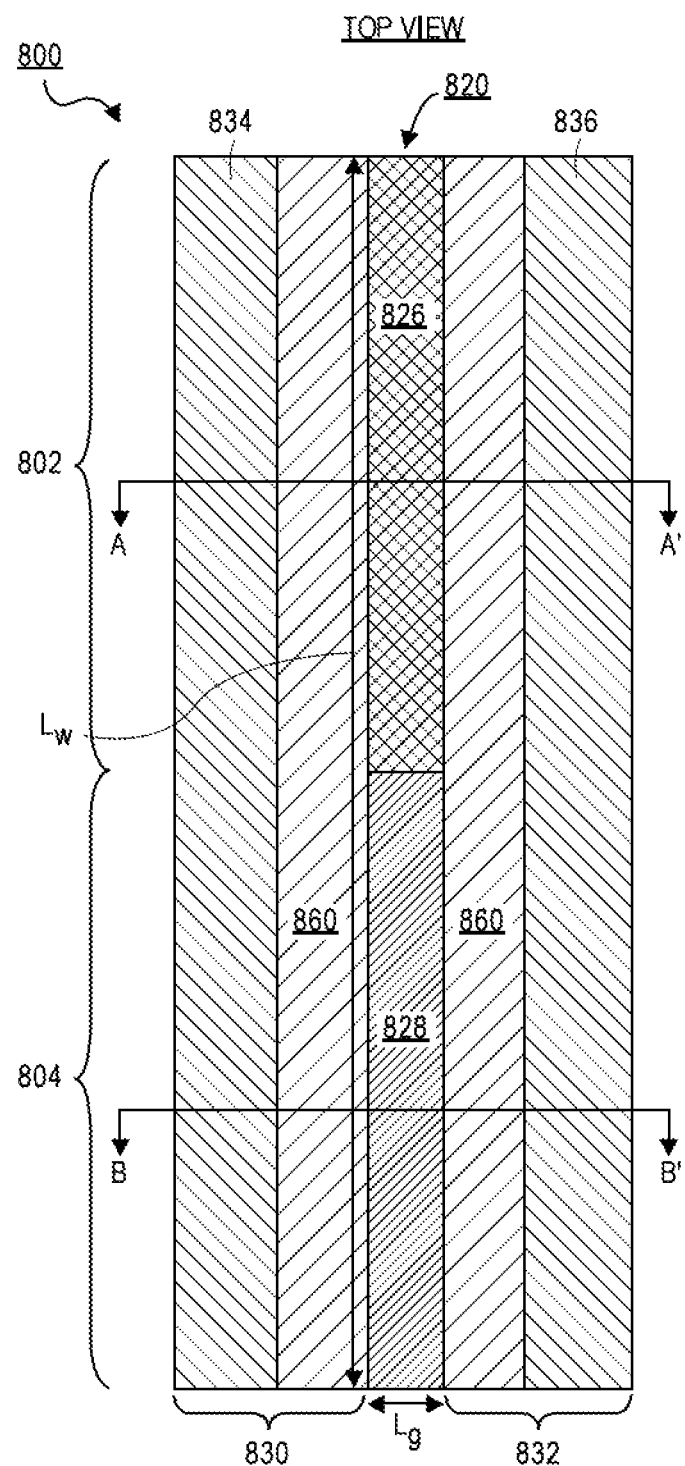
FIGS. 8A-8C illustrate a GaN transistor in accordance with embodiments of the present disclosure.
Figure 8B:
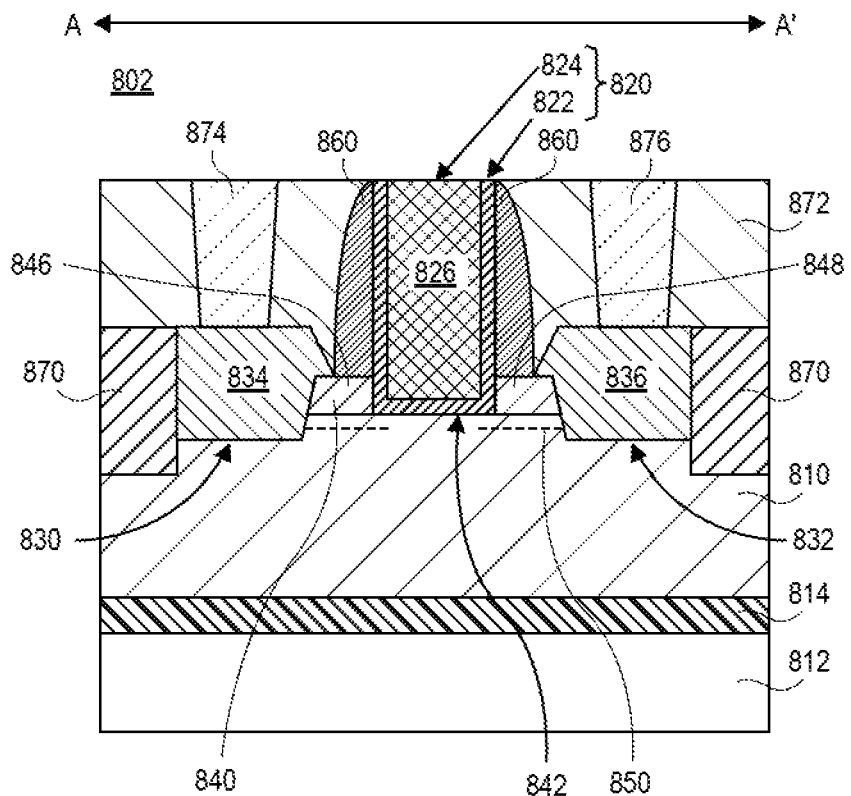
Figure 8C:
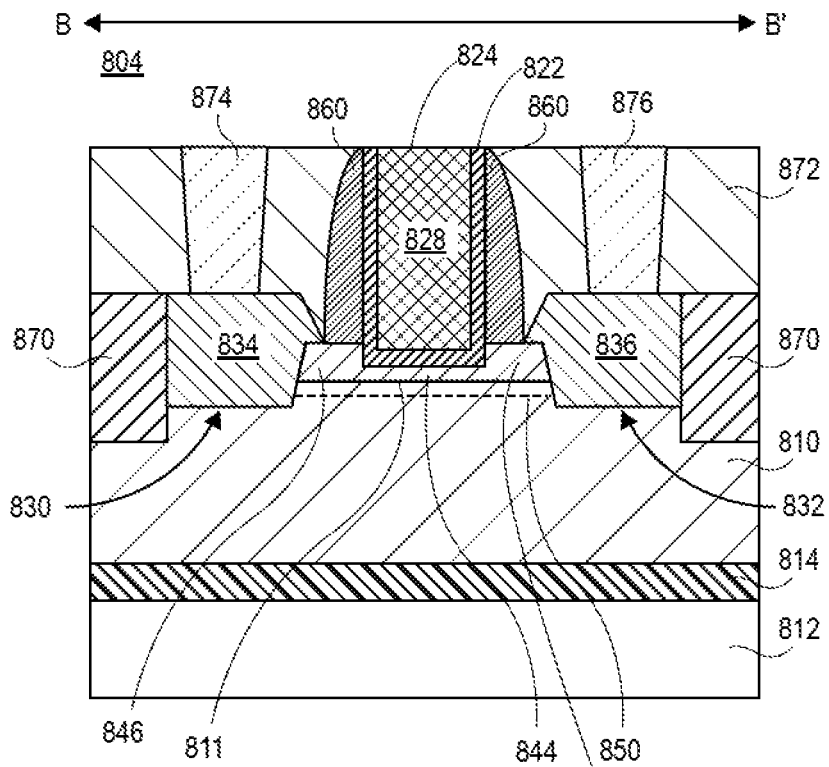

FIGS. 8A-8C illustrate a GaN transistor 800 in accordance with embodiments of the present disclosure. FIG. 8A is a top down view illustrating GaN transistor 800 while FIG. 8B is as cross-sectional view taken through a first portion 802 of transistor 800 and FIG. 8C is a cross-sectional view taken through a section of portion 804 of transistor 800. Transistor 800 includes a gallium nitride (GaN) layer 810 disposed above a substrate 812, such as but not limited to a silicon monocrystalline substrate. A buffer layer 814, such as an aluminum nitride (AlN) layer, may be disposed between substrate 812 and GaN layer 810. GaN layer 810 provides a channel layer for transistor layer 800. A gate stack 820 is disposed above the GaN layer 810 as illustrated in FIGS. 8B and 8C. The gate stack may include a gate dielectric 822 and a gate electrode 824 with the gate dielectric 822 between the gate electrode 824 and GaN layer 810. In an embodiment, the gate dielectric 822 is a high-k gate dielectric such as but not limited to a hafnium oxide (e.g., $HfO_2$) or aluminum oxide (e.g., $Al_2O_3$) gate dielectric layer.

A source region 830 and a drain region 832 may be disposed on opposite sides of gate stack 820 as illustrated in FIGS. 8A-8C. In an embodiment source region 830 and includes a group III-N semiconductor contact 834, such as but not limited to InGaN, and drain region 832 includes a group III-N semiconductor contact 836. In an embodiment, group III-N semiconductor contacts 834 and 836 are a single crystalline III-N semiconductor, and may be doped to an N+ conductivity (e.g., greater than 1E18 concentration) with, e.g., silicon. Transistor 800 has a gate length (Lg) which extends in a first direction between source region 830 and drain region 832. When transistor 800 is in an "ON" state current flows between source region 830 and drain region 832 in the first direction. Transistor 800 has a gate width (Gw) in a second direction, perpendicular to the first direction or to the gate length direction, and parallel to the source and drain regions 830 and 832 as illustrated in FIG. 8A. In an embodiment, the gate width of transistor 800 is between 10 and 100 microns.

Transistor 800 includes a polarization layer 840. In an embodiment, polarization layer 840 is a group III-N semiconductor, such as but not limited to a group III-N semiconductor including aluminum, gallium, indium and nitrogen or $Al_xIn_yGa_{1-x-y}N$ (0<x<=1, 0<=y<1). In an embodiment, x=0.83 and y=0.17, where $Al_{0.83}In_{0.17}N$ is lattice-matched to GaN. In an embodiment, the polarization layer 840 is disposed directly on a surface 811 of GaN layer 810 which is a (0001) plane or a C-plane of gallium nitride. Depending on the composition and thickness of polarization layer 840, polarization layer 840 may create a 2DEG layer 850 in the top surface of GaN layer 810 as illustrated in FIGS. 8B and 8C.

In an embodiment of the present disclosure, a first portion 802 of transistor 800 has a first gate portion 826 of gate stack 820 disposed over a first portion 842 of polarization layer 840 having a first thickness, which may be a zero thickness, while a second portion 804 of transistor 800 has a second gate portion 828 of gate stack 820 disposed over a second portion 844 of polarization layer 840 having a second thickness, wherein the second thickness is greater than the first thickness. The difference in thicknesses between the first portion 842 and the second portion 844 of polarization layer 840 creates a difference in the threshold voltages for the first gate portion 826 of gate stack 820 and the second gate portion 828 of gate stack 820 where the threshold voltage (VT1) of the first gate portion 826 is greater than the threshold voltage (VT2) of the second gate portion 828. In an embodiment, the first threshold voltage (VT1) is greater than the second threshold voltage (VT2) by an amount in the range of 100 mV to 9V. In an embodiment, the first threshold voltage (VT1) is greater than the second threshold voltage (VT2) by greater than 2V.

In a specific embodiment, as shown in FIGS. 8B and 8C, the first portion 842 of polarization layer 840 has a thickness of zero. That is, there is no polarization layer 840 beneath the first gate portion 826 of gate stack 820 and the first gate portion 826 is disposed directly on GaN layer 810 as illustrated in FIG. 8B. Second portion 844 of polarization layer 840 has a non-zero thickness beneath the second gate portion 828 of gate stack 820. In an embodiment, second portion 844 of polarization layer 840 is sufficiently thick to create a 2DEG layer in the top surface of GaN layer 810 beneath second portion 828 of gate stack 820. In this way, the first portion 826 of gate stack 820 has a threshold voltage (VT1) which is greater than the threshold voltage (VT2) of the second gate portion 828 of gate stack 820. In an alternative embodiment, first portion 842 of polarization layer 840 has a zero thickness, and the second portion has a non-zero thickness, which is not sufficiently thick to create a 2DEG layer in GaN layer 810 beneath second gate portion 828 of gate stack 820. Although, a 2DEG is not formed beneath the second gate portion 828 of gate stack 820 in an embodiment, the second portion 828 of gate stack 820 may still have a lower threshold voltage (VT2) than the threshold voltage (VT1) of the first gate portion 826 of gate stack 820 disposed directly on GaN layer 810.

In the embodiment, the first portion 842 and the second portion 844 of polarization layer 840 both have a non-zero thickness. In an embodiment, the first portion 842 has a first non-zero thickness and a second portion 844 has a second non-zero thickness greater than the first thickness, wherein the first portion 842 is not sufficiently thick to create a 2DEG layer in GaN layer 810 beneath first gate portion 826 and wherein the second portion 844 of polarization layer 840 is also not sufficiently thick to create a 2DEG layer in GaN layer 810 beneath second gate portion 828. In yet another embodiment, the second portion 844 of polarization layer 840 is thicker than the first portion 842 of polarization layer 840 and the first portion 842 and the second portion 844 are each sufficiently thick to create a 2DEG layer in GaN layer 810 beneath first gate portion 826 and second gate portion 828, respectively. In an embodiment, the second portion 844 of polarization layer 840 is approximately 2-3 times thicker than the first portion 842 of polarization layer 840. In a specific embodiment, the first portion 842 of polarization layer 840 includes a 1 nanometer AlN layer on the GaN layer 810 and a 1 nanometer AlInN layer on the 1 nanometer AlN layer, and the second portion 844 of polarization layer 840 includes a 1 nanometer AlN layer on the GaN layer 810 and a 3 nanometer AlInN layer on the 1 nanometer AlN layer. In an embodiment, in either case, the AlInN layer includes $Al_{0.83}In_{0.17}N$.

In another embodiment, first portion 842 of polarization layer 840 has a non-zero thickness that is insufficient to create a 2DEG layer in GaN layer 810 beneath first gate portion 826 and wherein the second portion 844 of polarization layer 840 has a thickness greater than the thickness of the first polarization layer 842 and is sufficient to create a 2DEG layer in GaN layer 810 beneath second gate portion 828.

It is to be appreciated, in embodiment of the present disclosure, polarization layer 840 may have a third portion beneath a third gate portion wherein the third portion of the polarization layer 840 has a thickness greater than the thickness of the second portion 844 of polarization layer 840 which is yet thicker than the first portion 842 of polarization layer 840. In this way, a transistor having three different threshold voltages may be obtained. A similar technique may be practiced to create a GaN transistor with four or more threshold voltages, if desired.

In an embodiment, transistor 800 includes a pair of insulative sidewall spacers 860 disposed on opposite sides of gate stack 820 as illustrated in FIGS. 8B and 8C. Sidewall spacers may be formed from any well-known material, such as but no limited to silicon oxide, silicon nitride, and silicon oxynitride. One of the sidewall spacers of the pair of sidewall spacers 860 is disposed on a source portion 846 of polarization layer 840 between gate stack 820 and source III-N semiconductor contact 834. The other sidewall spacer of the pair of sidewall spacers 860 is disposed on a drain portion 848 of polarization layer 840 disposed between gate stack 820 and drain III-N semiconductor contact 836. In an embodiment, source polarization layer 846 creates a 2DEG layer 850 in the top surface of GaN layer 810 and drain polarization layer 848 creates a 2DEG layer 850 in the top surface of GaN layer 810 as illustrated in FIGS. 8B and 8C. In embodiments of the present disclosure, source polarization layer 846 and drain polarization layer 848 have a thickness greater than the thickness of the second portion 844 of polarization layer 840 and greater than the thickness of the first portion 842 of polarization layer 840 which may be a zero thickness.

In an embodiment of the present disclosure, the first transistor portion 802 and the second transistor portion 804 have the same gate width. In other embodiments, the first transistor portion 802 has a greater or smaller gate width than second transistor portion 804. In this way, the amount of current provided by the first transistor portion may differ from the amount of current provided by the second transistor portion 804.

In embodiments of the present disclosure, isolation regions 870 may be formed in GaN layer 810. Isolation regions 870 may surround transistor 800 to isolate transistor 800 from other devices manufactured in GaN 810 and/or substrate 812. An interlayer dielectric 872, such as but not limited to, silicon dioxide and carbon doped silicon oxide, may be disposed over transistor 800. Contacts 874 and 876, such as metal contacts, may be disposed in dielectric 872 to create electrical contacts to source III-N semiconductor contact 834 and to drain III-N semiconductor contact 836, respectively, as illustrated in FIGS. 8B and 8C.

Figure 9:
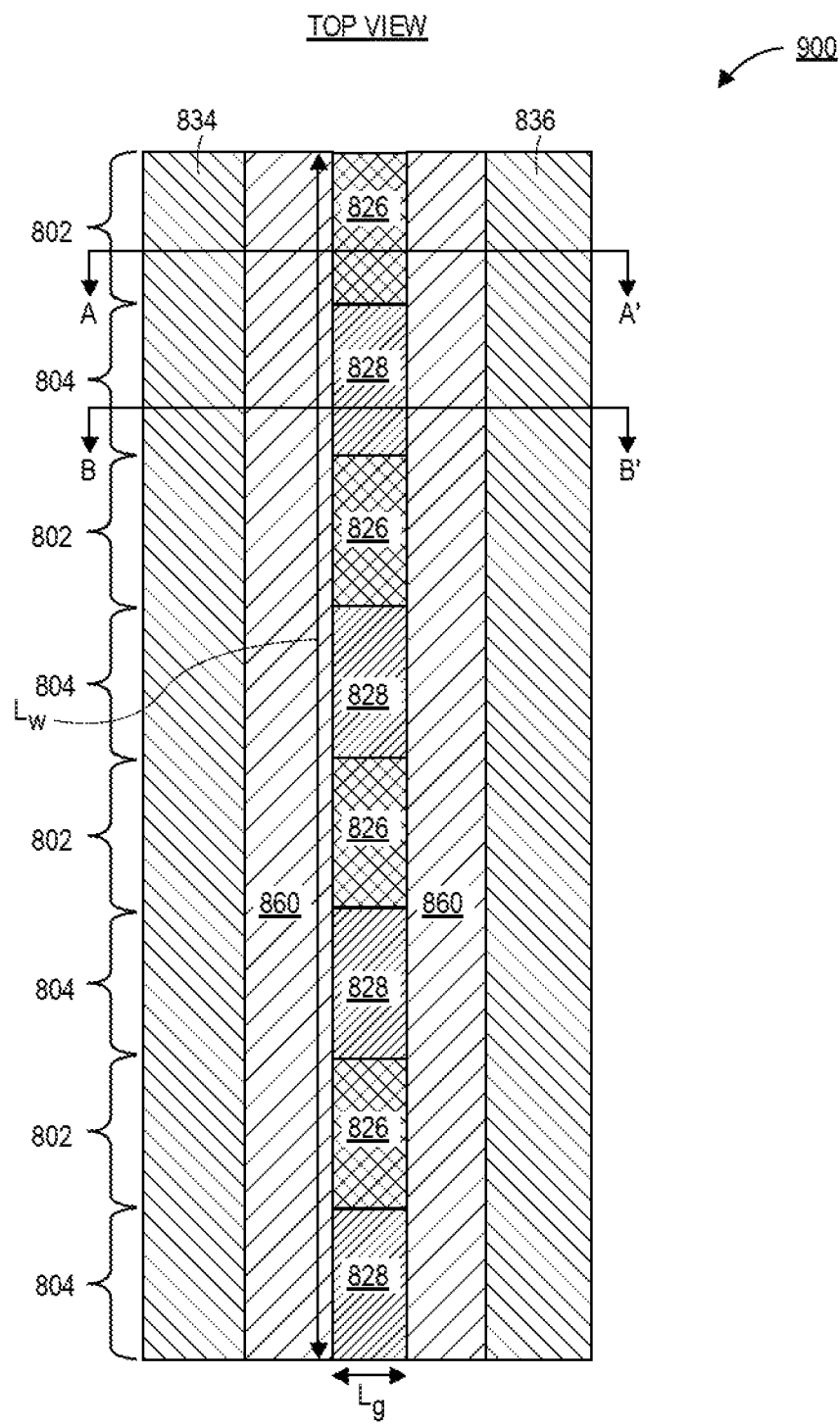
FIG. 9 illustrates a GaN transistor having multiple threshold voltages in accordance with an embodiment of the present disclosure.

FIG. 9 illustrates a GaN transistor 900 having multiple threshold voltages in accordance with an embodiment of the present disclosure. GaN transistor 900 includes a plurality of first transistor portions 802 and a plurality of second transistor portions 804 along the gate width (Gw) direction of transistor 900 as illustrated in FIG. 9. Each of the first transistor portions 802 and each of the second transistor portions 804 may include transistor structures as illustrated and described with respect to FIGS. 8B and 8C, respectively. That is, in an embodiment, each first transistor portion 802 of the plurality of first transistor portions includes a first portion 842 of polarization layer 840 having a first thickness, including possibly a zero thickness, and each second transistor portion 804 of the plurality of second transistor portions includes a second portion 844 of polarization layer 840 having a second thickness wherein the second thickness is greater than the first thickness. In an embodiment, the first transistor portions 802 and the second transistor portions 804 of GaN transistor 900 alternate or interleave with one another along the gate width (Gw) direction of FIG. 9. In an embodiment, transistor 900 includes two first transistor portions 802 and two second transistor portion 804. In another embodiment, transistor 900 includes three first transistor portions 802 and three second transistor portions 804. In yet another embodiment, transistor 900 includes three or more first transistors portions 802 and three or more second transistor portions 804. In embodiments, transistor 900 has more first transistor portions 802 than second transistor portions 804. In yet embodiment, transistor 900 has more second transistor portions 804 than first transistor portions 802. In an embodiment, interleaving provides a plurality of parallel channels for transistor 900.

Figure 10:
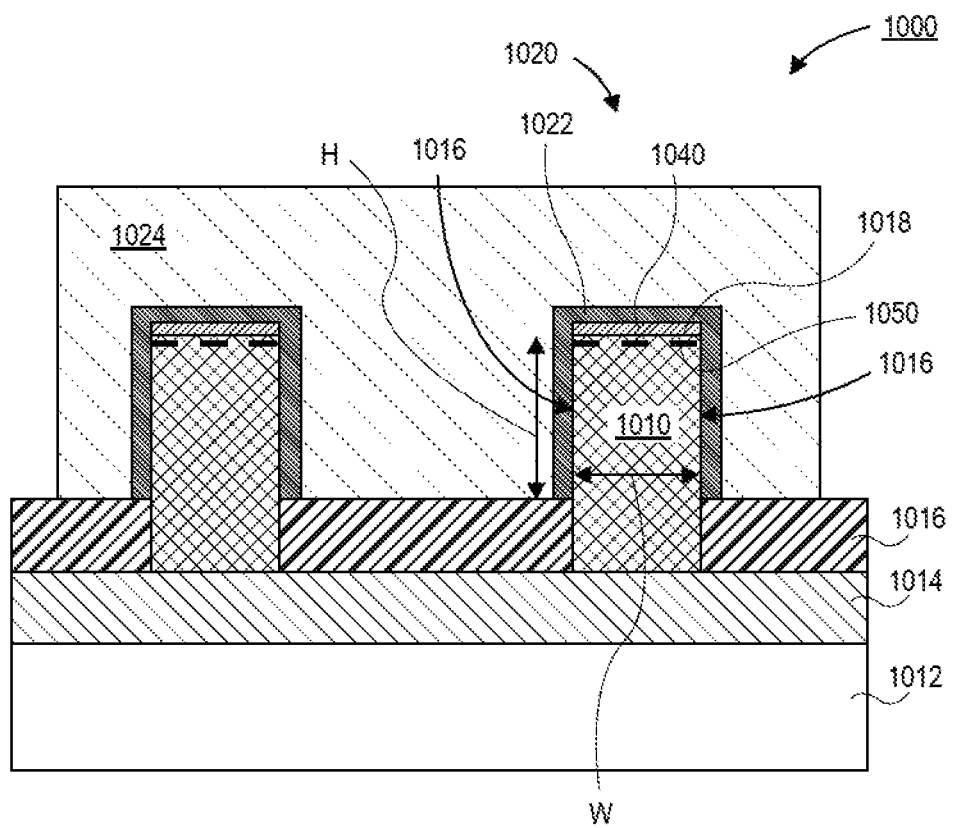
FIG. 10 illustrates a cross-sectional view of a nonplanar or tri-gate GaN transistor having multiple threshold voltages in accordance with embodiments of the present disclosure.

FIG. 10 illustrates a cross-sectional view of a nonplanar or tri-gate GaN transistor 1000 having multiple threshold voltages in accordance with embodiments of the present disclosure. Transistor 1000 includes a GaN fin 1010 disposed above a substrate, such as but not limited to a monocrystalline silicon substrate, silicon carbide substrate, or a sapphire substrate. A buffer layer 1014 may be disposed between GaN fin 1010 and substrate 1012. Fin 1010 has a pair of laterally opposite sidewalls 1016 and a top surface 1018 between the laterally opposite sidewalls. In an embodiment, top surface 1018 of GaN fin 1010 is a (1000) plane or a c-plane of GaN. An oxide layer, such as an oxide of a shallow trench isolation (STI) may be disposed above substrate 1012 and may surround a bottom portion of fin 1010, so that an upper portion of fin 1010 extends above oxide 1016 as illustrated in FIG. 10.

A polarization layer 1040 is disposed on the top surface 1018 of fin 1010. In an embodiment, polarization layer 1010 is a III-N semiconductor material, such as but not limited to AlGaInN, AlGaN, and AlInN. In an embodiment polarization layer 1040 is not formed on sidewall 1016 of fin 1010. A gate stack 1020 is disposed over polarization layer 1020 on the top surface 1018 of fin 1010 and is disposed over the sidewalls 1016 of fin 1010 as illustrated in FIG. 10C. Gate stack 1020 may include a gate dielectric 1022, such as but not limited to hafnium oxide (e.g. $HfO_2$) or aluminum oxide (e.g. $Al_2O_3$) and a gate electrode 1024 such as a metal gate electrode. Gate dielectric 1022 may be disposed between gate electrode 1024 and sidewalls 1016 of gate electrode 1024 and between gate electrode 1024 and polarization layer 1040 on the top surface of GaN fin 1010. A source region and a drain region (not shown) may be disposed on opposite sides (into and out of the page) of the gate stack 1020 as is well-known in the art. The source and drain regions each may include a group III-N semiconductor contact, such as but not limited to InGaN.

In an embodiment, polarization layer 1040 is of a sufficient thickness to create a 2DEG layer in the top surface of fin 1010 as illustrated in FIG. 10. In an alternative embodiment, polarization layer 1040 has a thickness which is insufficient to create a 2DEG layer in the top surface of fin 1010, however, is of a sufficient thickness in order to provide a different threshold voltage for the portion of the gate stack 1020 over the top surface 1018 of fin 1010 relative to the threshold voltage of the gate stack 1020 adjacent to the sidewalls 1016 of fin 1010. In either case, transistor 1000 has two different threshold voltages, a first threshold voltage (VT1) associated with a portion of the gate stack 1020 over/adjacent to the sidewalls 1016 of fin 1010 and second threshold voltage (VT2), such as a lower threshold voltage, associated with the portion of the gate stack 1020 over polarization layer 1040 and top surface 1018 of fin 1010. The width (W) of and the height (H) of the portion of fin 1010 may be chosen to create the desired amount of current provided by the top surface 1018 of fin 1010 relative to the sidewalls 1016 of fin 1010. In an embodiment, an additional fin or fins including a top polarization layer may be included to increase the current carrying capability of transistor 1000, an example of which is shown in FIG. 10.

FIGS. 11A-11K illustrate cross-sectional views of a method of fabricating a GaN transistor having multiple threshold voltages in accordance with embodiments of the present disclosure.

Figure 11A:
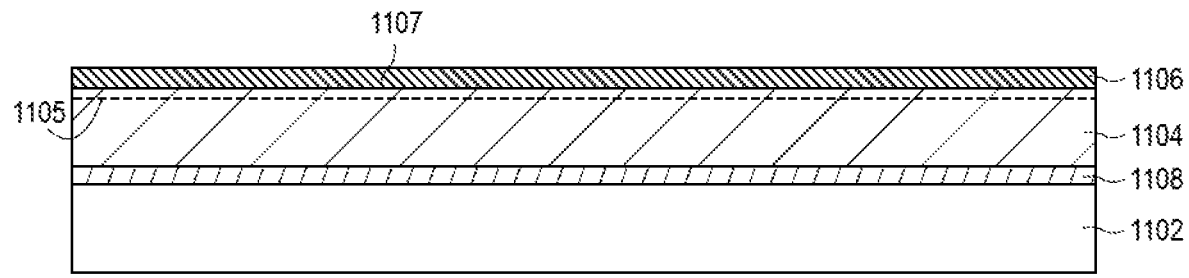

FIG. 11A illustrates a GaN layer 1104 formed over a substrate 1102. A polarization layer 1106 may be disposed on the GaN layer 1104. In an embodiment, the top surface 1107 of GaN layer 1104 is a (0001) plane or a c-plane of GaN. GaN layer 1104 may have a thickness between 1-2 microns. Substrate 1102 may be any well-known substrate used in the manufacture of integrated circuits, such as but not limited to a silicon monocrystalline substrate, a silicon carbide substrate and a sapphire substrate. In an embodiment, a buffer layer 1106 may be formed between substrate 1102 and GaN layer 1104. Buffer layer 1106 may contain one or more layers having a lattice constant between the lattice constant of substrate 1102 and GaN layer 1104. Polarization layer 1106 is a III-N semiconductor, such as but not limited to aluminum gallium indium nitride ($Al_xGa_{1-x-y}In_yN$, where $0<x<=1$, $0<y<=1$) which is formed to a sufficient thickness to create a two dimensional electron gas (2-DEG) layer 1105 in the top portion of GaN layer 1104. In an embodiment, polarization layer 1106 consists of multiple layers, such as $AlN/Al_{0.2}Ga_{0.8}N/Al_{0.83}In_{0.17}N$, where the AlN is to the bottommost layer. In an embodiment, the polarization layer 1106 has a thickness of approximately 10 nanometers.

In a specific embodiment, substrate 1102 is a monocrystalline silicon substrate, buffer layer 1108 includes an aluminum nitride layer having a thickness between 100-300 nm disposed on the monocrystalline silicon substrate and a graded aluminum gallium nitride layer with a higher aluminum concentration near the aluminum nitride layer. Integrated circuits, for example, a system-on-chip (SOC) or a microprocessor, may be formed from silicon transistors, such as nonplanar transistors, fabricated on portions of silicon substrate 1102 not covered by the GaN layer 1104. In another embodiment, substrate 1102 is a silicon carbide (SiC) substrate and buffer layer 1108 includes aluminum nitride having a thickness, for example, between 100-300 nm. Polarization layer 1106, buffer layer 1108, GaN layer 1104 may be formed by any well-known technique, such as but not limited to chemical vapor deposition (CVD), metal organic chemical vapor deposition (MOCVD), and sputtering.

Figure 11B:
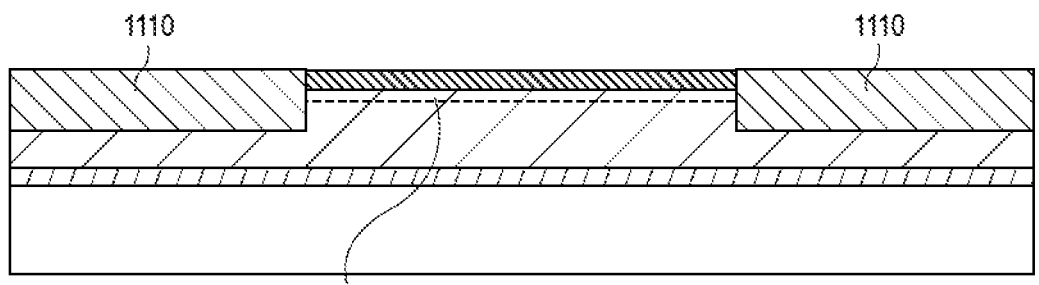

FIG. 11B illustrates the formation of shallow trench isolation (STI) regions 1110 in the structure of FIG. 11A. STI regions 1110 may be formed by etching trenches through polarization layer 1106 and into GaN layer 1104 and the blanket depositing an insulating film, such as silicon oxide, to fill the trenches. A chemical mechanical polishing (CMP) process may then be used to remove excess insulating material, such as silicon oxide, from above polarization layer 1106 so that STI regions 1110 are substantially coplanar with the top surface of polarization layer 1106 as shown in FIG. 11B.

Figure 11C:
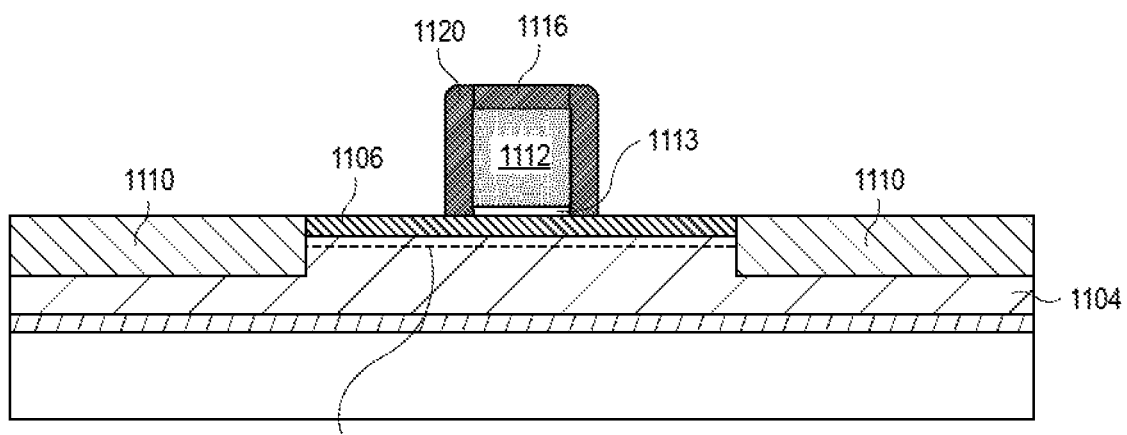

FIG. 11C illustrates the formation of a sacrificial gate 1112 on the structure of FIG. 11B. A sacrificial gate dielectric 1113, such as silicon dioxide, may be formed beneath sacrificial gate 1112 if desired. A hard mask cap 1116 may be formed on the top of sacrificial gate 1112 as shown in FIG. 11C. A pair of insulating sidewall spacers 1120 may be formed along opposite walls of sacrificial gate 1112 as shown in FIG. 11C.

Sacrificial gate 1112/cap 1116 may be formed by first blanket depositing a polycrystalline film, such as but not limited to polycrystalline silicon by, for example, chemical vapor deposition (CVD) or sputtering over the structure of FIG. 11B. A hard mask capping layer, such as but not limited to silicon nitride, silicon carbide, or silicon oxynitride may be deposited over the polycrystalline film. The stack of films can then be patterned by well-known techniques, such as by lithographic masking and etching to form sacrificial gate 1112/cap 1116. Insulating sidewall spacers 1120 may then be formed by blanket depositing an insulating film, such as but not limited to silicon oxide, silicon oxynitride, and silicon nitride over sacrificial gate 1112/cap 1116 and then anisotropically etching the insulating film to form spacers, as is well-known in the art.

Figure 11D:
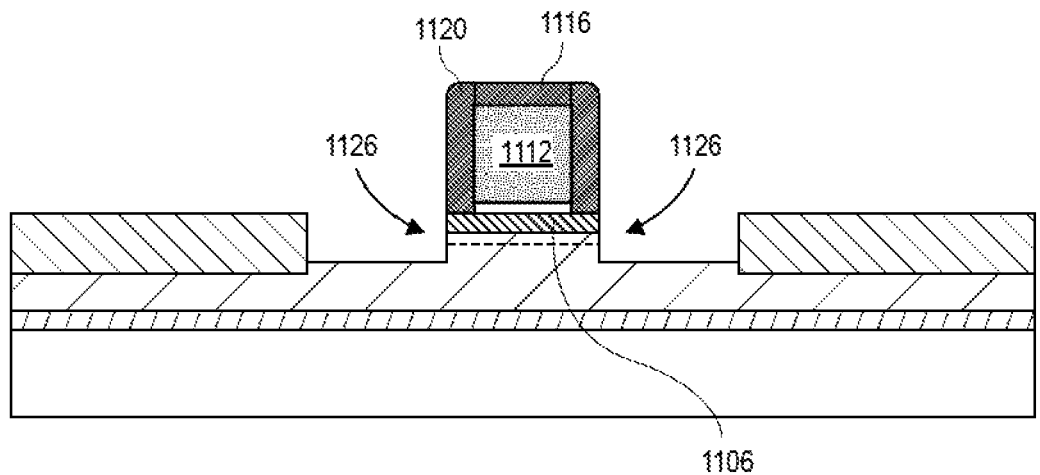

FIG. 11D illustrates the formation of recesses in the structure of FIG. 11C. In an embodiment, recesses 1126 are formed on opposite sides of sacrificial gate 1112 as illustrated in FIG. 11D. Recesses 1126 are formed through polarization layer 1106 and into GaN layer 1104. Recess 1126 may enable a subsequently deposited source/drain material to provide stressing to a channel region of a fabricated transistor. Recesses 1126 may be formed by wet etching, dry etching or a combination of wet and dry etching.

Figure 11E:
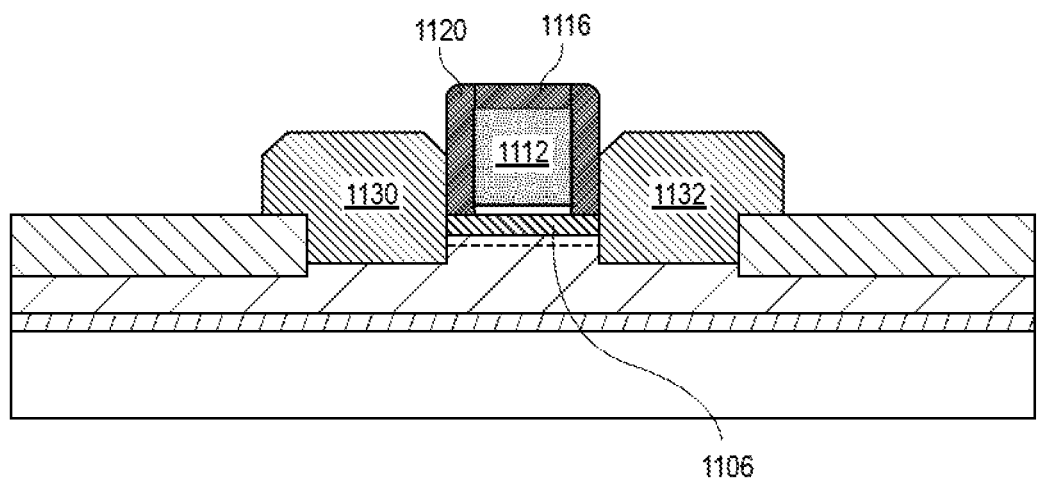

FIG. 11E is a cross-sectional view illustrating the formation of a source semiconductor contact region, and drain semiconductor contact region on the structure of FIG. 11D. In an embodiment, a source semiconductor contact 1130 is formed in recess 1126 on a first side a sacrificial gate 1112 and a drain semiconductor contact 1132 is formed in recess 1126 on a second side of sacrificial gate 1112 as illustrated in FIG. 11E. In an embodiment, source semiconductor contact 1130 and drain semiconductor contact 1132 are formed from a III-N semiconductor, such as but not limited to indium gallium nitride (InGaN). In an embodiment, source semiconductor contact 1130 and drain semiconductor contact 1132, are formed from a III-N semiconductor material which is different from a GaN layer 1104. In an embodiment, the III-N semiconductor material used to form source semiconductor contact 1130 and drain semiconductor contact 1132 has a smaller band gap than GaN. In an embodiment, the source semiconductor contact 1130 and drain semiconductor contact 1132 are formed from a single crystalline III-N semiconductor and may be N+ doped with a dopant such as silicon. In an embodiment, a III-N semiconductor material is selectively deposited by, for example, chemical vapor deposition so that the III-V semiconductor material selectively forms on semiconductor regions, such as GaN semiconductor layer 1104 in recesses 1126 but does not form on insulating surfaces, such as STI oxide 1110 and hard mask cap 1116. In an embodiment, the deposition process is continued until recesses 1126 are completely filled with III-N semiconductor material.

Additionally, in an embodiment of the present disclosure, the deposition process continues until the top surface of source semiconductor contact 1130 and drain semiconductor contact 1132 extend above the surface upon which sacrificial gate 1112 is formed in order to create a raised source region 1130 and a raised drain region 1132, which may be in situ doped with for example silicon to N+ conductivity. In an embodiment, the deposition process used to form source semiconductor contact 1130 and drain semiconductor contact 1132 selectively epitaxially deposits a single crystalline or near single crystalline film.

Figure 11F:
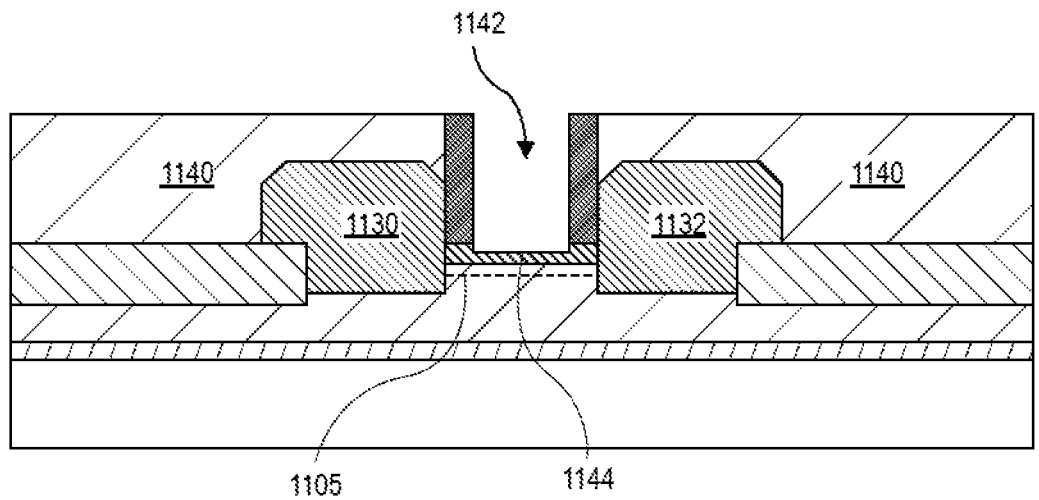

FIG. 11F illustrates the formation of an interlayer dielectric over the structure of FIG. 11E and the removal of cap 1116 and sacrificial gate structure 1112 from the structure of FIG. 11E. In an embodiment, an interlayer dielectric (ILD) 1140 is first blanket deposited over the structure of FIG. 11E. The interlayer dielectric 1140 may be deposited by any well-known technique, such as for example, chemical vapor deposition or plasma enhanced chemical vapor deposition. In an embodiment, the interlayer dielectric 1140 is an oxide, such as but not limited to, silicon oxide, and carbon doped silicon oxide. The ILD 1140 is deposited to a thickness sufficiently to cover source semiconductor contact 1130 and drain semiconductor contact 1132. The ILD 1140 may then be chemically mechanically polished in order to create a planar top surface which is coplanar with the top of hard mask cap 1116. Cap 1116 and sacrificial gate 1112 may then be removed by, for example, etching as illustrated in FIG. 11F. In an embodiment, the entire polarization 1106 layer in the opening 1142 is then partially etched a first time to create a recessed polarization layer 1144 having a first thickness. In an embodiment the first thickness is sufficient to maintain the 2DEG layer 1105 in the top of GaN layer 1104 as illustrated in FIG. 11F. In an embodiment, recessed polarization layer 1144 has a thickness of approximately 4 nanometers.

Figure 11G:
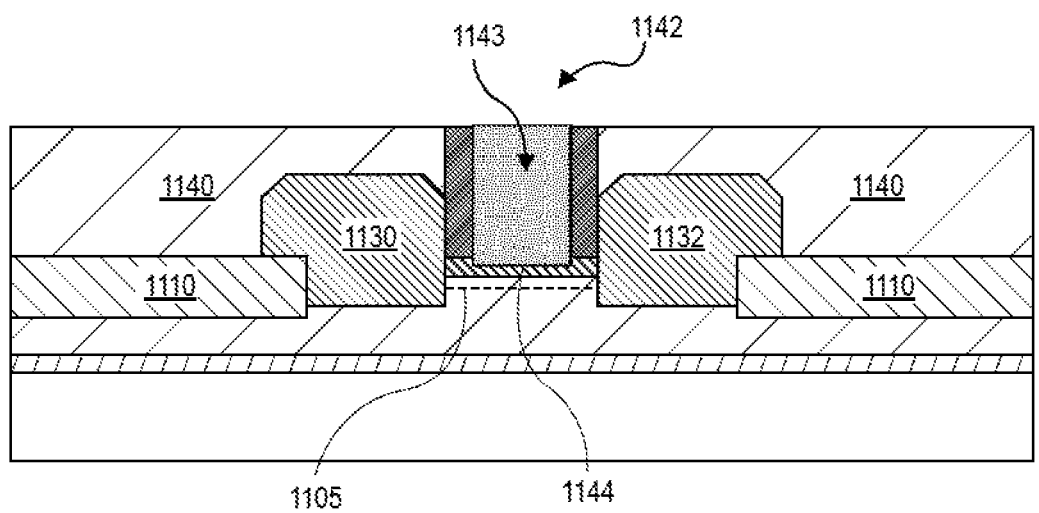

Next, as illustrated in FIG. 11G, opening 1142 is filled with an insulating material 1143, such as but not limited to a sacrificial light absorbing material (SLAM). Opening 1142 may be filled by blanket depositing insulating (sacrificial) material 1143 over the structure of FIG. 11F, by for example spin coating and then removing the over burden, by for example, chemical mechanical polishing so that the top surface of insulating material 1143 is coplanar with the top surface of interlayer dielectric 1140 as shown in FIG. 11G.

FIG. 11H is a cross-sectional illustration of FIG. 11G taken along the gate width direction. FIG. 11H shows insulating material 1143 disposed on recessed polarization layer 1144 having a first thickness. In an embodiment, the top surface of recessed polarization layer 1144 may be slightly recessed beneath the top surface of STI 1110 as illustrated in FIG. 11H.

FIG. 11I illustrates a second etching of a portion 1147 of recessed polarization layer 1144 of the structure of FIG. 11H. In an embodiment, a photoresist mask 1146 is formed on a portion of insulating material 1143. Photoresist mask 1146 has an opening over a portion 1147 of recessed polarization layer 1144. The portion of insulating layer 1143 beneath opening 1148 is then removed, by, for example, wet etching. Next, the exposed portion of recessed polarization layer 1144 is etched a second time, for example, by wet etching to create a polarization portion 1147 having a second thickness which is less than the thickness of the recess polarization layer. In an embodiment, the second thickness of portion 1147 of polarization layer is insufficient to create a 2DEG layer in GaN layer 1104 as illustrated in FIG. 11I. In an embodiment, polarization layer 1147 has a thickness of approximately 2 nanometers. In another embodiment, the polarization layer in opening 1148 is completely removed.

Figure 11J:
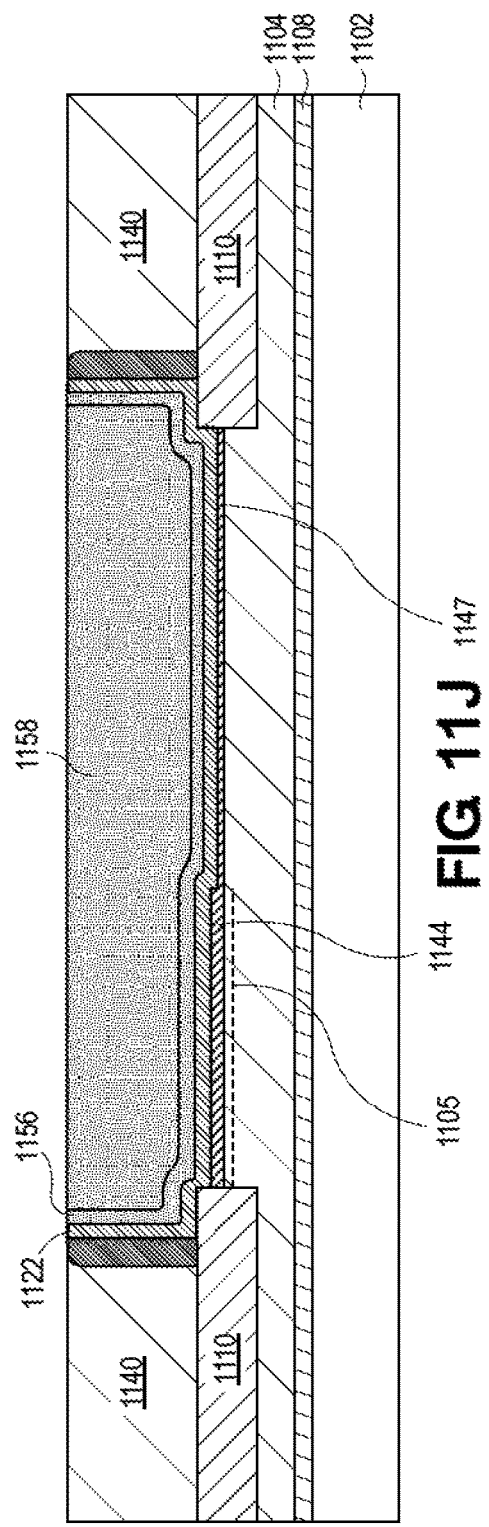
Figure 11K:
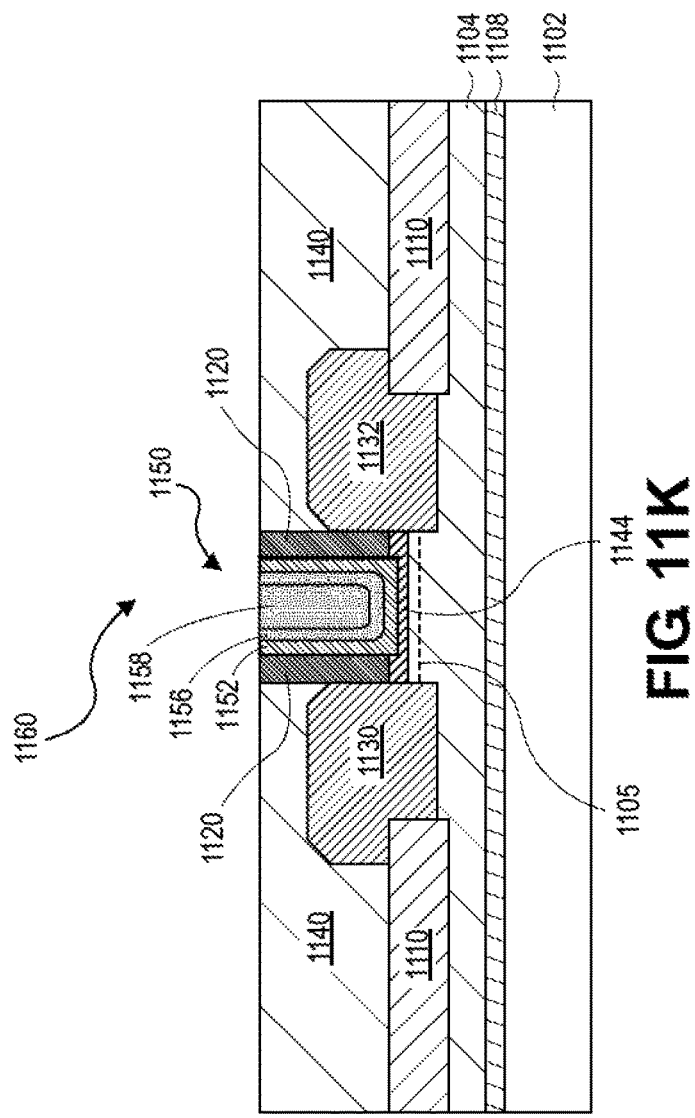

FIGS. 11J and 11K are views orthogonal to one another illustrating the formation of a gate on the structure of FIG. 11I subsequent to re-opening the entire gate region 1142. In an embodiment of the present disclosure, the gate stack 1150 is disposed in opening 1142. In an embodiment of the present disclosure, gate stack 1150 includes a high-k gate dielectric 1152 disposed on recessed polarization layer 1144 or on GaN layer 1104 if polarization layer is completely removed during etching. Gate stack 1150 includes a metal gate 1154. In an embodiment, metal gate 1154 includes a work function layer or layers 1156 and a fill layer 1158. At the time the process of fabricating a III-V transistor 1160 in accordance with embodiments of the present disclosure is not complete. In an alternative embodiment, the first partial etching of polarization layer 1106 creates a recess polarization layer 1144 which is not sufficiently thick to create a 2DEG layer in the top of GaN layer 1104.

In a second aspect, a high performance low parasitic GaN transistor on insulator with top and bottom contacts is described.

To provide context, high speed high performance transistor technology is needed for 5G and 6G RF Power Amplifiers (PAs). Communication bands continue to move to higher frequencies to support higher data rates. 5G communication standards intend to utilize frequencies in the mmwave (20 to 40 GHz) to support Gb/s communication. 6G communication standards intend to push the frequencies to even higher, as high as 60-140 GHz. To enable such high datarate communication at mmwave frequencies, high gain RF power amplifiers (transistors) are required. Radio frequency (RF) PAs are the most power hungry component in an RF circuit and the key determinant of system performance and efficiency. The gain of the RF PA can be quantified by the transistor cut-off frequencies, fT and fMax. The higher the fT and fMax, the higher the gain, and therefore, the more efficient the RF power amplifier is and the less power it consumes. However, obtaining high fT and fMax, typically requires scaling the transistor to smaller dimensions. And, doing so, will decrease the maximum breakdown voltage that a transistor can sustain due to catastrophic breakdown in the semiconductor material. For example, a Si transistor can be scaled to such small dimensions to achieve fT and fMax about 450 GHz, but it can only handle about 1V or less of supply voltage. An inability to handle large voltages limits the use of the Si transistor as a RF PA since the RF output power will be limited. Moreover, to scale Si transistors further require finFET or gate-all-around architecture which introduces high parasitic fringing gate capacitances that reduces the fT and fMax.

To provide further context, transistors with improved Figures of Merit are required for 5G and 6G RF switches. 5G RF switches are expected to operate at 20-40 GHz, while 6G RF switches, at >70 GHz. Today, even the best silicon-on-insulator (SOI) RF switches can barely perform well at 40 GHz. The best SOI RF switches have FoM about 80 fs. This needs to be significantly improved for 6G. The FoM is defined as Ron×Coff, where Ron=transistor on resistance and Coff=transistor off capacitance. The FoM can be increased significantly by reducing the parasitic capacitance of the transistor. Low Ron and low parasitics transistors are ideal as power switches for voltage regulators. Improved power switches are required as voltage regulator technology miniaturizes, and switching speeds increases. With high switching speeds, the power dissipation at the (transistor) switches increases (switching loss=$CV^2f$). Therefore, in order to maintain high efficiencies, the capacitance (C), especially the parasitic capacitance, needs to be minimized.

Today's state-of-the-art technologies include Si RFSOI and GaAs pHEMT. Si RF SOI transistors have high on resistance due to multiple stacking (as many as 14 transistors in series) in order to handle high breakdown voltage. GaAs pHEMT is a depletion mode transistor technology and requires separate large supply voltage to the gate in order to turn the transistor off. The supply voltage in a mobile system is typically limited to either 3.7V (1S battery) or 7.4V (2S battery). Both Si and GaAs transistors have high on resistance, and as a result, very large transistor widths are required to achieve low insertion loss for RF switch application. Moreover, large transistor widths are typically accompanied by large parasitics (capacitance and leakage) which are detrimental to performance and power efficiency. Both SOI and GaAs technologies have limitations that can be solved only with GaN technology. Due to its wide bandgap and high critical breakdown electric field, gallium nitride (GaN) transistors make improved RF switches. GaN, a wide bandgap semiconductor, is an excellent semiconductor for RF and power applications. Because of its wide bandgap, scaling it down to equivalently small dimensions will still allow it to handle about 10× higher voltages compared to what a Si transistor can sustain. While GaN improves the intrinsic transistor characteristics over that of SOI and GaAs, it suffers the same parasitic gate fringing capacitance.

In accordance with one or more embodiments of the present disclosure, gate structures that enable ultralow gate fringing capacitances are described to enable high cut-off frequencies (fT,fMax), improved figure of merits for RF switches and low parasitics for power switching. A GaN RF and power transistor technology with high cut-off frequencies, and simultaneously best FoM for RF switch and power switching, will be a critical enabler for future wireless solutions above 40 GHz, and will be a competitive advantage for products that require high speed connectivity, e.g., 5G, 6G and chip-to-chip communication. In power electronics, GaN power transistor technology that can switch efficiently (i.e., with low parasitic capacitance) at high switching frequencies>20 MHz can be implemented to enable small form factor voltage regulator solutions that can be integrated on package, high efficiency active voltage regulation for high performance CPU/GPU products and direct-battery-attach.

Figure 12A:
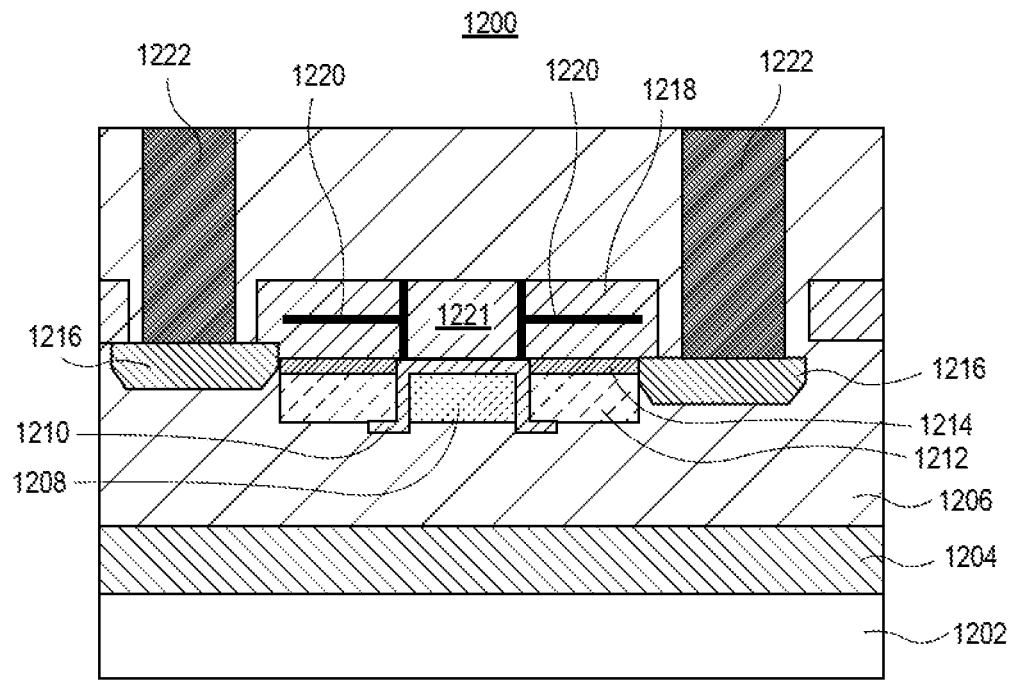
FIG. 12A illustrates a cross-sectional view of a GaN NMOS bottom gated switch design, in accordance with an embodiment of the present disclosure.

FIG. 12A illustrates a cross-sectional view of a GaN NMOS bottom gated switch design, in accordance with an embodiment of the present disclosure.

Referring to FIG. 12A, an integrated circuit structure 1200 includes a buried oxide layer 1204, such as a silicon oxide layer, on a substrate 1202, such as a silicon substrate. A dielectric layer 1206, such as a low-k dielectric layer, is on the buried oxide layer 1204. A gate structure including a gate electrode 1208 and gate dielectric layer 1210, which may be within a trench in an insulating structure 1212 are within the dielectric layer 1206. The gate structure is on, or within, or through, a polarization layer 1214, such as a layer of aluminum gallium nitride (AlGaN), aluminum indium nitride (AlInN), aluminum indium gallium nitride (AlInGaN) or indium gallium nitride (InGaN). A GaN layer 1218 is on the polarization layer 1214. A critical dimension (CD) of a channel 1221 within the GaN layer 1218 is indicated by bracket structures 1220. Source or drain structures 1216 are on either side of the gate structure and the channel 1221. Source or drain contacts 1222 extend from a top of integrated circuit structure 1200. A gate contact can be formed in a trench from a top of integrated circuit structure 1200 at a location into or out of the page from the perspective shown in FIG. 12A.

With respect to an integrated circuits structure of the type of FIG. 12A, in an embodiment, an excellent FoM of <10 fs for the GaN transistor can be achieved, which is 10× better than any top gated designs. Not to be bound by theory, it is best understood that by fabricating the gate to the bottom and the drain/source metal from the top, the (parasitic) capacitive coupling between the gate and the source/drain are minimized. The only drain-to-source capacitance is the intrinsic critical dimensions (CDs) coupling the source and drain through the intrinsic GaN channel.

Figure 12B:
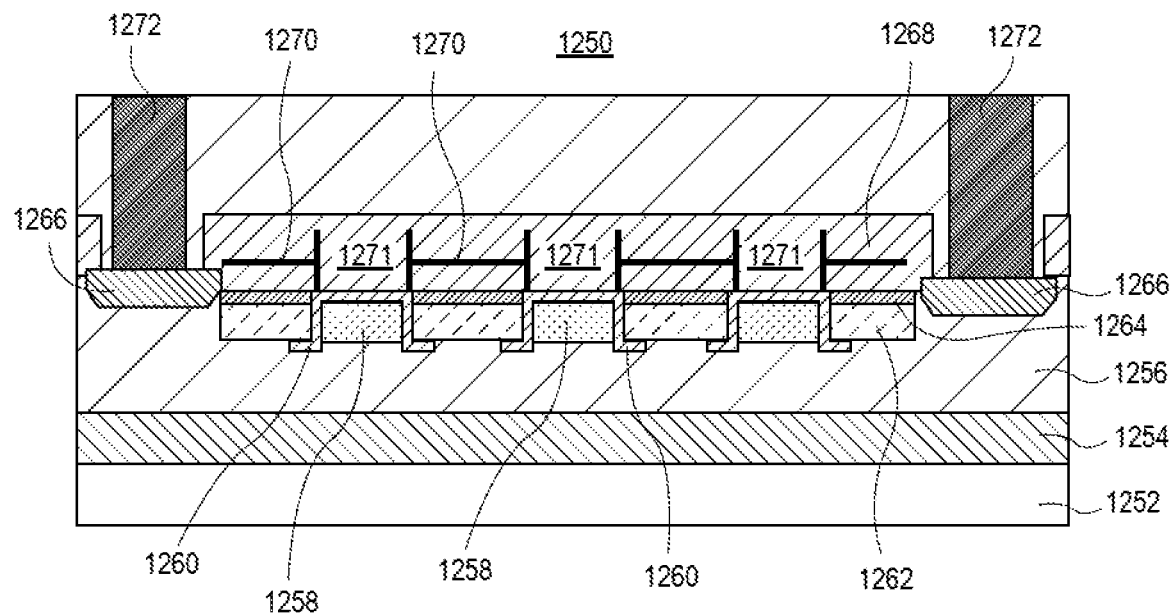
FIG. 12B illustrates a cross-sectional view of a GaN NMOS bottom gated multi-gate architecture, in accordance with an embodiment of the present disclosure.

FIG. 12B illustrates a cross-sectional view of a GaN NMOS bottom gated multi-gate architecture, in accordance with an embodiment of the present disclosure.

Referring to FIG. 12B, an integrated circuit structure 1250 includes a buried oxide layer 1254, such as a silicon oxide layer, on a substrate 1252, such as a silicon substrate. A dielectric layer 1256, such as a low-k dielectric layer, is on the buried oxide layer 1254. A plurality of gate structures, each including a gate electrode 1258 and gate dielectric layer 1260, are within a trench in an insulating structure 1262 and are within the dielectric layer 1256. The gate structures are on, or within, or through, a polarization layer 1264, such as a layer of aluminum indium nitride (AlInN), aluminum indium gallium nitride (AlInGaN) or indium gallium nitride (InGaN). A GaN layer 1268 is on the polarization layer 1264. Critical dimensions (CDs) of channels 1271 within the GaN layer 1268 are indicated by bracket structures 1270. Source or drain structures 1266 are on either side of the plurality of gate structures and the channels 1271. Source or drain contacts 1272 extend from a top of integrated circuit structure 1250. Gate contacts can be formed in trenches from a top of integrated circuit structure 1250 at a location into or out of the page from the perspective shown in FIG. 12B.

With respect to an integrated circuits structure of the type of FIG. 12B, in an embodiment, by including multi-gates, higher voltage handling can be achieved. The design can provide an approach for even greater compactness.

FIGS. 13A-13F illustrate cross-sectional views representing various operations in a method of fabricating a GaN NMOS bottom gated device, in accordance with an embodiment of the present disclosure.

Figure 13A:
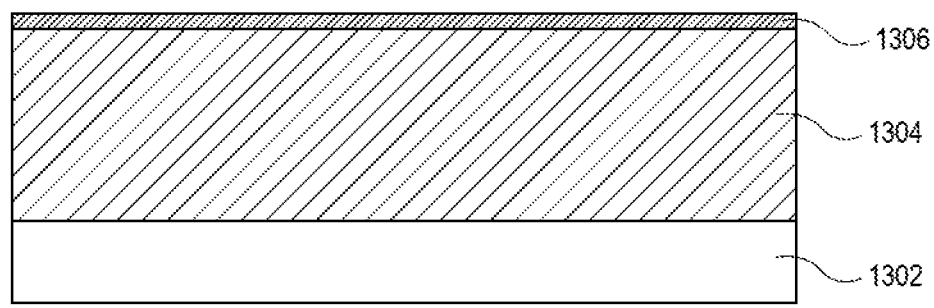
FIGS. 13A-13F illustrate cross-sectional views representing various operations in a method of fabricating a GaN NMOS bottom gated device, in accordance with an embodiment of the present disclosure.

Referring to FIG. 13A, a starting structure 1300 is formed using epitaxial growth of an AlInGaN layer 1306 on a GaN/buffer stack 1304 on a substrate 1302.

Figure 13B:
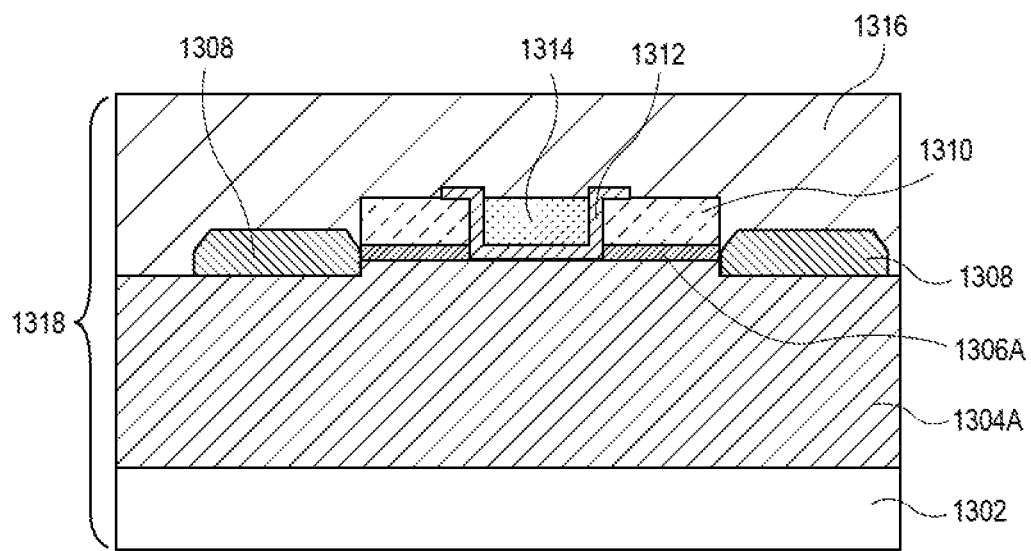

Referring to FIG. 13B, a GaN transistor stack 1318 is fabricated in a dielectric layer 1316, such as a low-k dielectric layer. A gate structure including a gate electrode 1314 and gate dielectric layer 1312, are within a trench in an insulating structure 1310 and are within the dielectric layer 1316. The gate structure is on, or within, or through, patterned AlInGaN layer 1306A which can act as a polarization layer. The GaN layer 1304 may be patterned or partially modified by etch to form GaN layer 1304A. Source or drain structures 1308 are on either side of the gate structure 1314/1312.

Figure 13C:
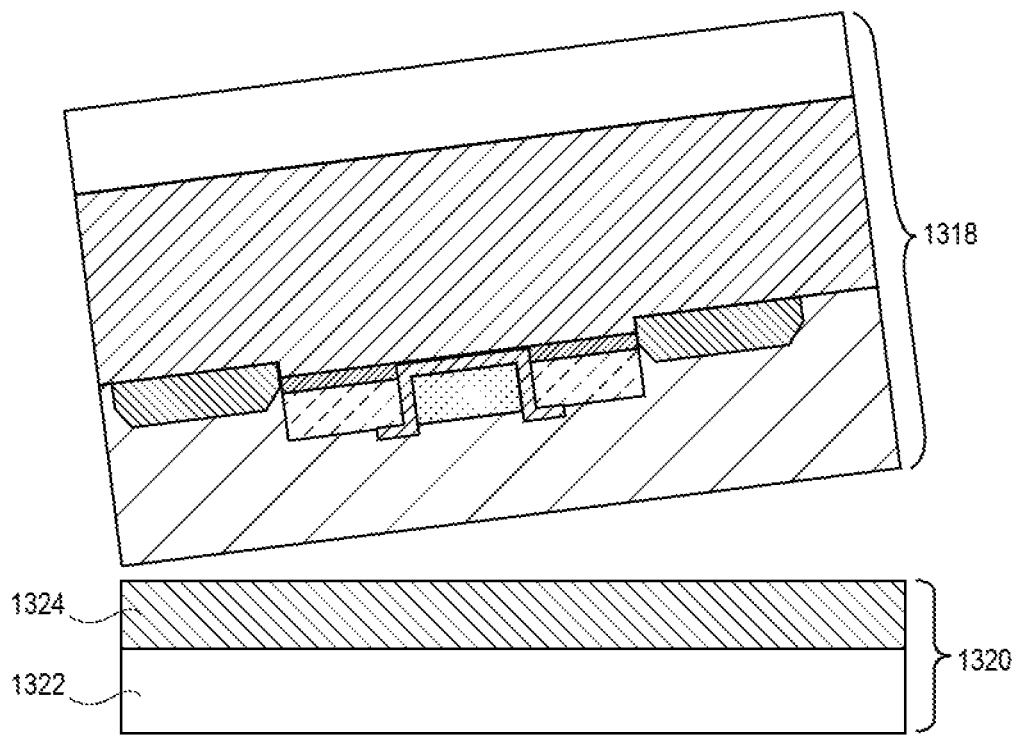
Figure 13D:
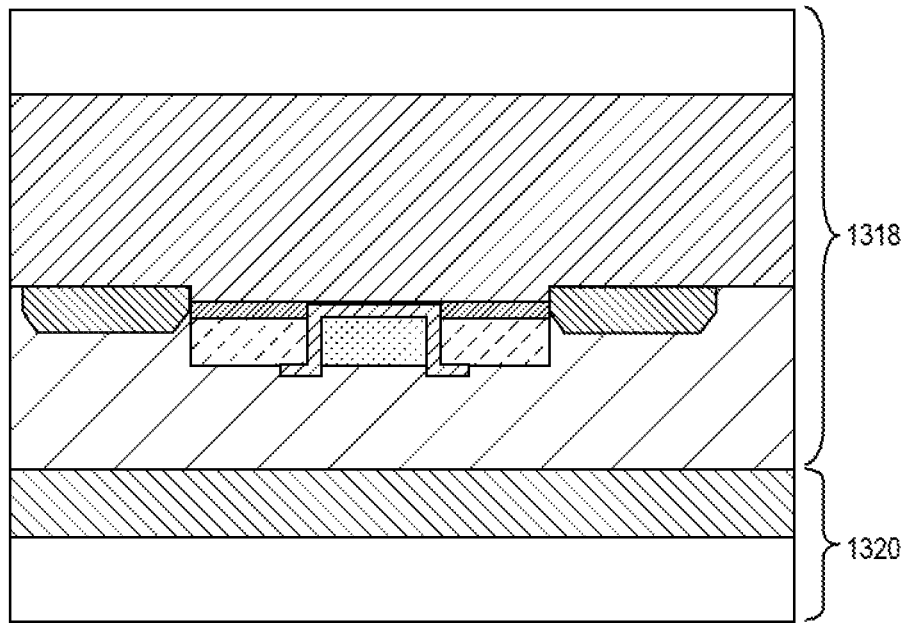

Referring to FIGS. 13C and 13D, the GaN transistor stack 1318 is bonded to a carrier substrate 1320. In one embodiment, the carrier substrate 1320 includes a buried oxide layer 1324, such as a silicon oxide layer, on a substrate 1322, such as a silicon substrate Referring to FIG. 13E, substrate 1302 is removed, and GaN layer 1304A is thinned to form GaN layer 1304B.

Figure 13E:
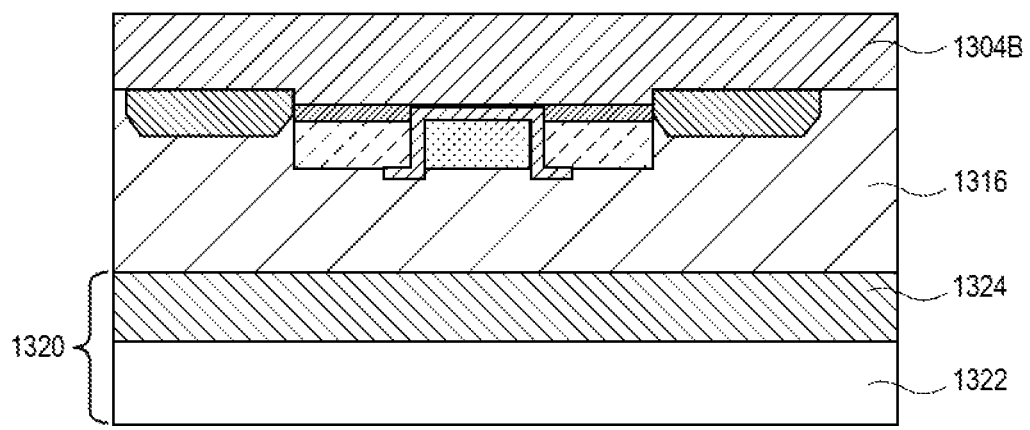
Figure 13F:
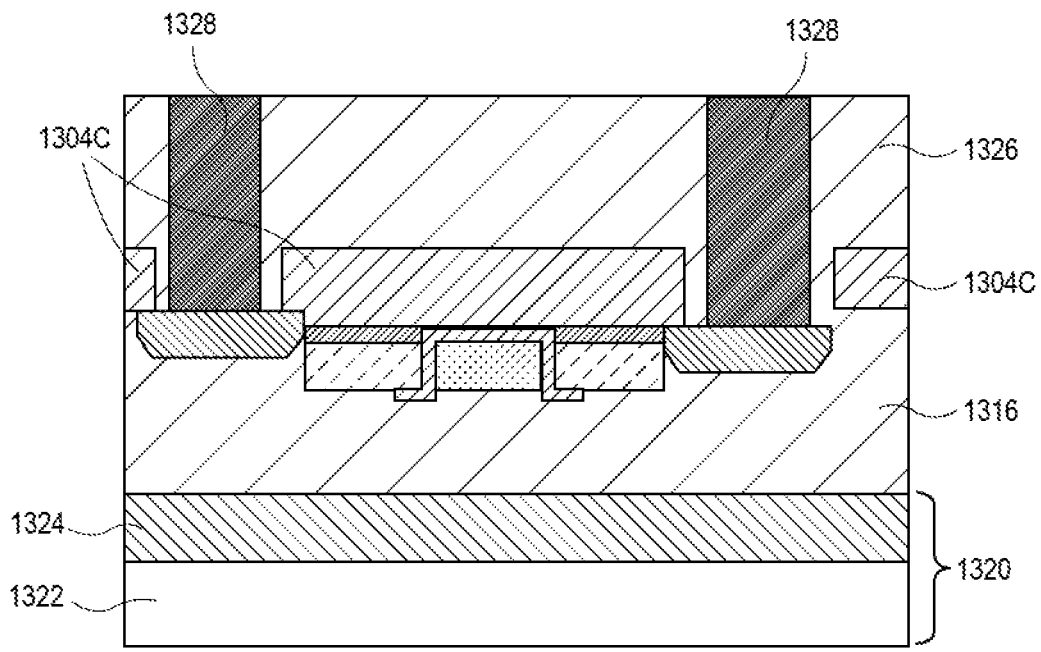

Referring to FIG. 13F, a dielectric layer 1326, such as a low-k dielectric layer, is formed on the structure of FIG. 13E. The dielectric layer 1326 and the GaN layer 1304B are then patterned to form contact openings in the dielectric layer 1326 and to form further patterned GaN layer 1304C. Source or drain contacts 1328 are formed in the contact openings and extend from a top of the structure of FIG. 13F. Although not depicted, a gate contact can be formed using a trench from the top of the structure of FIG. 13F.

In a third aspect, high speed GaN transistors are described.

To provide context, communication bands continue to move to higher frequencies to support higher data rates. 5G intends to utilize frequencies in the mmwave (20 to 40 GHz) to support Gb/s communication. 6G communication standards intend to push the frequencies to even higher, as high as 60-140 GHz. To enable such high datarate communication at mmwave frequencies, high gain RF power amplifiers (transistors) are required. RF PAs are the most power hungry component in an RF circuit and the key determinant of system performance and efficiency. The gain of the RF PA can be quantified by the transistor cut-off frequencies, fT and fMax. The higher the fT and fMax, the higher the gain, and therefore, the more efficient the RF power amplifier is and the less power it consumes. However, obtaining high fT and fMax, typically requires scaling the transistor to smaller dimensions. And, doing so, will decrease the maximum breakdown voltage that a transistor can sustain due to catastrophic breakdown in the semiconductor material. For, e.g., a Si transistor can be scaled to such small dimensions to achieve fT and fMax about 450 GHz, but it can only handle about 1V or less of supply voltage. Inability to handle large voltages limits the use of the Si transistor as a RF PA since the RF output power will be limited. GaN, a wide bandgap semiconductor, is an excellent semiconductor for this purpose. Because of its wide bandgap, scaling it down to equivalently small dimensions will still allow it to handle about 10× higher voltages compared to what a Si transistor can sustain.

In accordance with embodiments of the present disclosure, methods and structures for enabling such a scaled GaN high speed transistor are described. Such high speed GaN transistors can be critical enabling technology for 6G communication where communication frequencies extends to >90 GHz. In accordance with one or more embodiments herein, techniques and methods to reduce parasitic capacitances, resistances and inductances that introduces charging times which slows the speed of the transistor operation are described. Such techniques can include: (a) GaN on insulator to reduce parasitic coupling to substrate, (b) air gaps and bridges to reduce parasitic capacitive coupling with interconnect metals, (c) through-structure vias (TSV) and substrate backside ground plane to reduce inductive effect of long interconnects to ground, and/or (d) low resistance Cu T-shaped gate to reduce the transistor gate resistance. In an embodiment, a high frequency GaN RF power amplifier solution is a critical enabler for future wireless and WiFi solutions above 40 GHz, and can be implemented for products that require high speed connectivity, e.g., chip-to-chip communication, and, possibly, defense electronics.

Figure 14A:
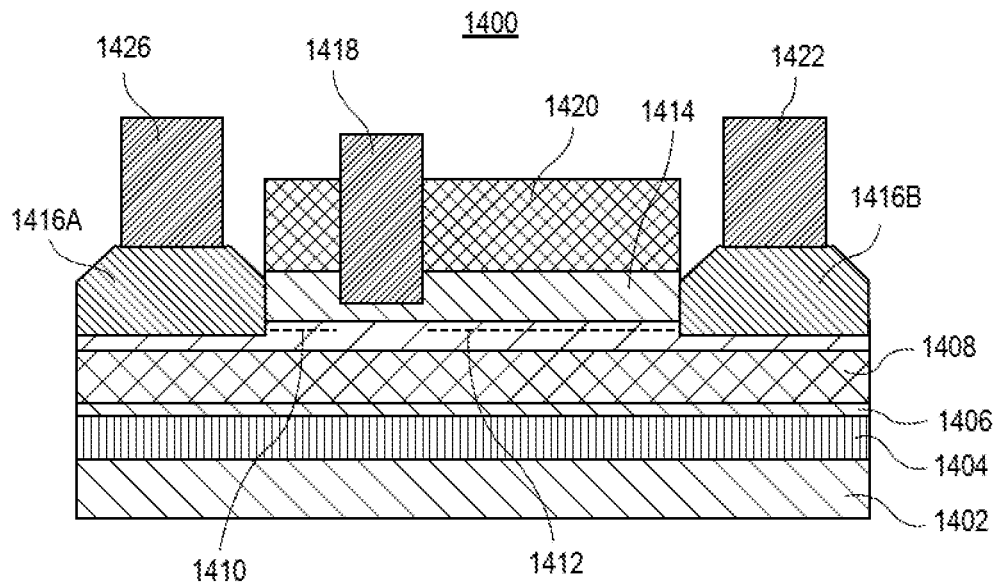
FIG. 14A illustrates a cross-sectional view of a GaN-on-insulator integrated circuit structure, in accordance with an embodiment of the present disclosure.
Figure 14B:
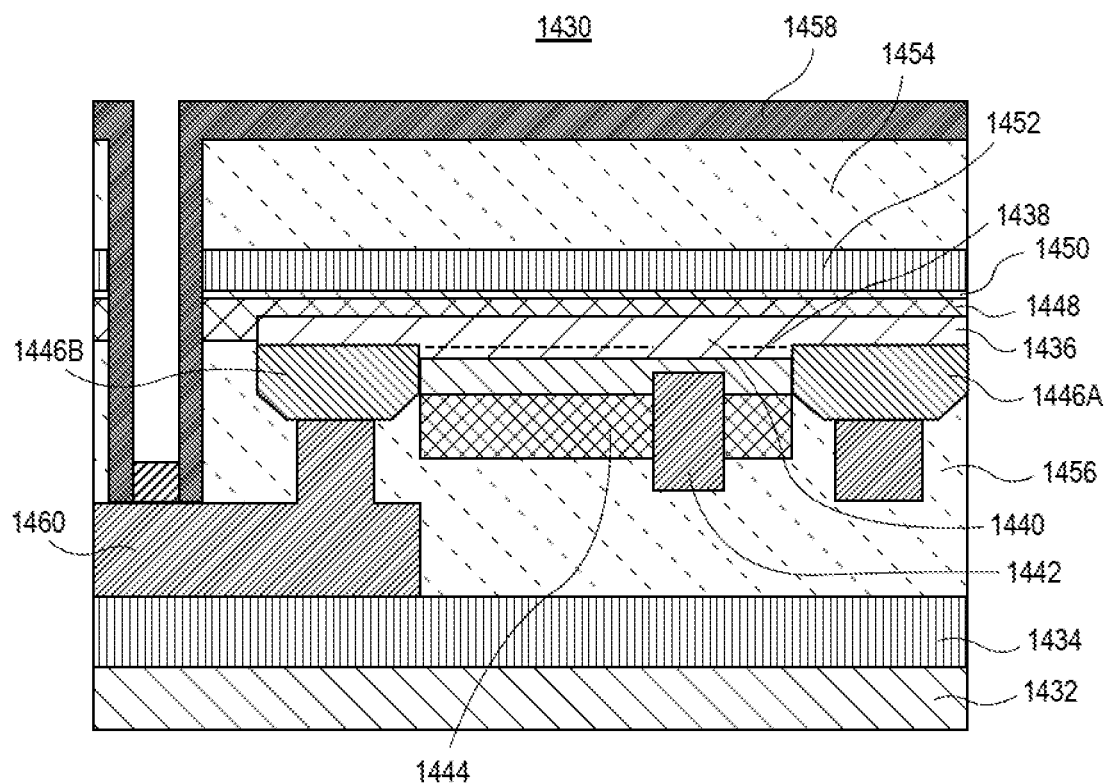
FIG. 14B illustrates a cross-sectional view of a GaN-on-insulator integrated circuit structure including a TSV structure and ground plane, in accordance with an embodiment of the present disclosure.
Figure 14C:
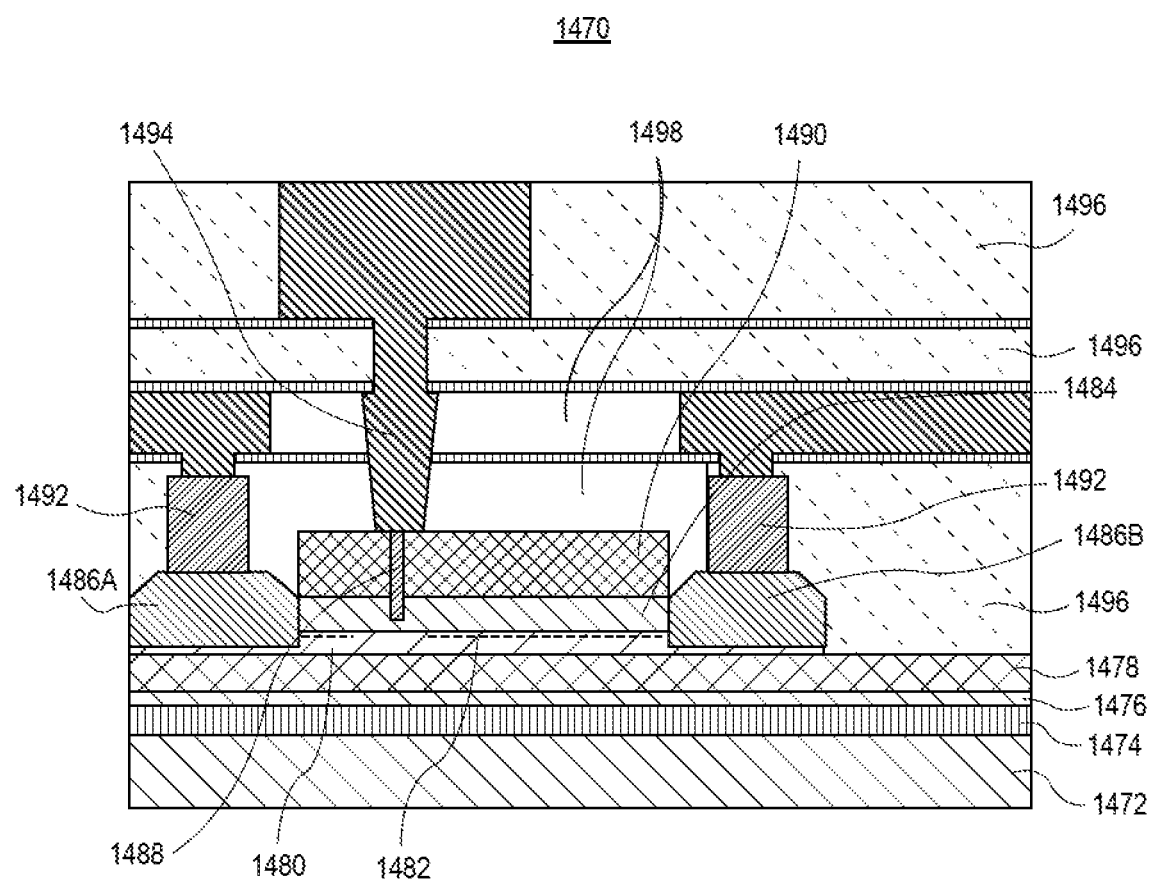
FIG. 14C illustrates a cross-sectional view of a GaN-on-insulator integrated circuit structure including air gaps and a high aspect ratio (super) copper (Cu) T-shaped gate, in accordance with an embodiment of the present disclosure.

In accordance with one or more embodiments, in the GaN on insulator substrate, a layer of trap rich layer (e.g., poly AlN, poly Si etc.) can be introduced in between an $SiO_2$ bonding oxide (BOX) and the Si substrate for further isolation from the substrate. As various examples, FIG. 14A illustrates a cross-sectional view of a GaN-on-insulator integrated circuit structure, in accordance with an embodiment of the present disclosure. FIG. 14B illustrates a cross-sectional view of a GaN-on-insulator integrated circuit structure including a TSV structure and ground plane, in accordance with an embodiment of the present disclosure. FIG. 14C illustrates a cross-sectional view of a GaN-on-insulator integrated circuit structure including air gaps and a high aspect ratio (super) copper (Cu) T-shaped gate, in accordance with an embodiment of the present disclosure.

Referring to FIG. 14A, an integrated circuit structure 1400 includes a buried oxide layer 1404, such as a silicon oxide layer, on a substrate 1402, such as a silicon (111) substrate. An optional additional Si (111) layer 1406 may be included on the buried oxide layer 1404, as is depicted. A back barrier layer 1408, such as an AlGaN layer (e.g., $Al_{0.05}Ga_{0.95}N$), is on the buried oxide layer 1404 or on the optional additional Si (111) layer 1406, if included. A GaN layer 1410, which can include 2DEG regions 1412, is on the back barrier layer 1408. A polarization layer 1414, such as a layer of aluminum indium nitride (AlInN), aluminum indium gallium nitride (AlInGaN) or indium gallium nitride (InGaN), is on the GaN layer 1410. Source or drain structures 1416A and 1416B are on either side of the polarization layer 1414 and on either side of a channel region of the channel GaN layer 1410, and may be recessed into the GaN layer 1410 as is depicted. A dielectric layer 1420, such as a silicon nitride layer, is on the polarization layer 1414. A gate structure 1418, which includes a gate electrode and gate dielectric layer, is within a trench in the dielectric layer 1420. The gate structure 1418 is on, or within, or through, the polarization layer 1414. Source or drain contacts 1422 extend from a top of integrated circuit structure 1400. A gate contact can also be formed in a trench from a top of integrated circuit structure 1400 at a location into or out of the page from the perspective shown in FIG. 14A.

Referring to FIG. 14B, an integrated circuit structure 1430 includes a buried oxide layer 1452, such as a silicon oxide layer, beneath a dielectric layer 1454, such as a low-k dielectric layer. An optional Si (111) layer 1450 may be included beneath the buried oxide layer 1452, as is depicted. A back barrier layer 1448, such as an AlGaN layer (e.g., $Al_{0.05}Ga_{0.95}N$), is beneath the buried oxide layer 1452 or beneath the optional Si (111) layer 1450, if included. A GaN layer 1436, which can include 2DEG regions 1438, is beneath the back barrier layer 1448. A polarization layer 1440, such as a layer of aluminum gallium nitride (AlGaN), aluminum indium nitride (AlInN), aluminum indium gallium nitride (AlInGaN) or indium gallium nitride (InGaN), is beneath the GaN layer 1436. Source or drain structures 1446A and 1446B are on either side of the polarization layer 1440 and on either side of a channel region of the channel GaN layer 1436, and may be recessed into the GaN layer 1436 as is depicted. A dielectric layer 1444, such as a silicon nitride layer, is beneath the polarization layer 1440. A gate structure 1442, which includes a gate electrode and gate dielectric layer, is within a trench in the dielectric layer 1444. The gate structure 1442 is beneath, or within, or through, the polarization layer 1440. Source or drain contacts extend at least partially through a dielectric layer 1456, such as a low-k dielectric layer. A gate contact can also be formed at a location into or out of the page from the perspective shown in FIG. 14B. One of the source or drain contacts is coupled to a ground plane 1460. A through structure via (TSV) is formed to contact the ground plane 1460.

Referring to FIG. 14C, an integrated circuit structure 1470 includes a buried oxide layer 1474, such as a silicon oxide layer, on a substrate 1472, such as a silicon (111) substrate. An optional additional Si (111) layer 1476 may be included on the buried oxide layer 1474, as is depicted. A back barrier layer 1478, such as an AlGaN layer (e.g., $Al_{0.05}Ga_{0.95}N$), is on the buried oxide layer 1474 or on the optional additional Si (111) layer 1476, if included. A GaN layer 1480, which can include 2DEG regions 1482, is on the back barrier layer 1478. A polarization layer 1484, such as a layer of aluminum gallium nitride (AlGaN), aluminum indium nitride (AlInN), aluminum indium gallium nitride (AlInGaN) or indium gallium nitride (InGaN), is on the GaN layer 1480. Source or drain structures 1486A and 1486B are on either side of the polarization layer 1484 and on either side of a channel region of the channel GaN layer 1480, and may be recessed into the GaN layer 1480 as is depicted. A dielectric layer 1490, such as a silicon nitride layer, is on the polarization layer 1484. A gate structure 1488, which includes a gate electrode and gate dielectric layer, is within a trench in the dielectric layer 1490. The gate structure 1488 is on, or within, or through, the polarization layer 1484. Source or drain contacts 1492 extend from a top of integrated circuit structure 1470. A gate contact can also be formed in a trench from a top of integrated circuit structure 1470 at a location into or out of the page from the perspective shown in FIG.

14C. A high aspect ratio (super) copper (Cu) T-shaped gate contact 1494 is coupled to gate structure 1488. Air gap structures 1498 and dielectric layers 1496 (such as low-k dielectric layers) are included above the gate and channel structure.

It is to be appreciated that, whether fabricated on bulk substrates or on insulator substrates, other functional devices may be fabricated along with transistor devices. In an example, embodiments of the present disclosure relate to semiconductor integrated circuits and more particularly to group III-V semiconductor fuses and their methods of fabrication.

In embodiments, a fuse includes a III-V semiconductor layer, such as gallium nitride (GaN), formed over a substrate, such as a silicon monocrystalline substrate. An oxide layer is located in a trench in the III-V semiconductor layer. The fuse further includes a first contact located on the III-V semiconductor layer on a first side of the trench and a second contact located on the III-V semiconductor layer on a second side of the trench, wherein the first side of the trench is opposite to the second side of the trench. In an embodiment, the first and second contacts are formed from a III-V semiconductor, such as indium, gallium and nitrogen (InGaN). In an embodiment, the first and second contacts are formed of a III-V semiconductor which is different than the III-V semiconductor layer in which the trench is formed. In an embodiment, the first and second contacts are single crystalline. A filament is disposed above the oxide layer in the trench and is in contact with the first and second contacts. In an embodiment, the filament is an III-V semiconductor and has a polycrystalline structure. In an embodiment, the first and second contact and the filament are N+ doped.

A III-V semiconductor fuse is not based on thermally accelerated metal electromigration and, as such may not require very thin and narrow metal interconnects as necessary with conventional metal fuses. In embodiments of the present disclosure, the fuse may be used as a programmable, read only memory to burn in calibration data, such as bias offsets, bias temperature compensation, and/or temperature sensor offsets. The fuse may also be used to store manufacturing identification (ID) information.

In embodiments of the present disclosure, the fuse may be fabricated alongside and simultaneous with a III-V semiconductor transistor, such as a GaN transistor, formed on the III-V layer disposed over the substrate. In an embodiment, a source/drain regrowth module used to form source and drain regions for a III-V transistor is also used to create the first contact, the second contact and the filament of the III-V fuse. In an embodiment, a patterned polycrystalline film used to form a sacrificial gate electrode for the III-V transistor is also used to form a seeding material for the filament of the III-V semiconductor fuse. In an embodiment of the present disclosure, the state of the fuse or the states of a plurality of fuses is/are used to control or determine the bias voltage applied to the III-V transistor.

Figure 15A:
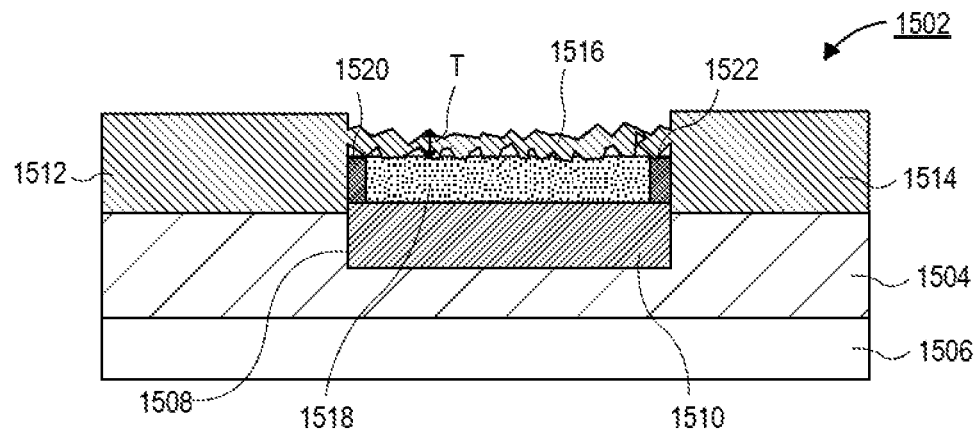
FIG. 15A and FIG. 15B illustrate a III-V fuse in accordance with an embodiment of the present disclosure.
Figure 15B:
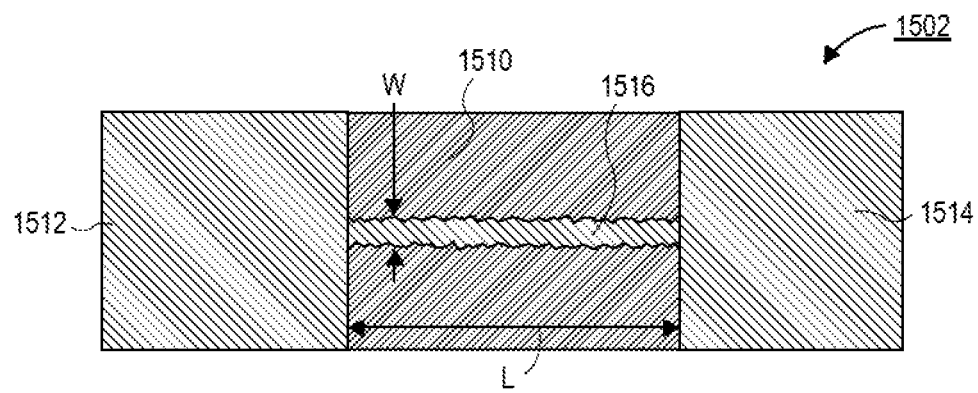

FIG. 15A and FIG. 15B illustrate a III-V fuse 1502 in accordance with an embodiment of the present disclosure. FIG. 15A is a cross-sectional view of fuse 1502 while FIG. 15B is an overhead view of fuse 1502. In an embodiment, fuse 1502 is disposed over a group III-V semiconductor layer on a substrate 1506, such as a monocrystalline silicon substrate. In an embodiment, group III-V semiconductor layer 1504 is a group III nitride semiconductor and in a specific embodiment may be GaN. A trench 1508 is formed in III-V semiconductor layer 1504. An oxide layer 1510 is disposed in the trench 1508. A first contact 1512 is located on a first side of trench 1508 and a second contact 1514 is located on a second side of trench 1508 wherein the second side is opposite the first side. The first contact 1512 and the second contact 1514 are a III-V semiconductor, such as indium gallium nitride ($In_xGa_{1-x}N$, 0<x<1). In an embodiment, first contact 1512 and the second contact 1514 are a different group III-V semiconductor than the group III-V semiconductor layer 1504. In an embodiment of the present disclosure, the first contact 1512 and second contact 1514 are formed from indium gallium nitride (InGaN) semiconductor, and the group III-V semiconductor of layer 1504 is a gallium nitride (GaN) layer. In an embodiment of the present disclosure, first contact 1512 and second contact 1514 have a single crystalline or near single crystalline structure. In an embodiment of the present disclosure, first contact 1512 and second contact 1514 are formed in recesses disposed in the group III-V semiconductor layer 1504 so that the bottom of first contact 1512 and second contact 1514 are beneath the top surface of oxide layer 1510.

A filament 1516 is disposed above oxide layer 1510 in trench 1508 and is in direct electrical and physical contact with first contact 1512 and second contact 1514. Oxide layer 1510 isolates filament 1516 from III-V semiconductor layer 1504. Filament layer 1516 has a length (L), a width (W), and a thickness (T) as illustrated in FIGS. 15A and 15B. In an embodiment, filament 1516 is a group III-V semiconductor, such as indium, gallium nitride ($In_xGa_{1-x}N$ 0<x<1). In an embodiment, the filament 1516 has a polycrystalline grain structure. In an embodiment, first contact 1512, second contact 1514, and filament 1516 each have an N+ conductivity, e.g., greater than 1E18 atoms/cm$^3$. In an embodiment, filament 1516 is a same material as the first contact 1512 and second contact 1514. In another embodiment, filament 1516 is a different material than the first contact 1512 and second contact 1514.

In an embodiment, fuse 1502 includes a seed layer 1518 located between filament layer 1516 and oxide layer 1510. Filament 1516 may be disposed directly on seed layer 1518 and seed layer 1518 may be disposed directly on oxide layer 1510. In an embodiment, seed layer 1518 is a polycrystalline film, such as but not limited polycrystalline silicon or polycrystalline silicon germanium. In an embodiment, seed layer 1518 is undoped or only lightly doped. In an embodiment, fuse 1502 includes a first insulating sidewall spacer 1520 located between a first side of seed layer 1518 and first contact 1512 and a second insulating sidewall spacer 1522 located between a second side of seed layer 1518 and second contact 1514 as illustrated in FIG. 15A. Sidewall spacers 1520 and 1522 isolate seed layer 1518 from first contact 1512 and second contact 1514, respectively. Insulating sidewall spacers 1520 and 1522 may be formed from an insulating material, such as but not limited to silicon oxide, silicon oxynitride, and silicon nitride.

In an alternative embodiment, filament 1516 is formed directly on oxide layer 1516. In such an embodiment, a groove or a trench patterned in oxide layer 1516 may act as a seeding structure for filament 1516.

Figure 15C:
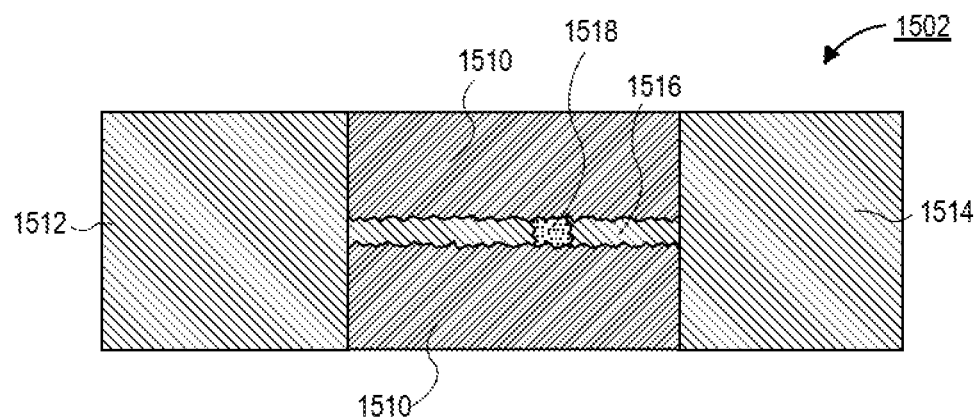
FIG. 15C illustrates a fuse which is in an open state or a "blown" state in accordance with an embodiment of the present disclosure.

Fuse 1502 has two states, a first low resistive state and a second open or highly resistive state. The low resistive state is shown in FIGS. 15A and 15B where filament 1516 is continuous and unbroken between first contact 1512 and second contact 1514. The resistive value of fuse 1502 in the low resistive state is largely determined by the width, thickness, and length of filament 1516. Fuse 1502 has a second state which is an open state or a "blown" state wherein the fuse has a void or opening formed completely through filament 1516 as illustrated in FIG. 15C so that current does not flow through the filament 1516 between first contact 1512 and second contact 1514 when a voltage is placed between first contact 1512 and second contact 1514. Fuse 1502 can be programmed from a low resistive state to an open state or a "blown" by applying a sufficiently large current or voltage between first contact 1512 and second contact 1514 so that filament 1516 is blown.

In an embodiment, substrate 1506 includes a plurality of fuses 1502, such as several hundred fuses 1502, to provide a non-programmable memory to store information, such as but not limited to calibration information, bias offset information and manufacturing identification information for circuits fabricated on substrate 1502.

FIGS. 16A-16H illustrate cross-sectional views of a method of fabricating a III-V semiconductor fuse and a III-V semiconductor transistor in accordance with embodiments of the present disclosure. Although embodiments of the disclosure show the fabrication of a III-V semiconductor fuse simultaneously with the fabrication of a III-V transistor, one of ordinary skill of the art will appreciate that the fuse need not be fabricated simultaneously with a transistor and may be fabricated independently.

Figure 16A:
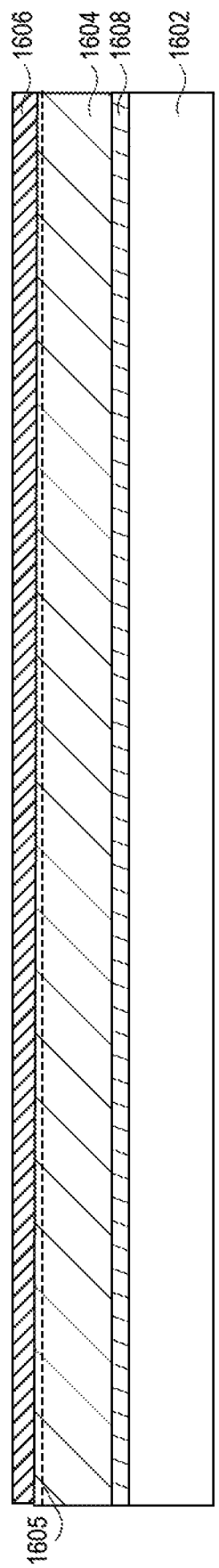
FIGS. 16A-16H illustrate cross-sectional views of a method of fabricating a III-V semiconductor fuse and a III-V semiconductor transistor in accordance with embodiments of the present disclosure, where.

FIG. 16A illustrates a III-V semiconductor layer 1604 formed over a substrate 1602. A polarization layer 1606 may be disposed on the III-V semiconductor layer 1604. Substrate 1602 may be any well-known substrate used in the manufacture of integrated circuits, such as but not limited to a silicon monocrystalline substrate, a silicon carbide substrate and a sapphire substrate. In an embodiment, the III-V semiconductor layer 1604 may be a semiconductor material desired to form a channel of a III-V transistor, such as GaN. III-V semiconductor layer 1604, however, may be other types of III-V semiconductors, such as but not limited to InSb, GaAs, AlGaAs. In an embodiment, a buffer layer 1606 may be formed between substrate 1602 and III-V semiconductor layer 1604. Buffer layer 1606 may contain one or more layers having a lattice constant between the lattice constant of substrate 1602 and III-V semiconductor layer 1604. Polarization layer 1608 is a III-V semiconductor, such as aluminum gallium indium nitride (AlGaInN) which is formed to a sufficient thickness to create a two dimensional electron gas (2-DEG) layer 1605 in the top portion of III-V semiconductor layer 1604. In an embodiment, polarization layer 1608 is deposited on a (0001) plane or c-plane of a GaN layer 1604.

In a specific embodiment, substrate 1602 is a monocrystalline silicon substrate, buffer layer 1608 includes an aluminum nitride layer disposed on the monocrystalline silicon substrate and a graded aluminum gallium nitride layer with a higher aluminum concentration near the aluminum nitride layer, and the III-V layer 1604 is gallium nitride (GaN). Integrated circuits, for example, a system-on-chip (SOC) or a microprocessor, may be formed from nonplanar silicon transistors fabricated on portions of silicon substrate 1602 not covered by the GaN layer 1604. In another embodiment, substrate 1602 is a silicon carbide (SiC) substrate, buffer layer 1608 includes aluminum nitride, and III-V semiconductor layer 1604 is GaN. Polarization layer 1606, buffer layer 1608, III-V semiconductor layer 1604 may be formed by any well-known technique, such as but not limited to chemical vapor deposition (CVD), metal organic chemical vapor deposition (MOCVD), and sputtering.

Figure 16B:
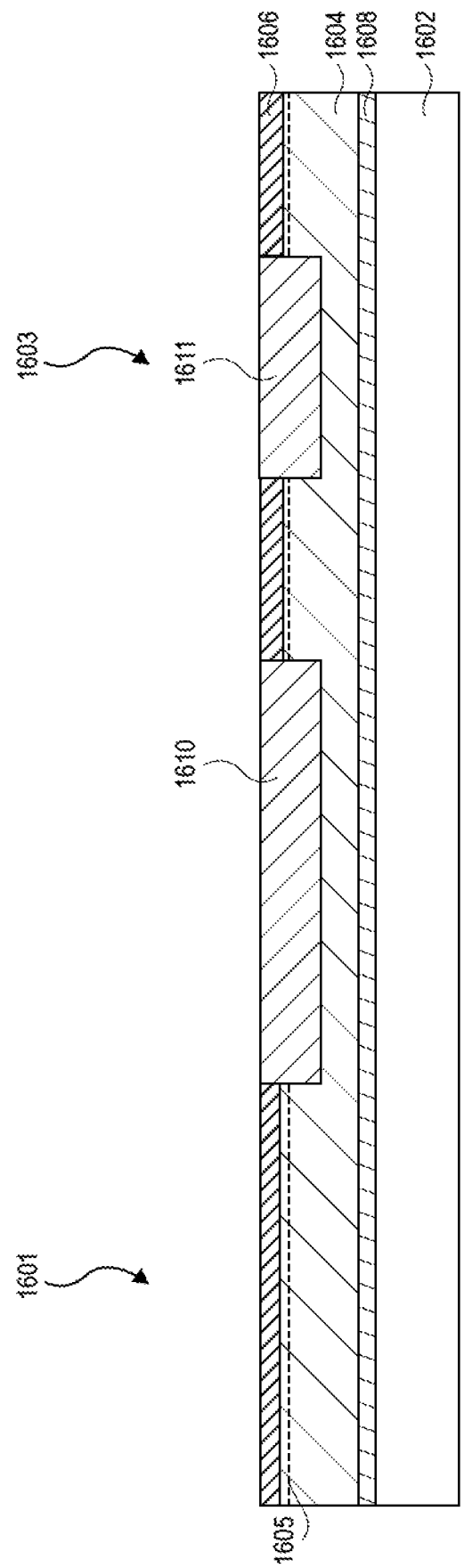

FIG. 16B illustrates the formation of shallow trench isolation (STI) regions 1610 and 1611 in the structure of FIG. 16A. STI region 1610 separates a transistor region 1601 from a fuse region 1603. A shallow trench isolation region 1611 is disposed in fuse region 1603. STI regions 1610 and 1611 may be formed by etching trenches through polarization layer 1606 and into III-V layer 1604 and the blanket depositing an insulating film, such as silicon oxide, to fill the trenches. A chemical mechanical polishing (CMP) process may then be used to remove excess insulating material from above polarization layer 1606 so that STI regions 1610 and 1611 are substantially coplanar with the top surface of polarization layer 1606 as shown in FIG. 16B.

Figure 16C:
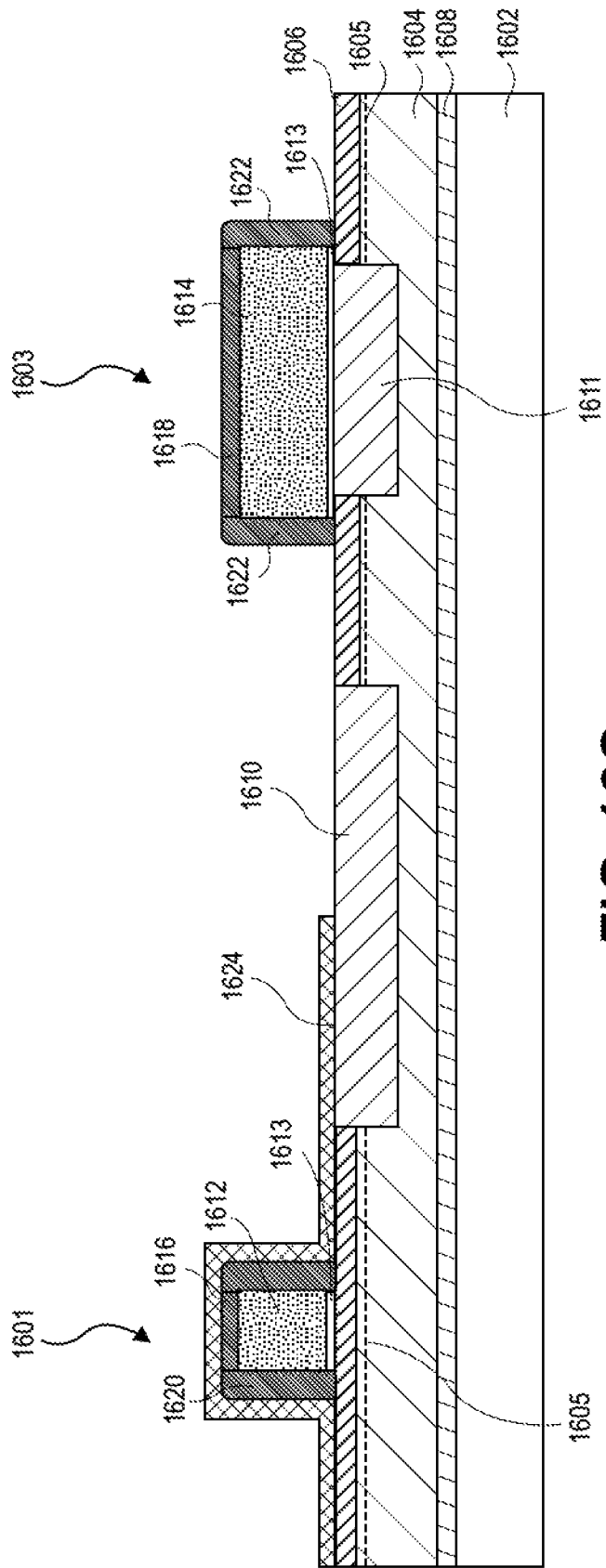

FIG. 16C illustrates the formation of a sacrificial gate 1612 and a seed layer 1614 on the structure of FIG. 16B. Sacrificial gate 1612 is formed over polarization layer 1606 and substrate 1604 in transistor region 1601, and seed layer 1614 is formed over STI region 1611 in fuse region 1603. In an embodiment, seed layer 1614 also extends over the polarization layer 1606 of III-V semiconductor layer 1604 on either side of STI region 1611 as shown in FIG. 16C. A sacrificial gate dielectric 1613, such as silicon dioxide, may be formed beneath sacrificial gate 1612 and seeding layer 1618 as shown in FIG. 16C if desired. A cap 1616 may be formed on the top of sacrificial gate 1612 and a cap 1618 may be formed on the top of seed layer 1614. A pair of insulating sidewall spacers 1620 may be formed along opposite walls of sacrificial gate 1612 and a pair of insulating sidewalls spacers 1622 may be formed along opposite sidewalls of seed layer 1614.

Sacrificial gate 1612/cap 1616 and seed layer 1614/cap 1618 may be formed by first blanket depositing a polycrystalline film, such as but not limited to polycrystalline silicon by, for example, chemical vapor deposition (CVD) or sputtering over the structure of FIG. 16B. A capping layer, such as but not limited to silicon nitride, silicon carbide, or silicon oxynitride may be deposited over the polycrystalline film. The stack of films can then be patterned by well-known techniques, such as lithographic masking and etching, to form sacrificial gate 1612/cap 1616 and seeding layer 1614/cap 1618. It is to be appreciated that when the polycrystalline film is patterned to create seed layer 1614, the patterning generally sets the length (L) and width (W) for the subsequently deposited filament of the fuse. Insulating sidewall spacers 1620 and 1622 may then be formed by blanket depositing an insulating film, such as but not limited to silicon oxide, silicon oxynitride, and silicon nitride over sacrificial gate 1612/cap 1616 and seed layer 1614/cap 1618 and then anisotropically etching the insulating film, as is well-known in the art.

Figure 16D:
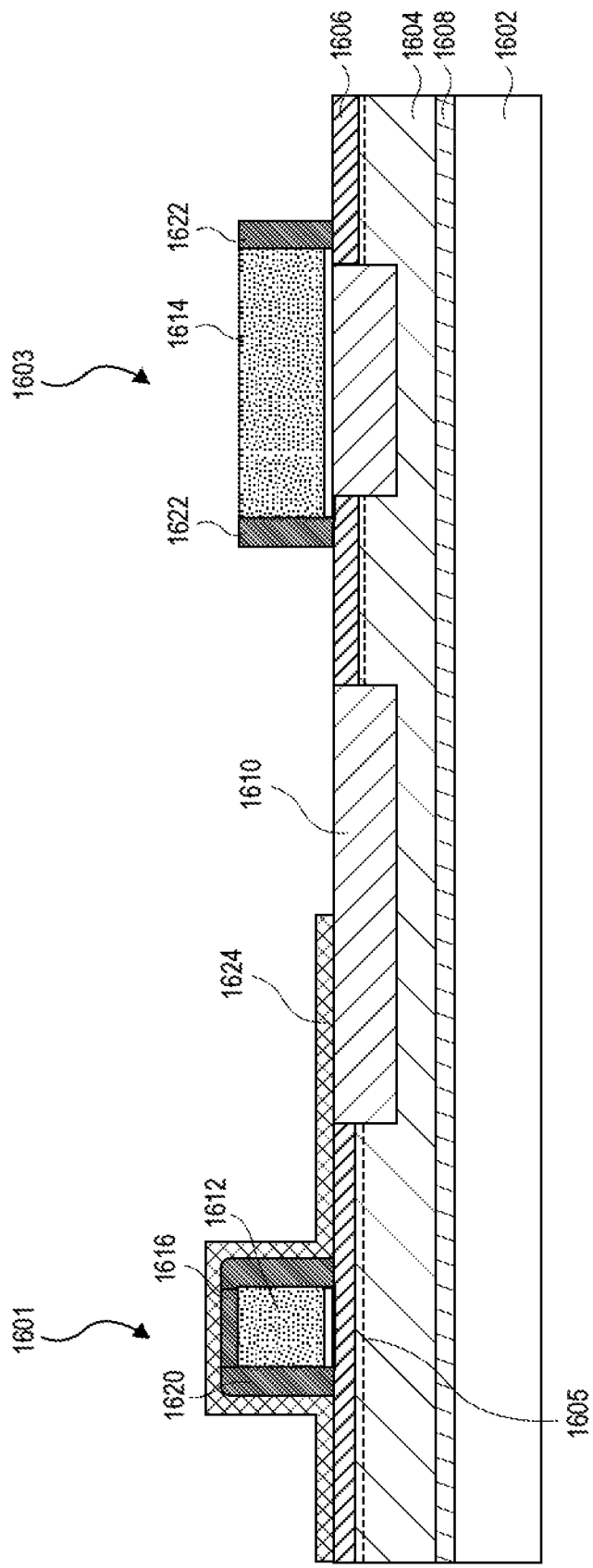

FIG. 16D illustrates the formation of a hard mask 1624 over the structure of FIG. 16C and the removal of cap 1618 from seed layer 1614. Hard mask 1624 is formed over transistor region 1601 of substrate 1602. Hard mask 1624 may be formed by blanket depositing a hard mask material, such as but not limited to silicon dioxide, silicon nitride, and silicon oxynitride over the substrate of FIG. 16C. The hard mask material is then patterned by, for example, lithographic masking and etching, to form hard mask 1624 formed over sacrificial gate 1612/cap 1616 and spacers 1620 and over polarization layer 1606 in transistor region 1601. The hard mask material is removed from over fuse region 1603 as illustrated in FIG. 16D. Next, cap 1618 is removed from seed layer 1614 by, for example, etching. Hard mask 1624 protects capping layer 1616 from etching during the removal of cap 1618. In an embodiment, hard mask 1624 is formed of a material which is not etched, or only slightly etches, when exposed to the etchant used to remove cap 1618.

Figure 16E:
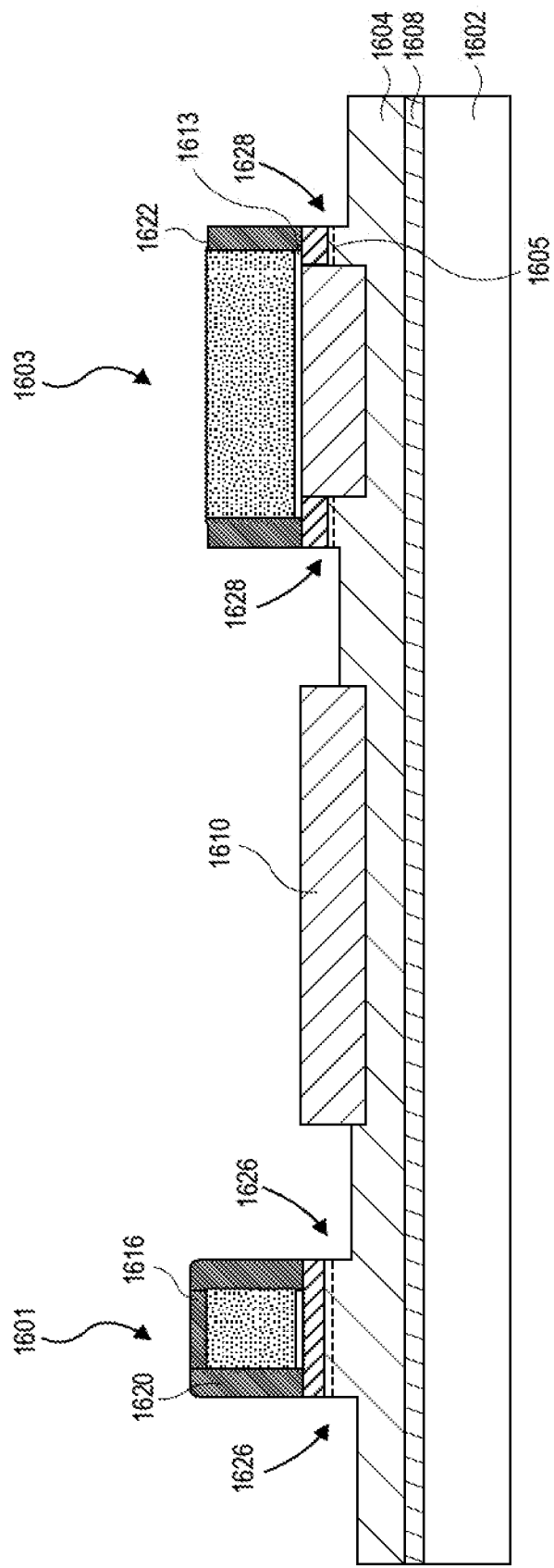

FIG. 16E illustrates the removal of hard mask 1624 and the formation of recesses in the structure of FIG. 16D. In an embodiment, recesses 1626 are formed on opposite sides of sacrificial gate 1626 as illustrated in FIG. 16E. Recesses 1626 are formed through polarization layer 1606 and into III-V semiconductor layer 1604. Recess 1626 may enable a subsequently deposited source/drain material to provide stressing to a channel region of a transistor fabricated in region 1601. Recesses 1626 may be formed by wet etching, dry etching or a combination of wet and dry etching. In an embodiment, the etching process used to form recesses 1626 also forms recesses 1628 on opposite sides of seed layer 1614 as illustrated in FIG. 16E.

Figure 16F:
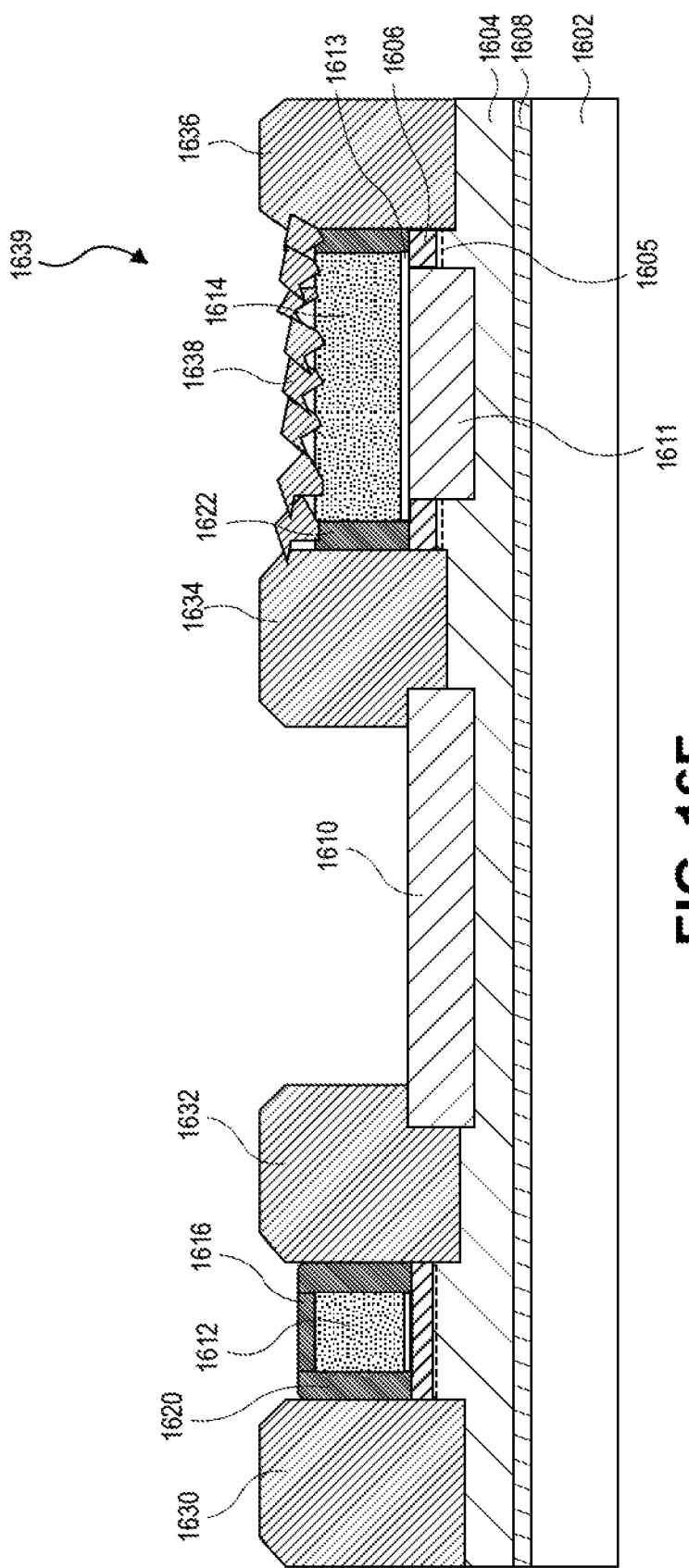

FIG. 16F is a cross-sectional view illustrating the formation of a source region, and drain region, a first contact and a second contact on the structure of FIG. 16E. In an embodiment, a source region 1630 is formed in recess 1626 on a first side a sacrificial gate 1612 and a drain 1632 is formed in recess 1626 on a second side of sacrificial gate 1612 as illustrated in FIG. 16F. Additionally, a first contact 1634 is formed in a recess 1628 on a first side of seed layer 1614 and a second contact 1636 is formed into recess 1628 on a second side of seed layer 1614. In an embodiment, source region 1630, drain region 1632, first contact 1634 and second contact 1636 are formed from a III-V semiconductor, such as indium gallium nitride (InGaN). In an embodiment, source region 1630, drain region 1632, first contact 1634 and second contact 1636 are formed from a III-V semiconductor material which is different from a III-V semiconductor material of III-V semiconductor layer 1604. In an embodiment, the III-V semiconductor material used to form source region 1630, drain region 1632, first contact 1634 and second contact 1636 has a smaller band gap than the semiconductor used to form III-V semiconductor layer 1604. In an embodiment, the source region 1630, drain region 1632, first contact 1634, and second contact 1636 are formed from a single crystalline III-V semiconductor and may be N+ doped with a dopant such as silicon. In an embodiment, a III-V semiconductor material is selectively deposited by, for example, chemical vapor deposition so that the III-V semiconductor material selectively forms on semiconductor regions, such as III-V semiconductor layer 1604 in recesses 1626 and 1628 and on polycrystalline seed layer 1614 but does not form on insulating surfaces, such as STI oxide 1610 and cap 1616. In an embodiment, the deposition process is continued until recesses 1626 and 1628 are completely filled with III-V semiconductor material.

Additionally, in an embodiment of the present disclosure, the deposition process continues until the top surface of source region 1630 and drain region 1632 extend above the surface upon which sacrificial gate 1612 is formed in order to create raised source region 1630 and raised drain region 1632, which may be in situ doped with for example silicon to N+ conductivity. Additionally, in an embodiment, the deposition process continues until a sufficiently thick and continuous polycrystalline III-V semiconductor layer is formed over polycrystalline seed layer 1614 to create a filament 1638. In an embodiment, the deposition process used to form source region 1630, drain region 1632, first contact 1634 and second contact 1636 selectively epitaxially deposits a single crystalline or near single crystalline film. However, because seed layer 1614 is polycrystalline, the deposition process forms a polycrystalline III-V semiconductor film on polycrystalline seed layer 1614 resulting in a polycrystalline filament 1638. Additionally, it is to be appreciated that sidewall spacers 1632 are also formed on the front and back surfaces (in and out of the page) of seed layer 1614 so that the deposition process does not form III-V semiconductor material on the front and back surfaces of seed layer 1614. Lateral overgrowth enables the polycrystalline filament 1638 and a single crystalline film of the first and second contacts to extend over the spacers 1622 so that filament 1638 is electrically and physically connected to first contact 1634 and second contact 1636 as illustrated in FIG. 16F. At this time the process of fabricating a III-V fuse 1639 in accordance with embodiments of the present disclosure is complete. In an embodiment, as shown in FIG. 16F, fuse 1639 includes polarization layer 1606 between first contact 1634 and STI oxide 1611 and between second contact 1636 and STI oxide 1611. The polarization layer may create a 2DEG layer 1605 in top surface of III-V layer 1604.

Figure 16G:
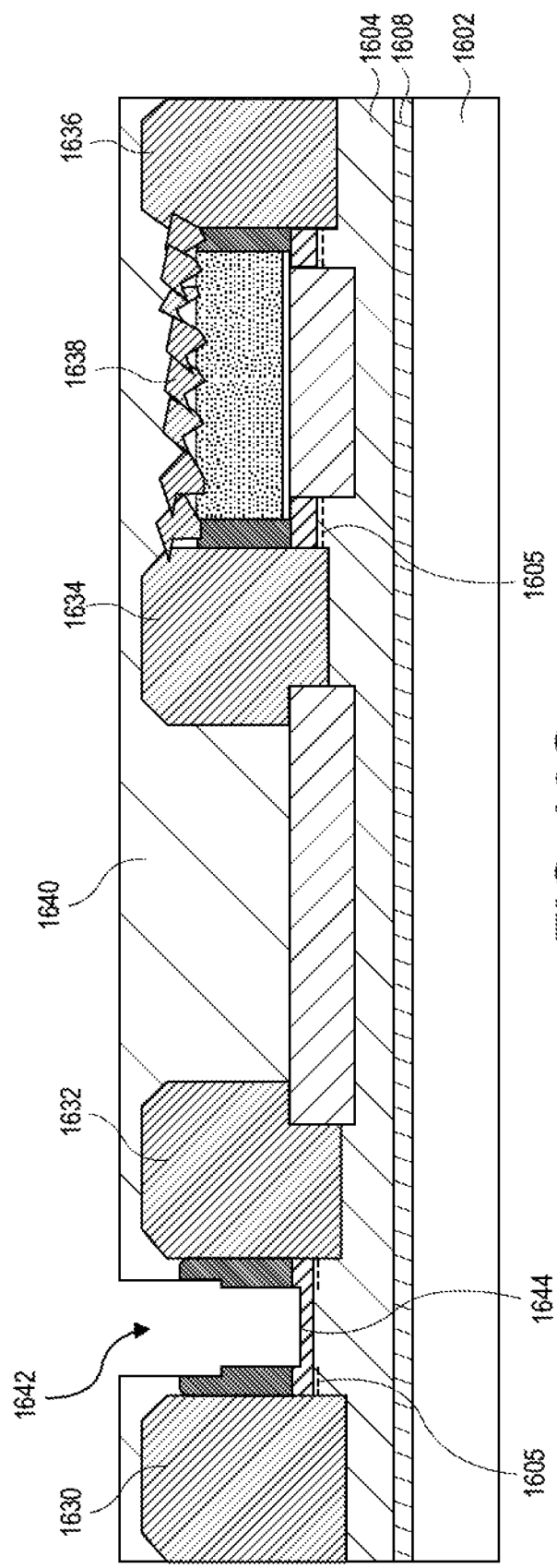

FIG. 16G illustrates the formation of an interlayer dielectric over the structure of FIG. 16F and the removal of cap 1616 and sacrificial gate structure 1612 from the structure of FIG. 16F. In an embodiment, an interlayer dielectric layer is first blanket deposited over the structure of FIG. 16F. The interlayer dielectric may be deposited by any well-known technique, such as for example, chemical vapor deposition or plasma enhanced chemical vapor deposition. In an embodiment, the interlayer dielectric is an oxide, such as but not limited to, silicon oxide, and carbon doped silicon oxide. The ILD is deposited to a thickness sufficiently to cover source region 1630, drain region 1632, first contact 1634, second contact 1636 and filament 1638. The ILD layer may then be chemically mechanically polished in order to create a planar top surface as illustrated in FIG. 16G. Next, the interlayer dielectric 1640 may be patterned to create an opening 1642 above cap 1616 and sacrificial gate 1612. Cap 1616 and sacrificial gate 1612 may then be removed by, for example, etching as illustrated in FIG. 16G. In an embodiment, the polarization layer 1606 in the opening 1642 is then partially etched to create a recessed polarization layer 1644 such that the 2-DEG effect is removed. In another embodiment, the polarization layer 1606 in the opening 1642 is completely removed to expose the III-V material layer 1604.

Figure 16H:
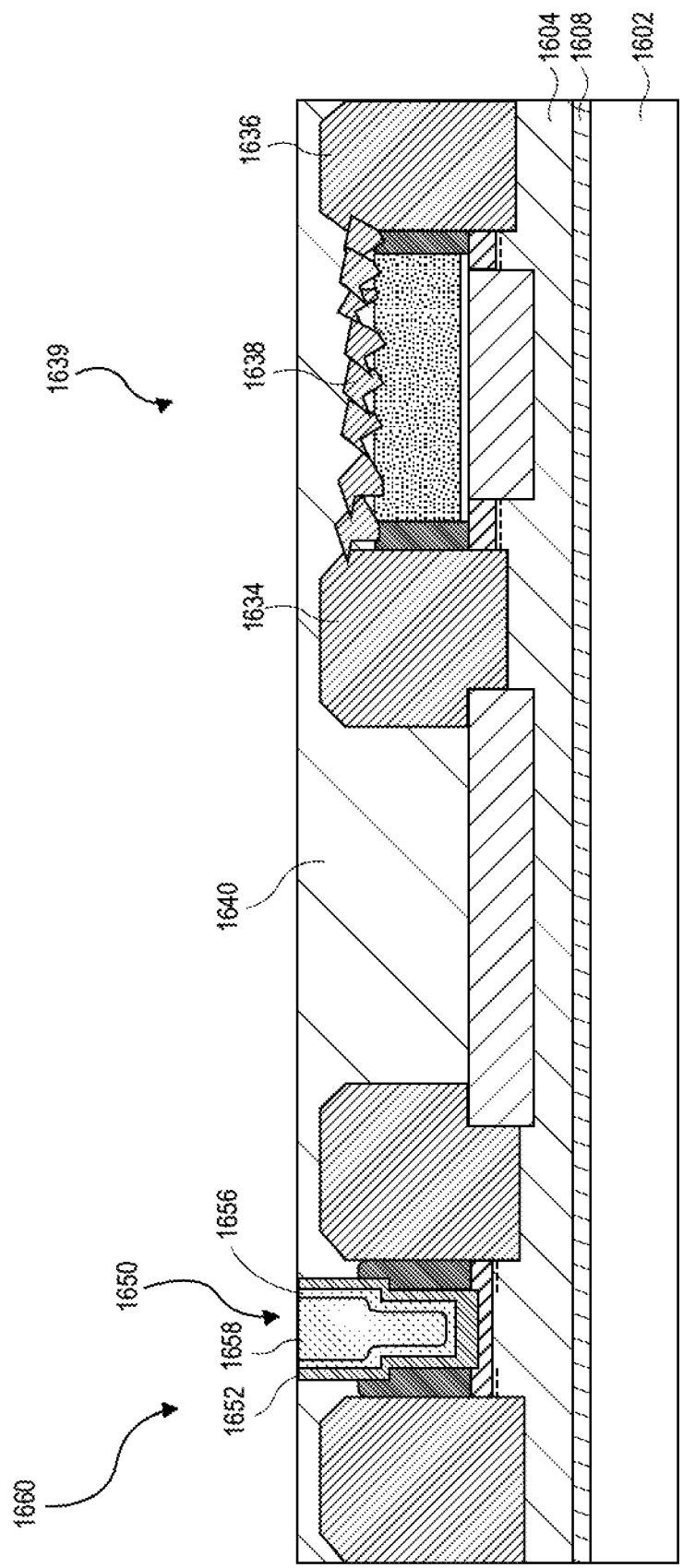

FIG. 16H illustrates the formation of a gate on the structure of FIG. 16G. In an embodiment of the present disclosure, the gate stack 1650 is disposed in opening 1642. In an embodiment of the present disclosure, gate stack 1650 includes a high-k gate dielectric 1652 disposed on recessed polarization layer 1644 or on III-V semiconductor layer 1604 if polarization layer is completely removed during etching. Gate stack 1650 includes a metal gate 1654. In an embodiment, metal gate 1654 includes a work function layer or layers 1656 and a fill layer 1658. At the time the process of fabricating a III-V transistor 1660 in accordance with embodiments of the present disclosure is not complete. It is to be appreciated that fuse 1639 has been fabricated along side III-V transistor 1660 while adding only one additional masking operation.

In an alternative embodiment, the polycrystalline film used to form sacrificial gate 1612 is completely removed from the fuse region 1603 during the processing of FIG. 16D so that seed layer 1614 is not formed in STI oxide layer 1611. During the formation of STI oxide 1611 in FIG. 16B, a groove may develop in oxide 1611 between the first contact 1634 and the second contact 1636. The groove may act as a seed structure to create filament 1638 during deposition of first contact 1634 and second contact 1636. In this way, filament 1638 may be deposited directly on STI oxide 1611. Alternatively, a trench may be patterned in oxide 1611 to provide a seeding structure for filament 1638.

In a fourth aspect, GaN three-dimensional (3D) integrated circuit (IC) device integration methods, modules and toolkits are described.

One or more embodiments described herein involve integrating multiple dissimilar technologies monolithically to bring together best-in-class performance, yet customizable and flexible technologies to meet customer/product demands. Process solutions are implemented to answer how to bring the most cost effective solution to the market with the quickest time-to-market.

In accordance with an embodiment of the present disclosure, three-dimensional (3D) layer transfer and integration is used to monolithically integrate dissimilar process technologies on a single platform. For example, a CMOS compute platform can be enhanced with GaN technologies for efficient power delivery and RF communication. RF frontend solutions can be built to demand and different cost points as specified by customers. This platform can even be extended to build solutions in the display market (microLED) to grow new market opportunities. The solution comes in the form of a toolkit for designers to build products that can be rapidly prototyped, tested and manufactured to enable the quickest time-to-market in a most cost effective manner.

Figure 17:
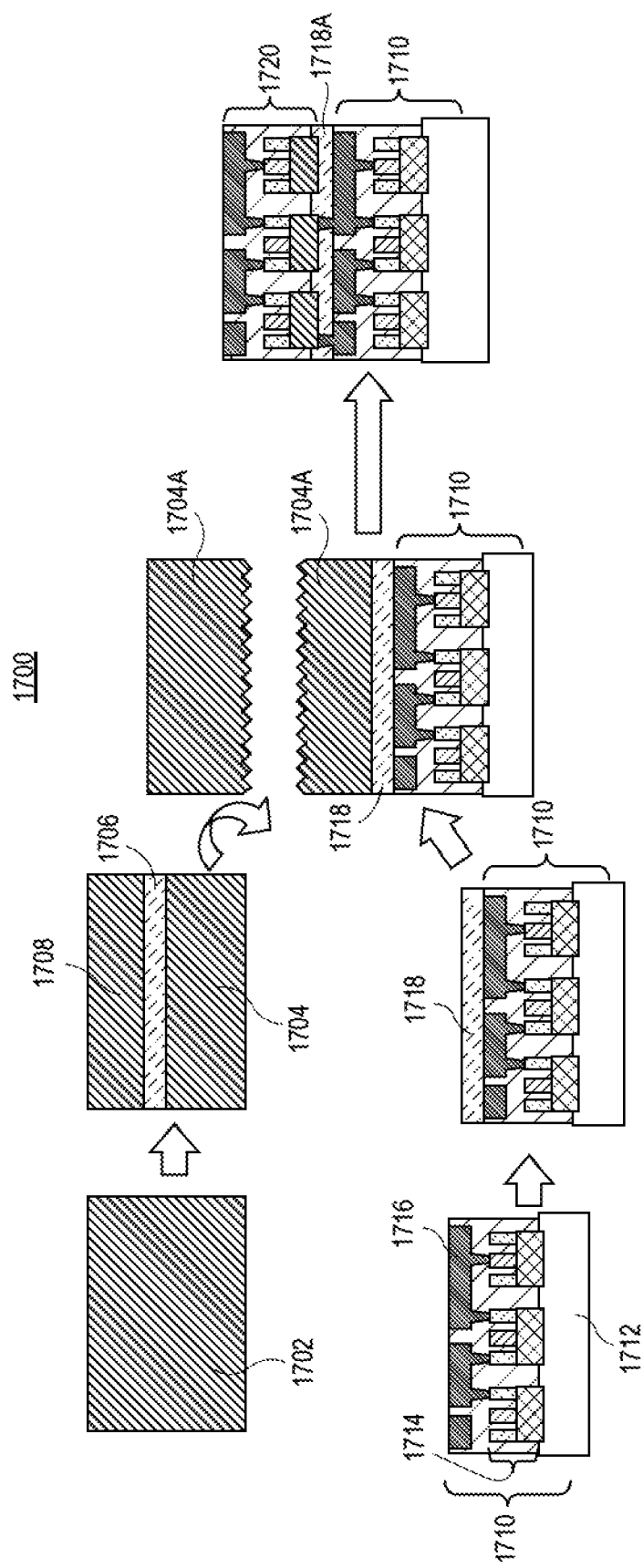
FIG. 17 illustrates cross-sectional views representing various operations in a process involving monolithic three-dimensional (3D) integration of GaN NMOS and silicon (Si) PMOS, in accordance with an embodiment of the present disclosure.

In an example, FIG. 17 illustrates cross-sectional views representing various operations in a process involving monolithic three-dimensional (3D) integration of GaN NMOS and silicon (Si) CMOS, in accordance with an embodiment of the present disclosure.

Referring to FIG. 17, an integration process 1700 involves a starting silicon (100) substrate 1702. The silicon (100) substrate 1702 is implanted to form a sacrificial portion 1708, a cleave layer 1706, and an active layer 1704. The active layer 1704 is cleaved and inverted to form transferrable active silicon (100) layer 1704A. The integration process 1700 also includes forming a starting GaN NMOS structure 1710. The starting GaN NMOS structure 1710 includes a silicon (111) substrate having GaN-based transistors 1714 and interconnects 1716 thereon. A dielectric layer 1718, such as a silicon oxide layer, is formed on the GaN NMOS structure 1710. The transferrable active silicon (100) layer 1704A is bonded to the silicon oxide layer 1718 on the GaN NMOS structure 1710. A silicon CMOS transistor layer 1720, for example containing either Si PMOS only with complementary GaN NMOS transistor supplied from the bottom structures, or containing both Si PMOS and Si NMOS forming an alternate complementary CMOS solution, is then formed from and on the transferrable active silicon (100) layer 1704A. Coupling interconnects can be formed through silicon oxide layer 1718 to form coupling layer 1718A between, for example, the silicon PMOS transistor layer 1720 and the GaN NMOS structure 1710 to form a 3D-integrated GaN NMOS and silicon (Si) PMOS structure.

Figure 18A:
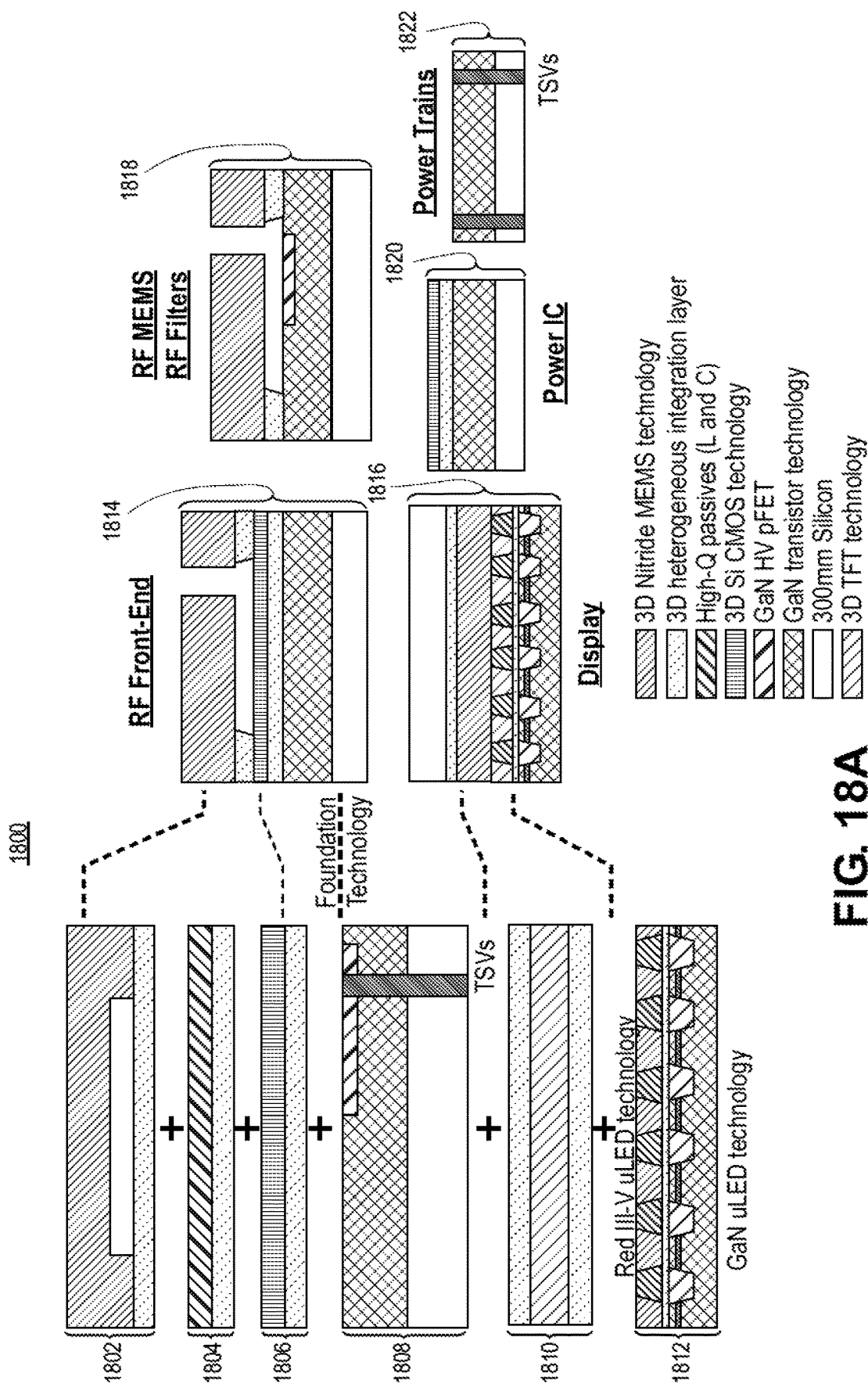
FIGS. 18A and 18B are schematics illustrating GaN 3D IC devices and integration based on 3D best-in-class performance building blocks, in accordance with an embodiment of the present disclosure.
Figure 18B:
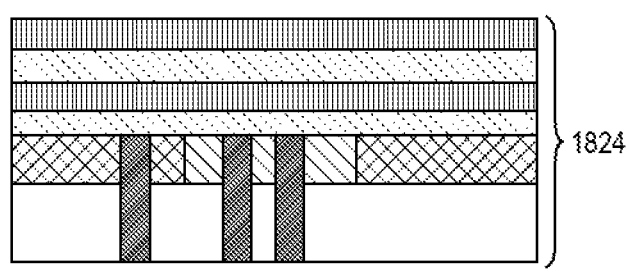
Figure 18B:
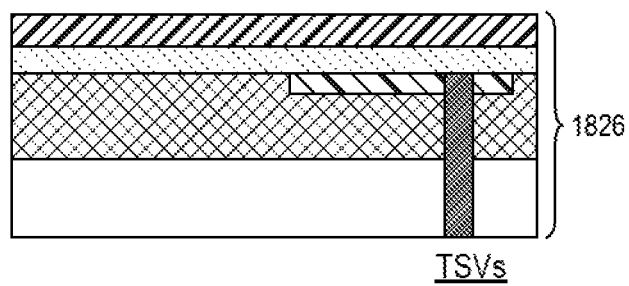

FIGS. 18A and 18B are schematics 1800 illustrating GaN 3D IC devices and integration based on 3D best-in-class performance building blocks, in accordance with an embodiment of the present disclosure.

Referring to FIG. 18A, a variety of technology building blocks is provided on the left-hand side. For example, a technology building block 1802 includes a 3D nitride MEMS technology layer or structure on a 3D heterogeneous integration layer. A technology building block 1804 includes a high-Q passive technology layer or structure (e.g., including inductors, L, and/or capacitors, C) on a 3D heterogeneous integration layer. A technology building block 1806 includes a 3D Si CMOS technology layer or structure on a 3D heterogeneous integration layer. A technology building block 1808 includes a GaN transistor technology layer (which may further include a GaN high voltage (HV) pFET region and TSVs therein) on a silicon layer, such as a 300 mm silicon wafer. A technology building block 1810 includes a first 3D heterogeneous integration layer on a 3D thin film transistor (TFT) technology layer or structure on a second 3D heterogeneous integration layer. A technology building block 1812 includes a red III-V technology layer or structure on a 3D heterogeneous integration layer on a GaN micro LED (uLED) technology layer or structure.

Referring to the structures on the right-hand side of FIG. 18A and the structures of FIG. 18B, combinations of the variety of technology building blocks provided on the left-hand side can be made to provide technology solutions. For example, an RF front-end solution 1814 is fabricated upon combining features of the technology building blocks, e.g., 1802, 1806 and 1808, etc. A display solution 1816 is fabricated upon combining features of the technology building blocks, e.g., 1808, 1810 and 1812, etc. An RF MEMS and/or RF filters solution 1818 is fabricated upon combining features of the technology building blocks, e.g., 1802 and 1808, etc. A power integrated circuit (IC) solution 1820 is fabricated upon combining features of the technology building blocks, e.g., 1806 and 1808, etc. A power train solution 1822 is fabricated upon combining features of the technology building blocks, e.g., 1804 and 1808, etc. A compute solution 1824 is fabricated upon combining features of the technology building blocks, e.g., 1806 and 1808, etc., where an upper 3D Si CMOS technology layer is a memory layer, and a lower 3D Si CMOS technology layer is a logic layer, for example. A compute solution 1826 is fabricated upon combining features of the technology building blocks, e.g., 1804 and 1808, etc.

With reference more generally to FIGS. 18A and 18B, in accordance with one or more embodiments of the present disclosure, a grand summary of building blocks is provided for implementation in a modular approach to building GaN 3D IC solutions in consideration of build-to-demand cost and speed-to-market. Devices of different functionalities (e.g., where each functionality is defined and confined to its functional layer) are provided and built with different process technologies as well as design rules and are integrated using 3D stacking and bonding techniques. Such process technologies can be very dissimilar. Exemplary functional layers may include, but are not limited to, (1) red III-V (InGaAsP) micro-LED or laser technology, (2) GaN blue and green micro-LED or laser technologies, (3) 3D TFT (thin film transistor) technology, (4) GaN transistor technology with N-channel GaN HEMT, MOSHEMT and MOSFET technologies as well as GaN P-channel HEMT, MOSHEMT and MOSFET technologies, (5) 3D Si CMOS technology, (6) high-Q passives including inductors and capacitors, (7) 3D III-nitride MEMS (Micro-electromechanical Systems) technologies including III-nitride (AlN, AlScN) resonator technology such as Film Bulk Acoustic Resonators (FBAR) and BAW (Bulk Acoustic Wave) resonators.

It is to be appreciated that a 3D integration layer can be key to enabling 3D stacking. Functional layers can be any of the layers describe in association with FIGS. 18A and 18B. The functional layers can extend up to as many layers as is practically possible, as demanded by product specifications and dictated by cost. As an example, FIGS. 19A and 19B illustrate cross-sectional views representing various operations in a process involving three-dimensional (3D) stacking, in accordance with an embodiment of the present disclosure.

Figure 19A:
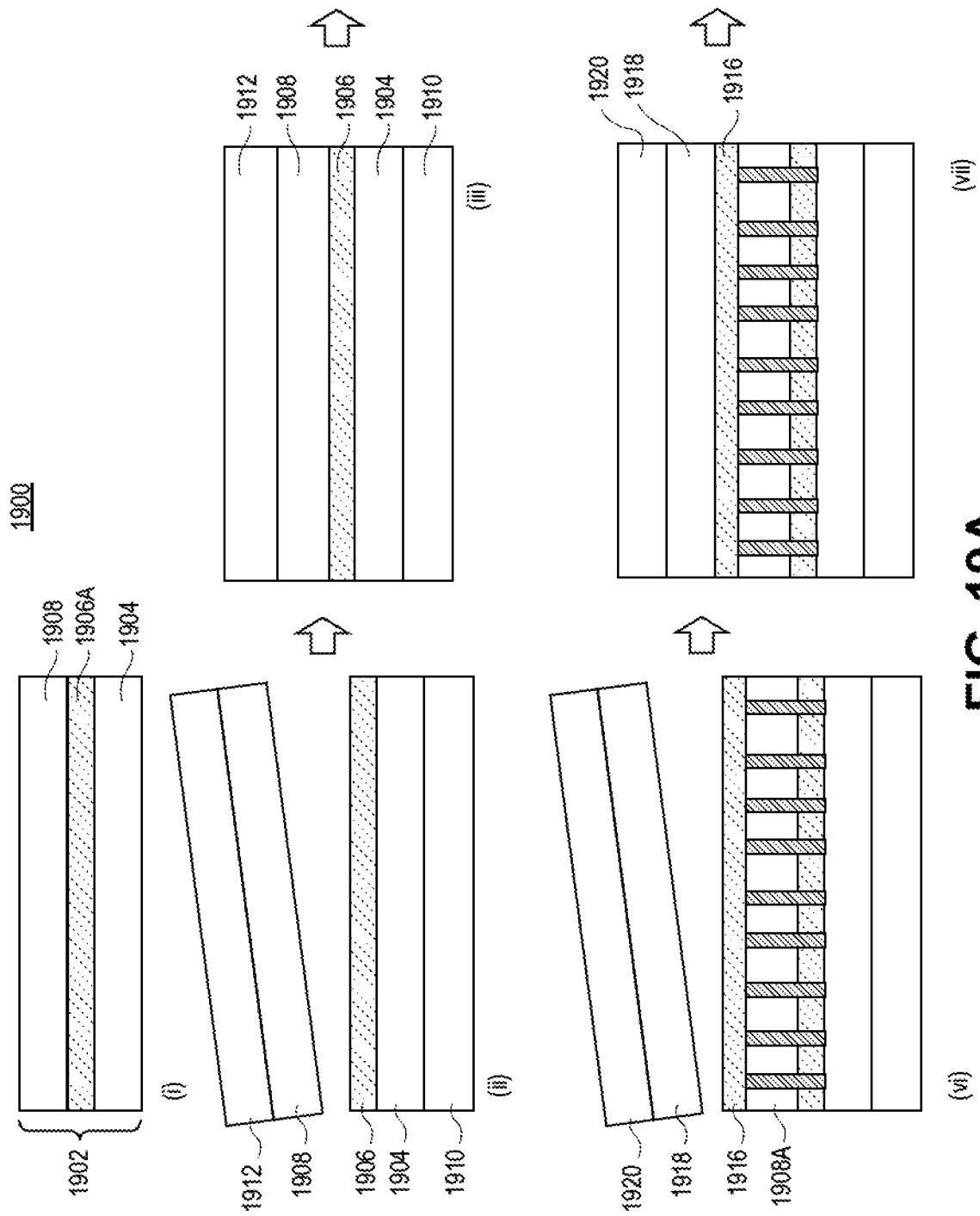
FIGS. 19A and 19B illustrate cross-sectional views representing various operations in a process involving three-dimensional (3D) stacking, in accordance with an embodiment of the present disclosure.

Referring to part (i) of FIG. 19A, a target structure 1902 includes a second functional layer 1908 on a 3D heterogeneous integration layer 1906A on a first functional layer 1904. Referring to part (ii) of FIG. 19A, target structure 1902 can be formed by first coupling a structure having the second functional layer 1908 on a donor wafer 1912 to a structure including a silicon oxide layer 1906 on the first functional layer 1904 on a device wafer 1910 to form a stack shown in part (iii) of FIG. 19A. Referring to part (iv) of FIG. 19B, the donor wafer 1912 is removed. Referring to part (v) of FIG. 19B, interconnects 1914 are then formed to provide interconnect-including second functional layer 1908A and interconnect-including silicon oxide layer 1906A (3D heterogeneous integration layer).

Figure 19B:
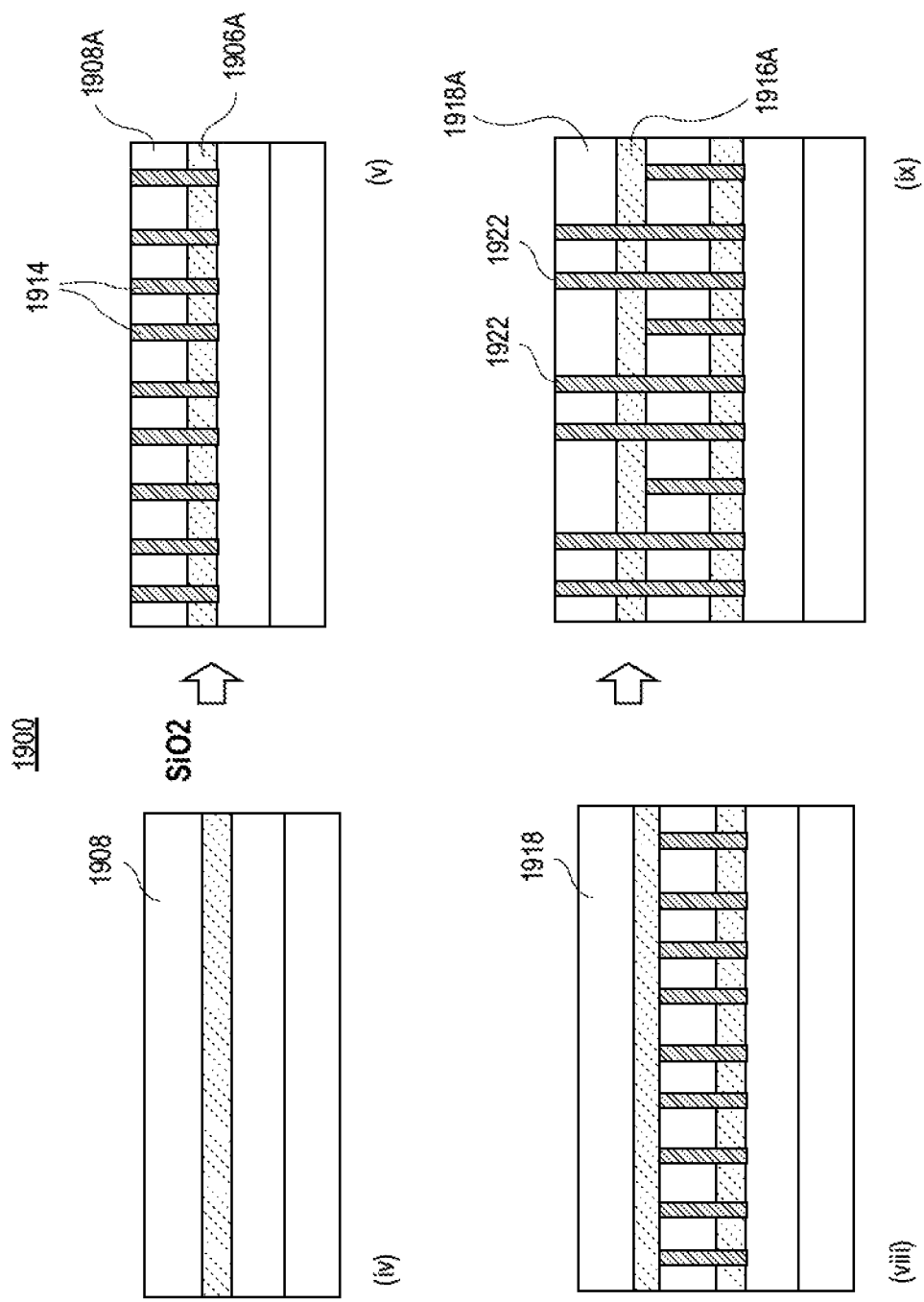

In a further embodiment, referring to part (vi) of FIG. 19A, a structure having a third functional layer 1918 on a donor wafer 1920 to a structure including a silicon oxide layer 1916 on the structure of part (v) of FIG. 19B to form a stack shown in part (vii) of FIG. 19A. Referring to part (viii) of FIG. 19B, the donor wafer 1920 is removed. Referring to part (ix) of FIG. 19B, interconnects 1922 are then formed to provide interconnect-including third functional layer 1918A and interconnect-including silicon oxide layer 1916A (second 3D heterogeneous integration layer).

Figure 20:
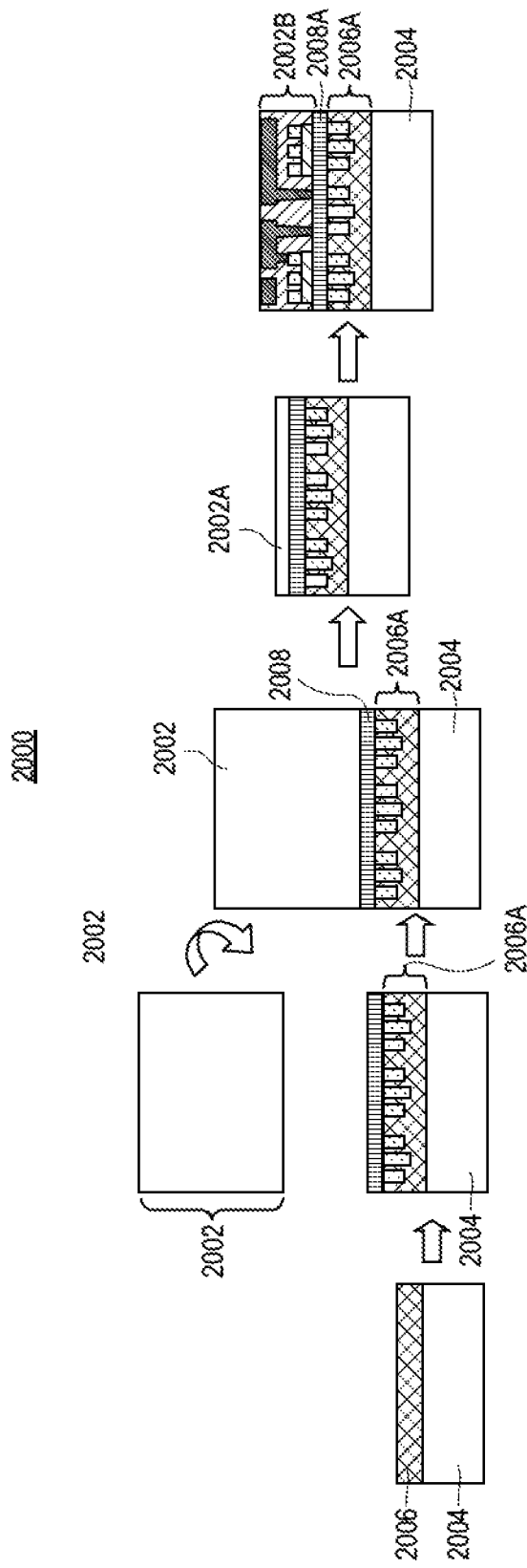
FIG. 20 illustrates cross-sectional views representing various operations in a process involving monolithic heterogeneous integration by three-dimensional (3D) layer transfer, in accordance with an embodiment of the present disclosure.

In another example, FIG. 20 illustrates cross-sectional views representing various operations in a process involving monolithic heterogeneous integration by three-dimensional (3D) layer transfer, in accordance with an embodiment of the present disclosure.

Referring to FIG. 20, an integration process 2000 involves a starting silicon (100) substrate 2002. The integration process 2000 also includes forming a GaN layer 2006 on a silicon (111) substrate 2004. The GaN layer 2006 is patterned and has device layers formed thereon to form a GaN device structure 2006A. A dielectric layer 2008, such as a silicon oxide layer, is formed on the GaN device structure 2006A. The starting silicon (100) substrate 2002 is bonded to the dielectric layer 2008 on the GaN device structure 2006A. The starting silicon (100) substrate 2002 is thinned to form Si (100) layer 2002A. A silicon transistor layer 2002B, such as a Si PMOS or Si NMOS layer, is then formed from and on the thinned to form Si (100) layer 2002A. Coupling interconnects can be formed through dielectric layer 2008 to form coupling layer 2008A between the silicon transistor layer 2002B and the GaN device structure 2006A to form a 3D-integrated GaN and silicon (Si) structure.

Figure 21:
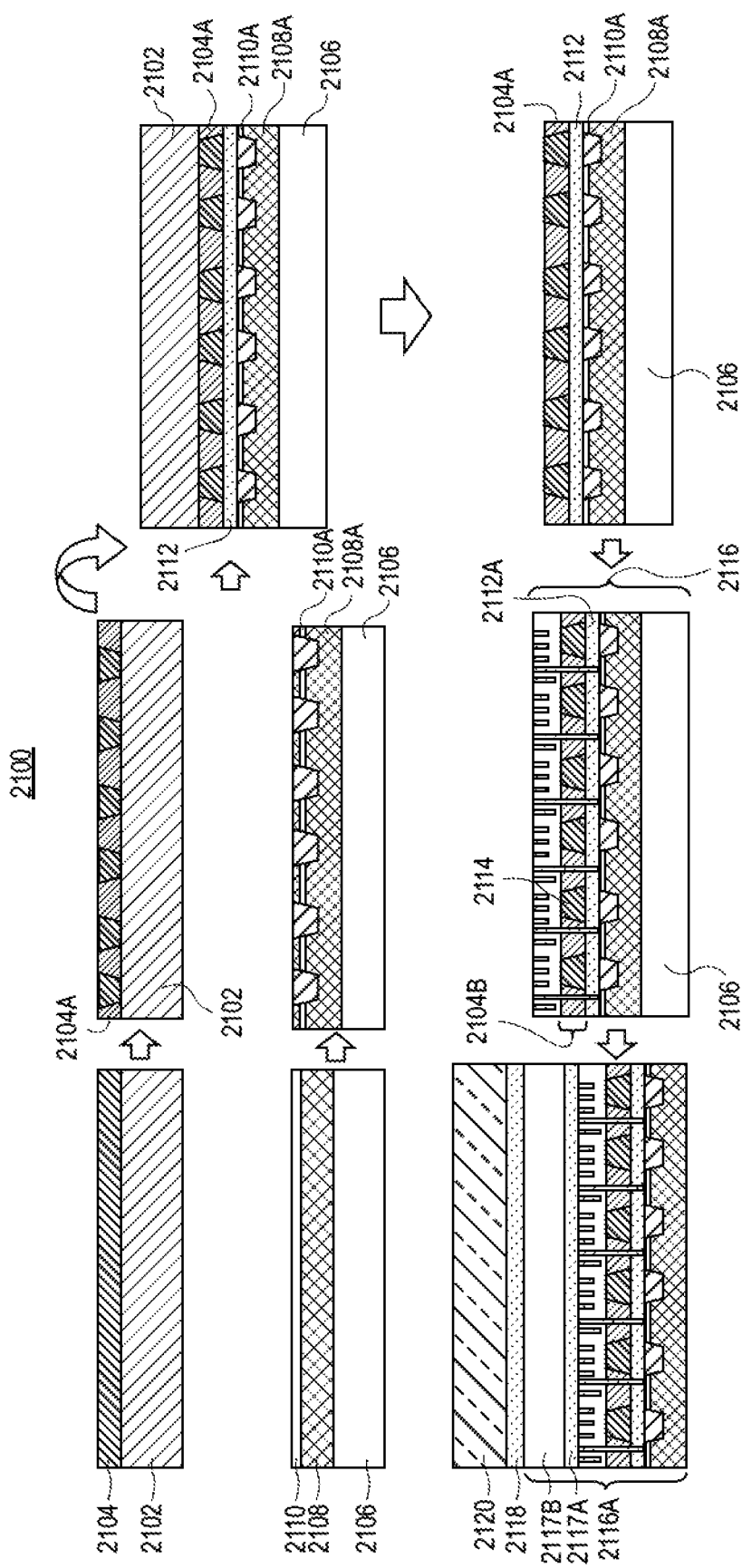
FIG. 21 illustrates cross-sectional views representing various operations in a process involving heterogeneous integration of a light-emitting diode (LED) layer and a thin film transistor (TFT) layer, in accordance with an embodiment of the present disclosure.

In another example, FIG. 21 illustrates cross-sectional views representing various operations in a process involving heterogeneous integration of a light-emitting diode (LED) layer and a thin film transistor (TFT) layer, in accordance with an embodiment of the present disclosure.

Referring to FIG. 21, a first process 2100 involves formation of a red quantum well layer 2104 on a III-V wafer 2102. The red quantum well layer 2104 is patterned to form a patterned red micro-LED layer 2104A. A second process involves formation of a green and/or blue quantum well layer 2110 on a GaN layer 2108 on a Si (111) wafer 2106. The green and/or blue quantum well layer 2110 is patterned to form a patterned green and/or blue micro-LED layer 2110A and a patterned GaN layer 2108A. The structure of the first process is flipped and bonded to a buried oxide layer 2112 on the patterned green and/or blue micro-LED layer 2110A. The III-V wafer 2102 is then removed. A thin film transistor (TFT) layer 2114 is then formed on the patterned red micro-LED layer 2104A. Interconnects are then formed to provide interconnect-including patterned red micro-LED layer 2104B and interconnect-including silicon oxide layer 2104A to form a structure 2116. The structure 2116 has the Si (111) wafer 2106 removed to form structure 2116A, and additional layers can be added, such as a buried oxide layer 2117A, an additional TFT layer 2117B, a buried oxide layer 2118, and/or a glass substrate 2120 to provide a GaN micro-LED technology structure.

Figure 22:
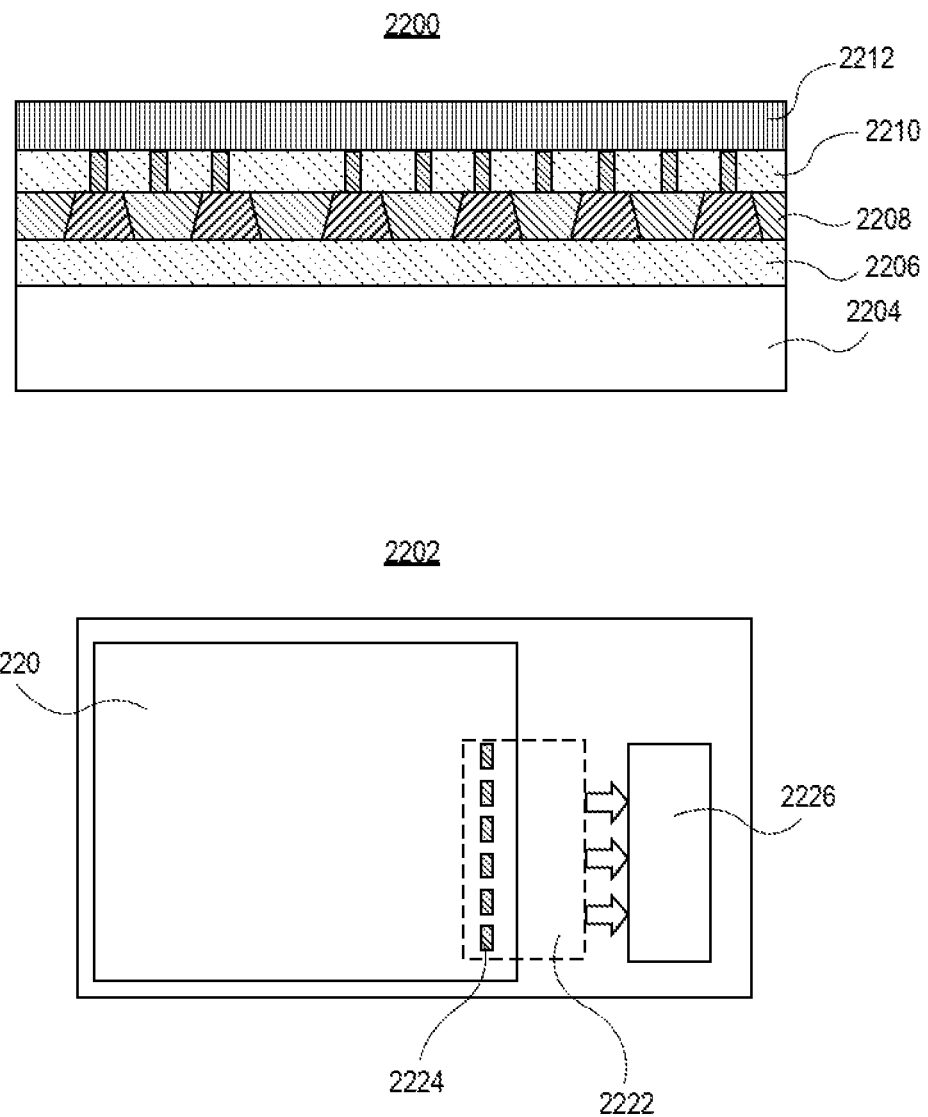
FIG. 22 illustrates a cross-sectional view and associated schematic representing Si CMOS and photonics integration on a same wafer, in accordance with an embodiment of the present disclosure.

In an example, Si CMOS and photonics integration can be performed on a same wafer. FIG. 22 illustrates a cross-sectional view 2200 and associated schematic 2202 representing Si CMOS and photonics integration on a same wafer, in accordance with an embodiment of the present disclosure.

Referring to the cross-sectional view 2200 of FIG. 22, an integrated structure includes a first three-dimensional (3D) heterogeneous integration layer 2206 on a 300 mm silicon wafer 2204. A first technology layer 2208 is on the first 3D heterogeneous integration layer 2206. In one embodiment, the first technology layer 2208 is an infrared III-V laser technology layer. A second 3D heterogeneous integration layer 2210 is on the first technology layer 2208. A second technology layer 2212 is on the second 3D heterogeneous integration layer 2210. In one embodiment, the second technology layer 2212 is a 3D Si CMOS technology layer. Interconnects in the second 3D heterogeneous integration layer 2210 can be included to couple the second technology layer 2212 to the first technology layer 2208, as is depicted. Referring to the schematic 2202 of FIG. 22, the integrated structure includes a compute complex region 2220 (in the 3D Si CMOS technology layer), a III-V laser source region 2222 (in the infrared III-V laser technology layer), connections 2224 between regions 2220 and 2222, and a silicon photonics region 2226 (in the 3D Si CMOS technology layer) which can include, e.g., waveguides and detectors.

Figure 23:
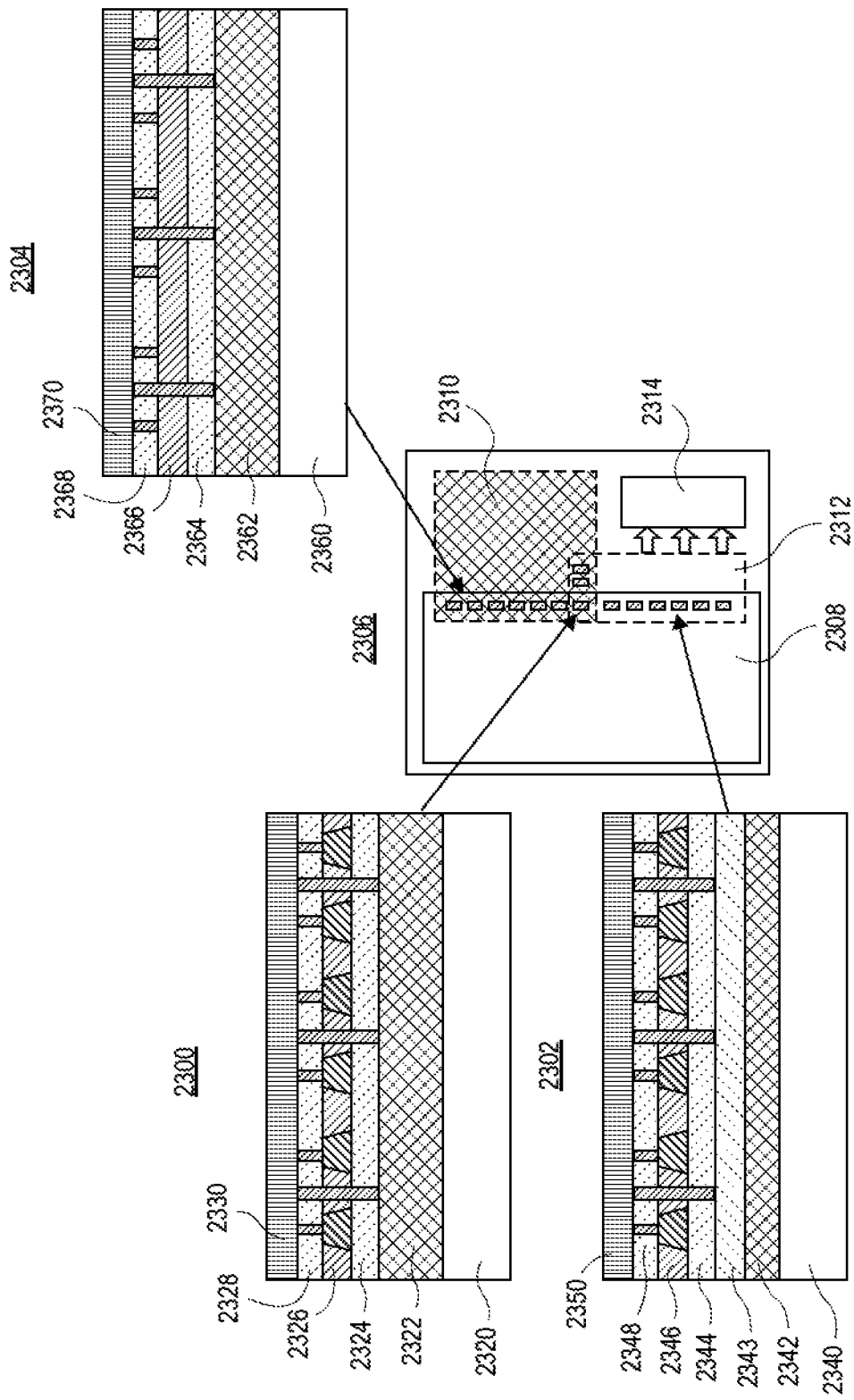
FIG. 23 illustrates cross-sectional views and associated schematic representing Si CMOS, RF and photonics integration on a same wafer, in accordance with an embodiment of the present disclosure.

In an example, Si CMOS, RF and photonics integration can be performed on a same wafer. FIG. 23 illustrates cross-sectional views 2300, 2302, and 2304, and an associated schematic 2306 representing Si CMOS, RF and photonics integration on a same wafer, in accordance with an embodiment of the present disclosure.

Referring to the cross-sectional view 2300 of FIG. 23, an integrated structure includes a first three-dimensional (3D) heterogeneous integration layer 2324 on a GaN transistor technology layer 2322 on a 300 mm silicon wafer 2320. An infrared III-V laser technology layer 2326 is on the first 3D heterogeneous integration layer 2324. A second 3D heterogeneous integration layer 2328 is on the infrared III-V laser technology layer 2326. A 3D Si CMOS technology layer 2330 is on the second 3D heterogeneous integration layer 2328. Interconnects in the 3D heterogeneous integration layers can be included to couple the technology layers, as is depicted.

Referring to the cross-sectional view 2302 of FIG. 23, an integrated structure includes a first three-dimensional (3D) heterogeneous integration layer 2344 on a dielectric layer 2343 on a GaN transistor technology layer 2342 on a 300 mm silicon wafer 2340. An infrared III-V laser technology layer 2346 is on the first 3D heterogeneous integration layer 2344. A second 3D heterogeneous integration layer 2348 is on the infrared III-V laser technology layer 2346. A 3D Si CMOS technology layer 2350 is on the second 3D heterogeneous integration layer 2348. Interconnects in the 3D heterogeneous integration layers can be included to couple the technology layers, as is depicted.

Referring to the cross-sectional view 2304 of FIG. 23, an integrated structure includes a first three-dimensional (3D) heterogeneous integration layer 2364 on a GaN transistor technology layer 2362 on a 300 mm silicon wafer 2360. A dielectric layer 2366 is on the first 3D heterogeneous integration layer 2364. A second 3D heterogeneous integration layer 2368 is on the dielectric layer 2366. A 3D Si CMOS technology layer 2370 is on the second 3D heterogeneous integration layer 2368. Interconnects in the 3D heterogeneous integration layers can be included to couple the technology layers, as is depicted.

Referring to the schematic 2306 of FIG. 23, the integrated structure includes a compute complex region 2308 (in the 3D Si CMOS technology layer), a GaN RF front end region 2310 (in the GaN transistor technology layer), a III-V laser source region 2312 (in the infrared III-V laser technology layer), and a silicon photonics region 2314 (in the 3D Si CMOS technology layer) which can include, e.g., waveguides and detectors.

Figure 24:
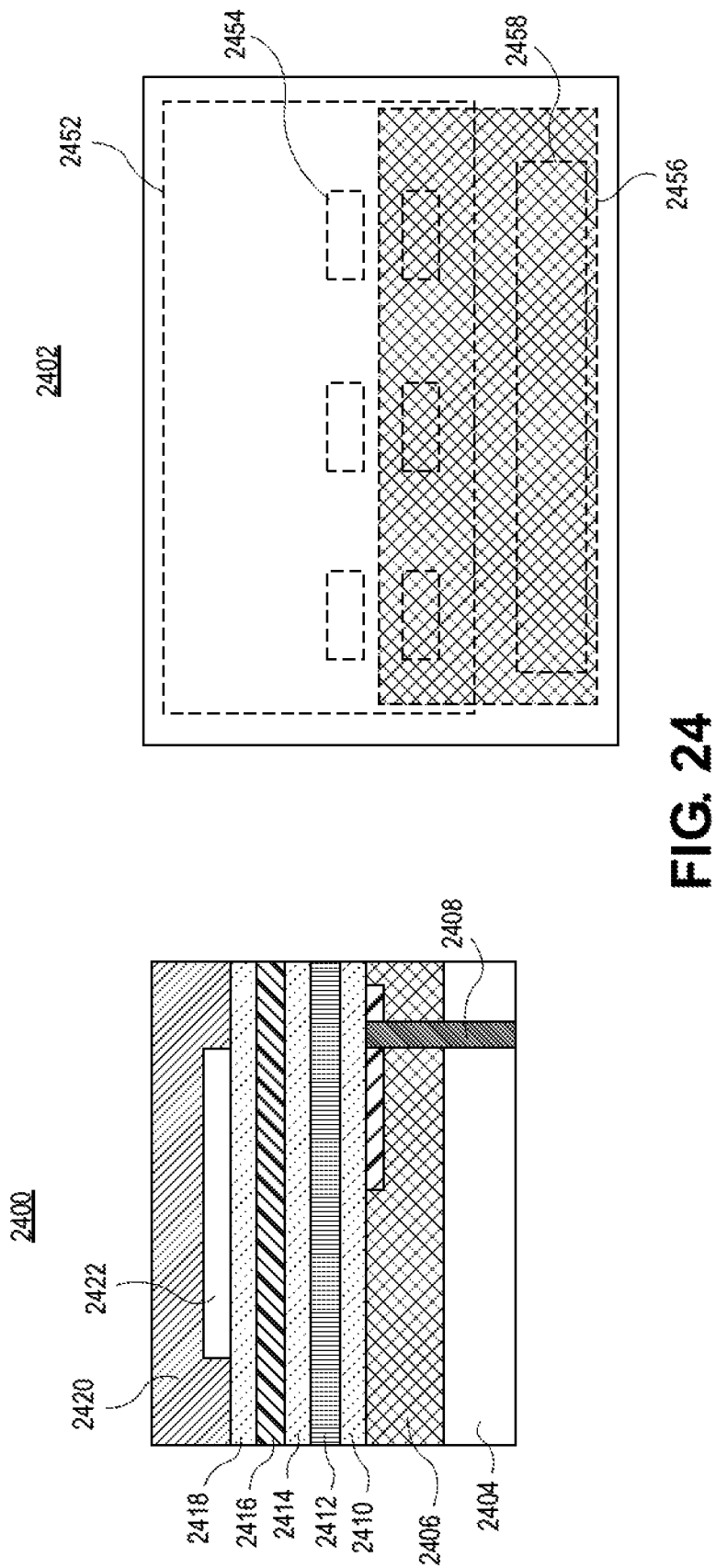
FIG. 24 illustrates a cross-sectional view and associated schematic representing wide bandwidth filters and RF front end integration on a same wafer, in accordance with an embodiment of the present disclosure.

In an example, integration of wide bandwidth filters and RF front end structures can be performed on a same wafer. FIG. 24 illustrates a cross-sectional view 2400 and associated schematic 2402 representing wide bandwidth filters and RF front end integration on a same wafer, in accordance with an embodiment of the present disclosure.

Referring to the cross-sectional view 2400 of FIG. 24, an integrated structure includes a first three-dimensional (3D) heterogeneous integration layer 2410 on a GaN transistor technology layer 2406 on a 300 mm silicon wafer 2404 (which can include through silicon vias 2408). A 3D Si CMOS technology layer 2412 is on the first 3D heterogeneous integration layer 2410. A second 3D heterogeneous integration layer 2414 is on the 3D Si CMOS technology layer 2412. A high-Q passives technology layer 2416 (such as a layer including inductors and capacitors) is on the second 3D heterogeneous integration layer 2414. A third 3D heterogeneous integration layer 2418 is on the high-Q passives technology layer 2416. A 3D nitride MEMS technology layer 2420 (which may include a cavity 2422) is on the third 3D heterogeneous integration layer 2418. Referring to the schematic 2402 of FIG. 24, the integrated structure includes a first region 2452 having filter banks (in the 3D nitride MEMS technology layer 2420) and high-Q passives (in the high-Q passives technology layer 2416), e.g., at locations 2454. A second region 2456 includes GaN technology such as RF front end technology (in the GaN transistor technology layer 2406). A third region 2458 includes silicon CMOS (in the 3D Si CMOS technology layer 2412).

To provide further context for embodiments described herein, major factors driving the growth of the GaN semiconductor device industry include the vast addressable market for GaN in consumer electronics and automotive, wide bandgap property of GaN material encouraging innovative applications, success of GaN in RF power electronics, and increasing adoption of GaN RF semiconductor device in military, defense and aerospace applications. GaN LEDs are widely used in laptop and notebook display, mobile display, projectors, televisions and monitor, signs and large displays, etc. The market for GaN-based power drives is expected to grow significantly during the forecast period attributed to its superior features such as minimum power loss, high-speed switching miniaturization, and high breakdown voltage as compared with the silicon-based power devices.

Figure 25A:
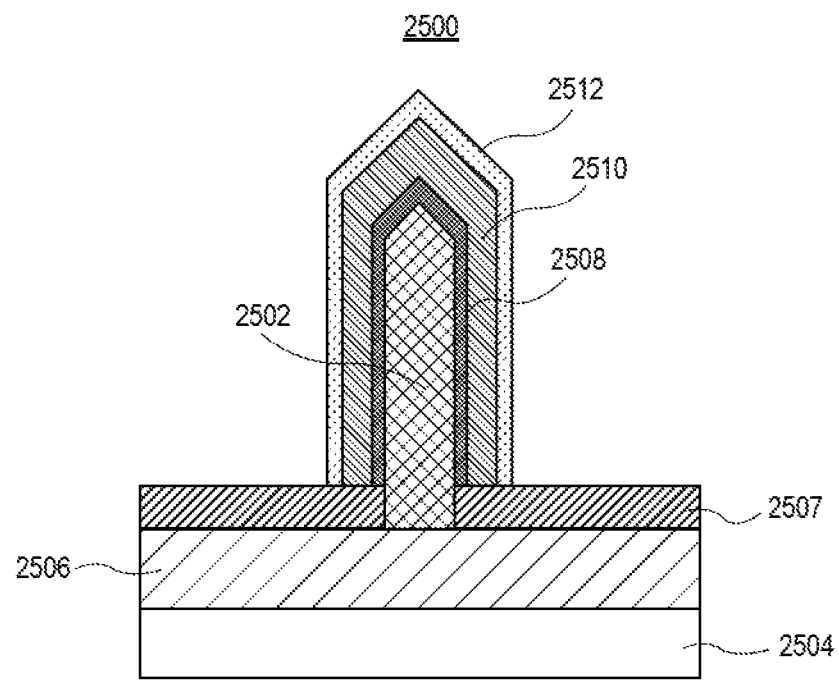
FIG. 25A illustrates a cross-sectional view of a GaN nanowire based LED highlighting certain layers of the LED, in accordance with an embodiment of the present disclosure.

FIG. 25A illustrates a cross-sectional view of a GaN nanowire based LED highlighting certain layers of the LED, in accordance with an embodiment of the present disclosure. In the exemplary embodiment of FIG. 25A, an LED 2500 includes an n-type GaN nanowire 2502 above a substrate 2504, which may be a Si(001) substrate. An intervening nucleation layer 2506 has an opened mask layer 2507 thereon. An active layer 2508/2510 (which may be a single active layer replacing 2508/2510) is included on the n-type GaN nanowire 2502. In a particular embodiment, an $In_{0.2}Ga_{0.8}N$ shell "buffer" layer 2508 is included on the n-type GaN nanowire 2502, and an active $In_{0.4}Ga_{0.6}N$ layer 2510 is included on the $In_{0.2}Ga_{0.8}N$ shell "buffer" layer 2508. In one such embodiment, the $In_{0.4}Ga_{0.6}N$ layer 2510 emits red color (e.g., having a wavelength in the range of 610-630 nanometers). A p-GaN or p-ZnO cladding layer 2512 is included on the active layer 2508/2510.

In another such embodiment, following the fabrication of an ordered n-type $In_xGa_{1-x}N$ nanowire array with x in the range of 0.15-0.25, the remainder of the LED structure is grown radially around the nanowires. An $In_yGa_{1-y}N$ layer is on the $In_xGa_{1-x}N$ nanowires (and may be included in a set of $In_yGa_{1-y}N$/GaN multi-quantum well (MQW) active layers) with y in the range of 0.4-0.45. An undoped GaN layer and/or AlGaN electron blocking layer may be included as the next outer layer. Finally, a p-type GaN (or p-type ZnO) cladding layer may be included.

Figure 25B:
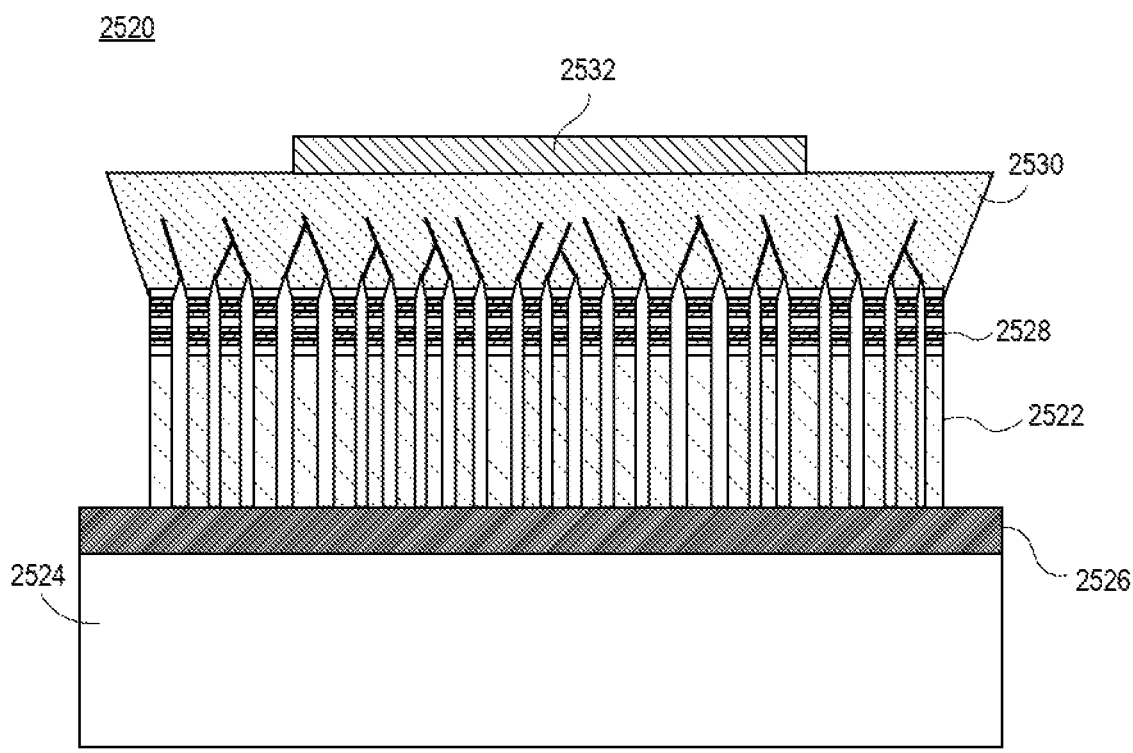
FIG. 25B illustrates a cross-sectional view of a micro-LED composed of multiple nanowire LEDs, in accordance with an embodiment of the present disclosure.

FIG. 25B illustrates a cross-sectional view of a micro-LED composed of multiple nanowire LEDs, in accordance with an embodiment of the present disclosure. In the exemplary embodiment of FIG. 25B, a micro-LED 2520 includes an n-GaN nano-column 2522 above a substrate 2524, which may be a Si(001) substrate. An intervening nucleation layer 2526 is included between the n-GaN nano-column 2522 and the substrate 2524. An InGaN/GaN multi-quantum well device (MQD) stack 2528 is included on the n-GaN nano-column 2522. A p-GaN layer 2530 is on the multi-quantum well device (MQD) stack 2528. A transparent p-electrode 2532 is included on the p-GaN layer 2530.

It is to be appreciated that foundational geometries other than the above described nanowires may be used for LED fabrication. For example, in another embodiment, FIG. 25C illustrates a cross-sectional view of a GaN nanopyramid or micropyramid based LED highlighting certain layers of the LED, in accordance with an embodiment of the present disclosure. In the exemplary embodiment of FIG. 25C, an LED 2540 includes an n-GaN nanopyramid 2542 above a substrate 2544, which may be a Si(001) substrate. An intervening nucleation layer 2546 has an opened mask layer 2547 thereon. An InGaN layer 2548 is included on the GaN nanopyramid 2542. A p-GaN or p-ZnO cladding layer 2552 is included on the InGaN layer 2548. It is to be appreciated that a micro LED may be composed of multiple nanopyramids connected in parallel. For example, a 5 um×5 um micro LED may be composed of 20 nanopyramids.

Figure 25D:
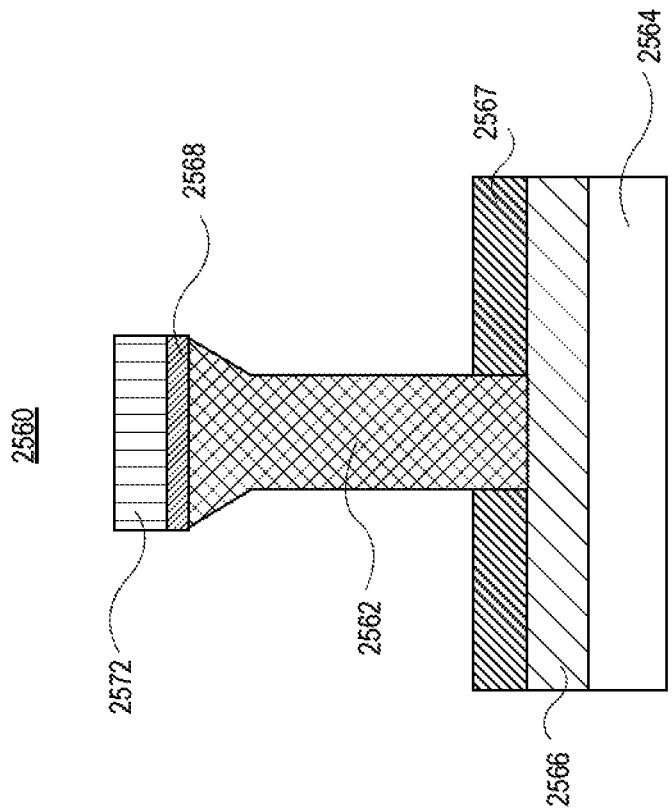
FIG. 25D illustrates a cross-sectional view of a GaN axial nanowire based LED highlighting certain layers of the LED, in accordance with an embodiment of the present disclosure.
Figure 25C:
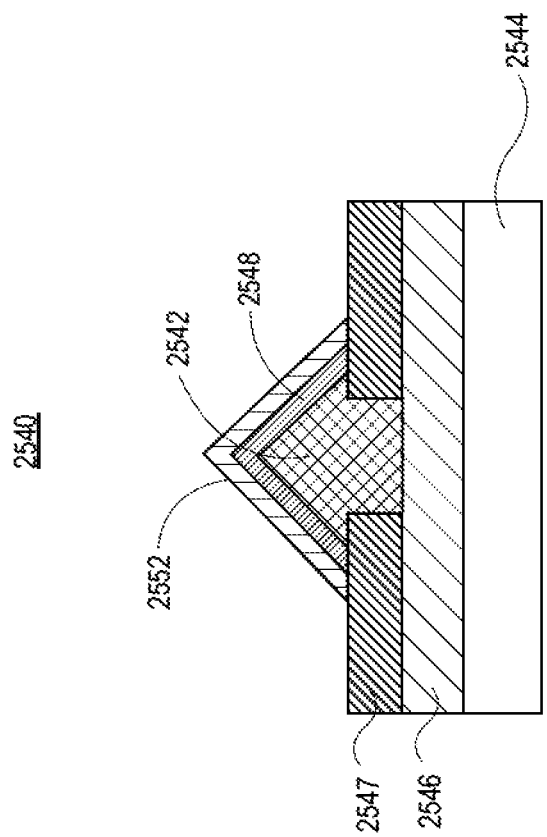
FIG. 25C illustrates a cross-sectional view of a GaN nanopyramid or micropyramid based LED highlighting certain layers of the LED, in accordance with an embodiment of the present disclosure.

In another embodiment, FIG. 25D illustrates a cross-sectional view of a GaN axial nanowire based LED highlighting certain layers of the LED, in accordance with an embodiment of the present disclosure. In the exemplary embodiment of FIG. 25D, an LED 2560 includes an n-GaN axial nanowire 2562 above a substrate 2564, which may be a Si(001) substrate. An intervening nucleation layer 2566 has an opened mask layer 2567 thereon. An InGaN layer 2568 is included on the GaN axial nanowire 2562. A p-GaN or p-ZnO cladding layer 2572 is included on the InGaN layer 2568.

In a fifth aspect, scaled Si CMOS for on chip high voltage power delivery based on GaN technology is described.

To provide context, group III-N technology is one of the leading candidates for power delivery, due to high speed as well as high power the material can withstand. Typical power deliver technology has complementary CMOS on die to enable high efficiencies. For example, power delivery technology is typically Si-based, which due to material properties requires either multiple stages, or low efficiency, or low frequency of operation. GaN is also being researched for power delivery applications. However, voltage regulators can require a complementary CMOS solution, and p-type GaN channels are typically associated with very poor performance.

In accordance with one or more embodiments of the present disclosure, Si CMOS is formed on top of high power III-N transistors on a same die/wafer. Embodiments may be implemented by transferring a layer of crystalline Si or Si/SiGe heterostructures from a host substrate to a III-N transistor structure. Subsequently, a typical CMOS process flow is performed to create control logic on the substrate. In one embodiment, the process is accomplished by using (i) traditional III-N device fabrication, (ii) layer transfer technology, and (iii) traditional CMOS fabrication which is augmented with thermal processing suitable for processing in the presence of a III-N device structure. Advantage of this approach can include the opportunity to add versatility to a portfolio of III-N devices, thereby increasing the number of possible applications.

Accordingly, embodiments described herein can be implemented to fabricate scaled Si/Ge CMOS for on chip high voltage power delivery based on an underlying GaN technology. Layer transfer technology enables GaN, Si CMOS co-integration, including other materials, such as Ge. Adding CMOS in a gate loop of GaN processing can reduce the number of masks needed (i.e., to reduce process complexity and cost). Adding highly scaled Si CMOS, such as stack transistors can enables both compact voltage regulation (VR) and also logic functionality beyond only VR on a same die.

Figure 26:
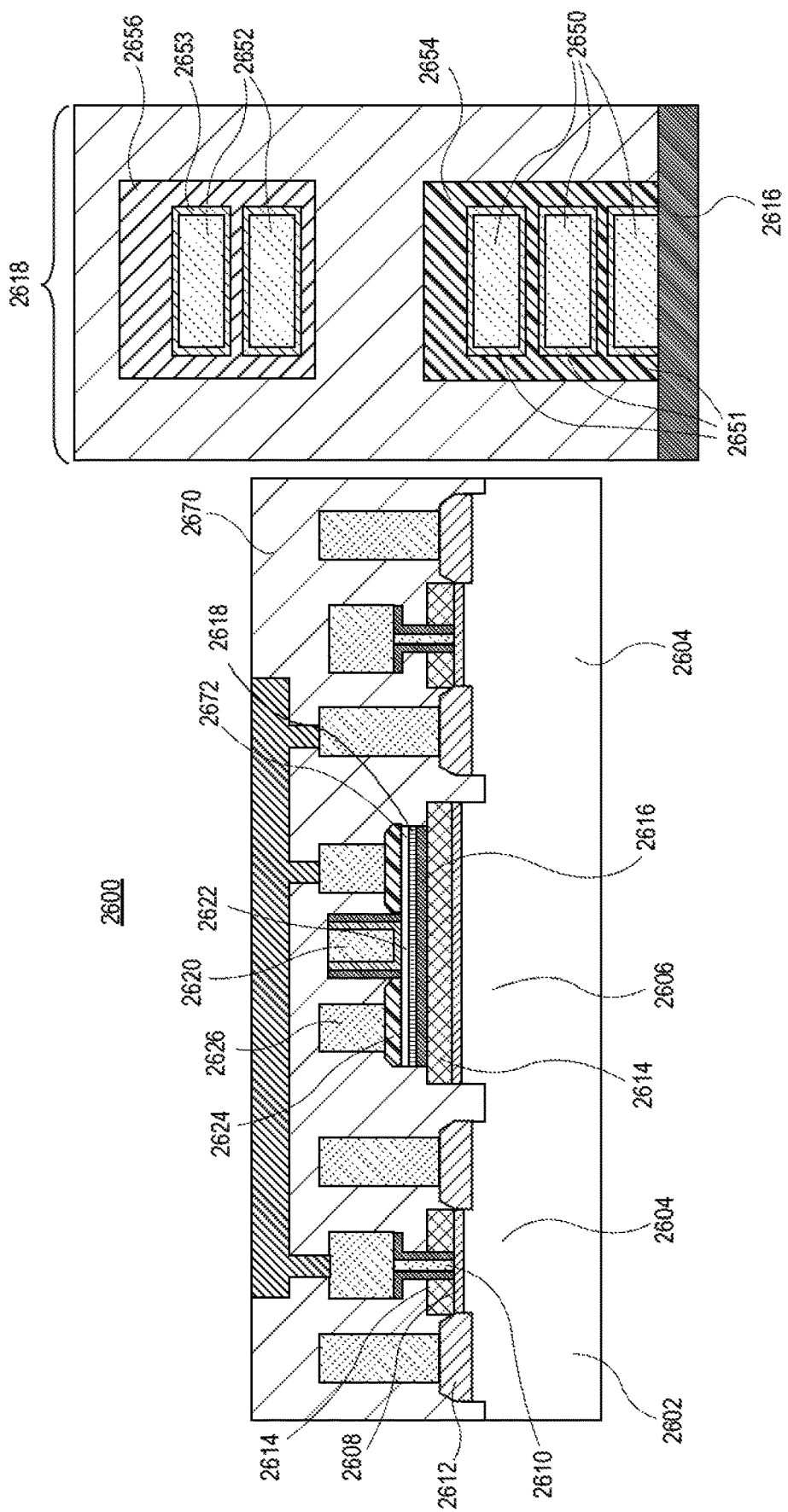
FIG. 26 illustrates a cross-sectional view and accompanying expanded cross-section of an integrated circuit structure including a silicon-based CMOS layer integrated with a GaN device. In accordance with an embodiment of the present disclosure.

In an example, FIG. 26 illustrates a cross-sectional view and accompanying expanded cross-section of an integrated circuit structure including a silicon-based CMOS layer integrated with a GaN device. In accordance with an embodiment of the present disclosure.

Referring to FIG. 26, an integrated circuit structure 2600 includes a GaN layer or substrate 2602. Regions 2604 of the GaN layer or substrate 2602 include GaN-based devices therein or thereon. Region 2606 of the GaN layer or substrate 2602 includes Si-CMOS based devices there over. The GaN devices each include a polarization layer 2608 and a dielectric layer 2614. Source or drain structures 2612 are on either side of the polarization layer 2608, and may be recessed into the GaN layer or substrate 2602, as is depicted. A gate structure 2610 is through the dielectric layer 2614 and may be on, partially through, or entirely through the polarization layer 2608.

Referring again to FIG. 26, a Si-CMOS based device is bonded to the GaN layer or substrate 2602 by a bonding layer 2616, such as a buried oxide layer. A channel layer or structure 2618 is on or above the bonding layer 2616. Source or drain structures 2624 and corresponding source or drain contacts 2626 are on either side of a gate electrode 2620 and gate dielectric 2622 structure. An inter-layer dielectric layer 2670 and an interconnect structure 2672 are above the GaN devices and the Si-CMOS based device.

In an exemplary embodiment, FIG. 26 shows an expanded view of the channel layer or structure 2618 which can be a stacked structure including an NMOS region above a PMOS region. In one embodiment, the PMOS region includes a vertical stack of horizontal silicon germanium nanowires or nanoribbons 2650. A gate dielectric 2651 (such as a hafnium oxide gate dielectric) and gate electrode 2654 (such as a titanium nitride gate electrode) surround the vertical stack of horizontal silicon germanium nanowires or nanoribbons 2650. The NMOS region includes a vertical stack of horizontal silicon nanowires or nanoribbons 2652. A gate dielectric 2653 (such as a hafnium oxide gate dielectric) and gate electrode 2656 (such as a titanium nitride gate electrode) surround the vertical stack of horizontal silicon nanowires or nanoribbons 2652. It is to be appreciated that, in an embodiment, the NMOS region structures and the PMOS structures may be reversed such that the vertical stack of horizontal silicon germanium nanowires or nanoribbons is above the vertical stack of horizontal silicon nanowires or nanoribbons.

It is to be appreciated that, in a particular embodiment, nanowires or nanoribbons may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is also to be appreciated that, in a particular embodiment, nanowires or nanoribbons may be composed of silicon germanium. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

Figure 27:
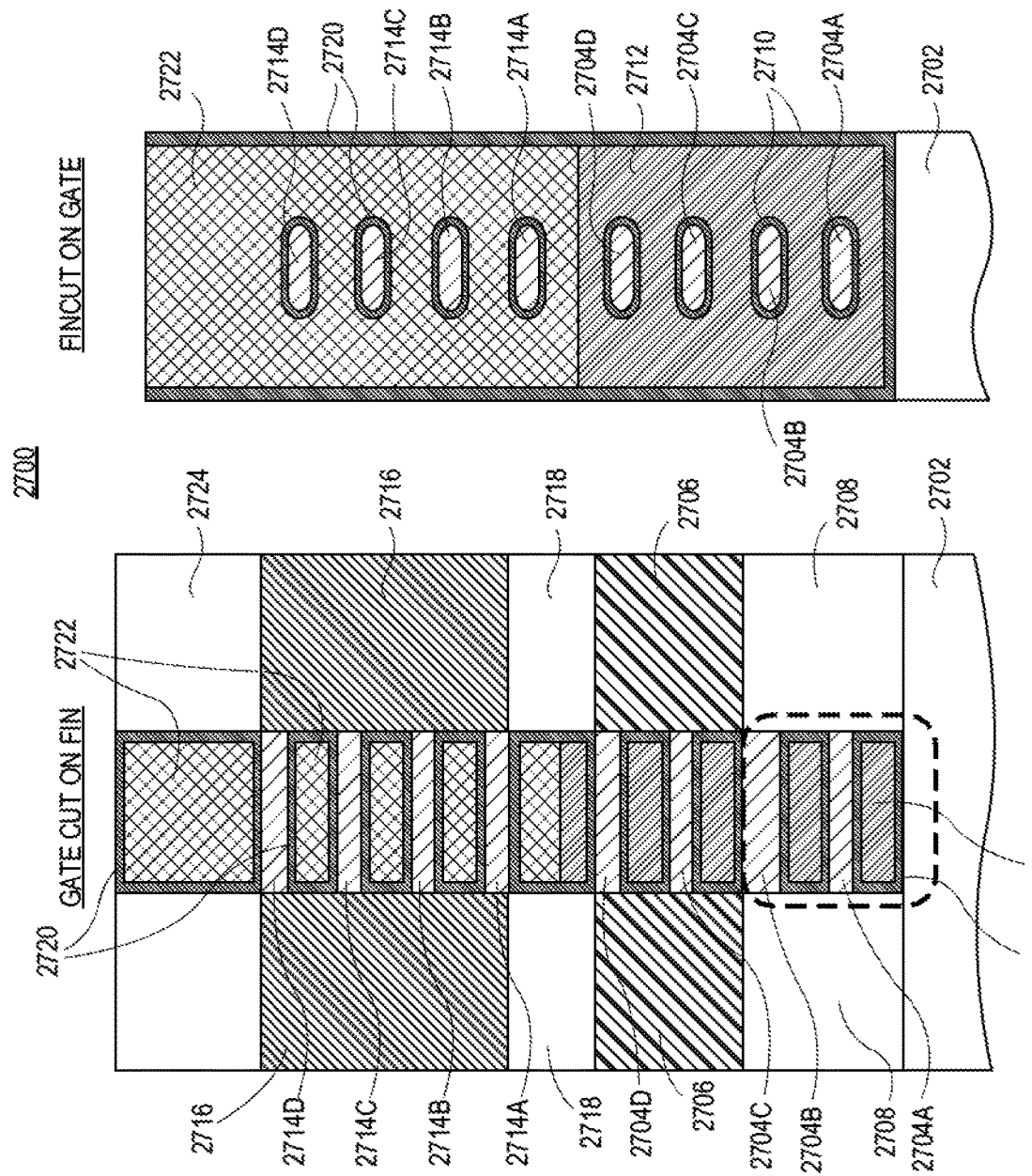
FIG. 27 illustrates cross-sectional views representing a stacked gate-all-around integrated circuit structure, in accordance with an embodiment of the present disclosure.

As another exemplary CMOS structure suitable for integrating with a GaN device, FIG. 27 illustrates cross-sectional views representing a stacked gate-all-around integrated circuit structure, in accordance with an embodiment of the present disclosure.

Referring to FIG. 27, a CMOS integrated circuit structure 2700 is formed above a substrate 2702 and includes a lower PMOS region and an upper NMOS region. The lower PMOS region includes stacked nanoribbons 2704A, 2704B, 2704C and 2704D. P-type source or drain structures 2706 are adjacent (at least some of) the stacked nanoribbons 2704A, 2704B, 2704C and 2704D and above an insulating structure 2708. A lower gate structure includes a gate dielectric layer 2710 having a P-type gate electrode 2712 thereon. The upper NMOS region includes stacked nanoribbons 2714A, 2714B, 2714C and 2714D. N-type source or drain structures 2716 are adjacent the stacked nanoribbons and above an insulating structure 2718. An upper gate structure includes a gate dielectric layer 2720 having an N-type gate electrode 2722 thereon. Spacers 2724 may be adjacent to an uppermost portion of the upper gate structure.

In one embodiment, not depicted, the P-type source or drain structures 2706 are adjacent all of the stacked nanoribbons 2704A, 2704B, 2704C and 2704D, and all nanoribbons 2704A, 2704B, 2704C and 2704D are active. However, in other embodiments, channel depopulation involving source or drain structure tuning is implemented in some structures to reduce a channel count, e.g., in the PMOS region relative to other structures fabricated on a silicon substrate. For example, referring again to FIG. 27, all of the upper stacked nanoribbons 2714A, 2714B, 2714C and 2714D (e.g., in this case 4) are coupled to the N-type source or drain structures 2716. However, only the upper two stacked nanoribbons 2704C and 2704D are coupled to the P-type source or drain structures 2706, while the lower two stacked nanoribbons 2704A and 2704B are not coupled to the P-type source or drain structures 2706 (as indicated in the dashed box around nanoribbons 2704A, 2704B). The resulting structure effectively depopulates two of the four channel regions of the P-type portion of the CMOS integrated circuit structure 2700. However, source or drain 2706 depth engineering is required to fabricate CMOS integrated circuit structure 2700. It is to be appreciated that although the illustrative example of four upper wires and two lower wires and effectively two depopulated nanowires is depicted and described above, it is to be appreciated that all such wire counts may be varied.

Figure 28:
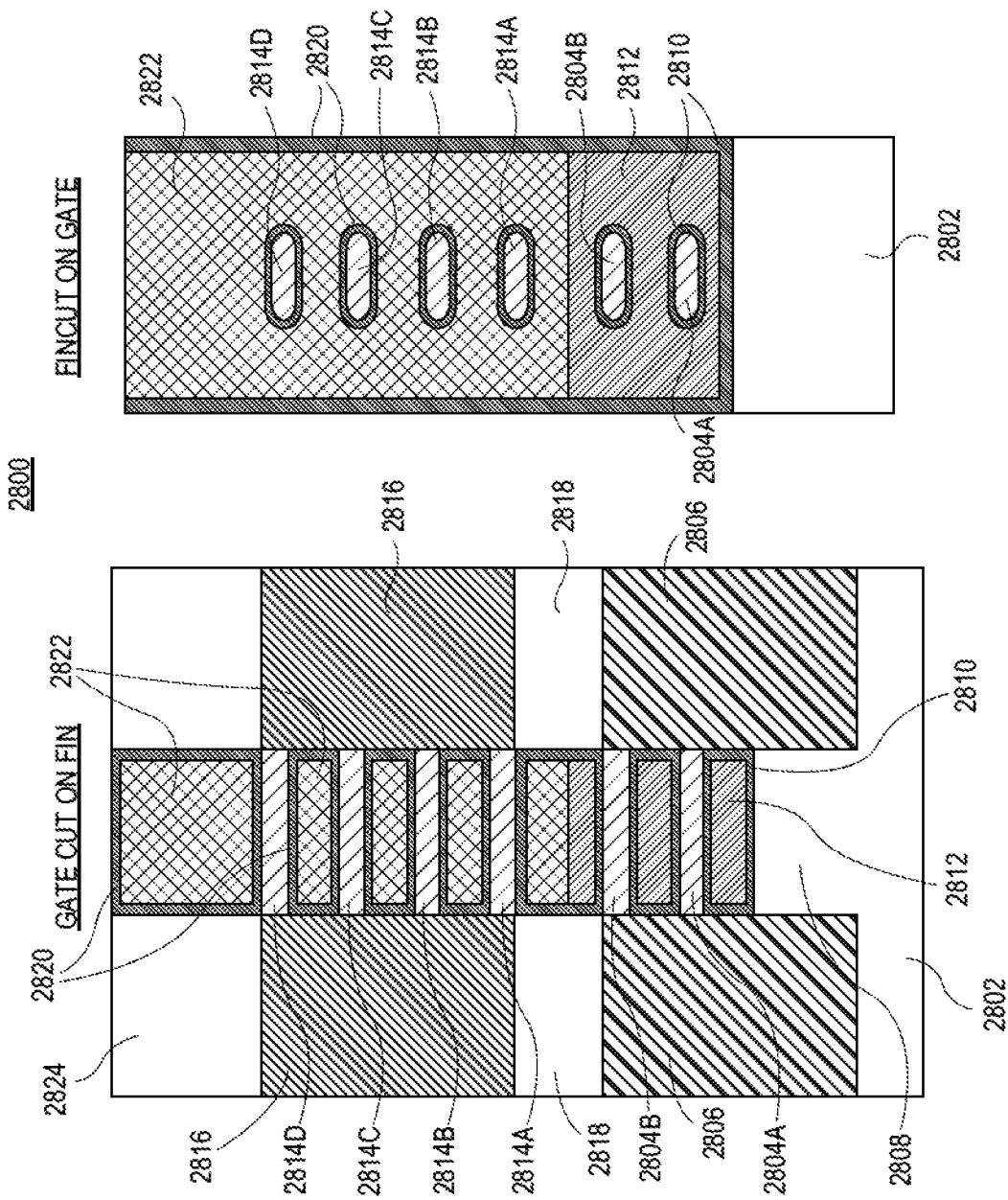
FIG. 28 illustrates cross-sectional views representing a stacked gate-all-around integrated circuit structure having a depopulated channel structure, in accordance with an embodiment of the present disclosure.

As a comparison of channel depopulation involving channel count tuning, and as another exemplary CMOS structure suitable for integrating with a GaN device, FIG. 28 illustrates cross-sectional views representing a stacked gate-all-around integrated circuit structure having a depopulated channel structure, in accordance with an embodiment of the present disclosure.

Referring to FIG. 28, a CMOS integrated circuit structure 2800 is formed above a substrate 2802 and includes a lower PMOS region and an upper NMOS region. The lower PMOS region includes stacked nanoribbons 2804A and 2804B above a raised substrate portion 2808. P-type source or drain structures 2806 are adjacent the stacked nanoribbons. A lower gate structure includes a gate dielectric layer 2810 having a P-type gate electrode 2812 thereon. The upper NMOS region includes stacked nanoribbons 2814A, 2814B, 2814C and 2814D. N-type source or drain structures 2816 are adjacent the stacked nanoribbons and above an insulating structure 2818. An upper gate structure includes a gate dielectric layer 2820 having an N-type gate electrode 2822 thereon. Spacers 2824 may be adjacent to an uppermost portion of the upper gate structure.

Referring again to FIG. 28, all of the upper stacked nanoribbons 2814A, 2814B, 2814C and 2814D (e.g., in this case 4) are coupled to the N-type source or drain structures 2816. Also, both of the nanoribbons 2804A and 2804B are coupled to the P-type source or drain structures 2806. However, the lower structure only includes two stacked nanoribbons 2804A and 2804B. The resulting structure effectively depopulates two of four channel regions of the P-type portion of the CMOS integrated circuit structure 2800. However, channel count engineering is required to fabricate CMOS integrated circuit structure 2800. It is to be appreciated that although the illustrative example of four upper wires and two lower wires and effectively two depopulated nanowires is depicted and described above, it is to be appreciated that all such wire counts may be varied.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a FIN-FET, a nanowire, or a nanoribbon.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

In a sixth aspect, power delivery solutions are described.

To provide context, replacing Si-based power delivery solutions with GaN-based solutions that are capable of greater than 3× power density can lead to about ⅓ smaller devices and cheaper solutions. Disclosed herein are process technologies and chip architectures that can enable GaN-based power delivery solutions for servers, graphics and clients. Also disclosed are implementations that can be coupled with CMOS power delivery to integrate an end to end solution.

One or more embodiments described herein can be implemented to fabricate a GaN chiplet with process capabilities such as 5V, 12V and 48V GaN transistor technology, high-voltage GaN and multi-gate GaN devices, integrated CMOS technology and thru substrate vias. A GaN chiplet or die can be stacked on or below a compute die to enable efficient power delivery to the compute die.

Advantages of implementing one or more embodiments described herein can include one or more of: (1) a GaN power delivery chiplet can enable decoupling of power delivery solutions from a compute technology, a GaN power delivery (PD) solution can be optimized on a separate cadence, (2) enable reuse of intellectual property (IP) over several compute technology generations and there is no need to "reinvent the wheel" when a key process parameter is changed in the compute technology, (3) overall design cost can be reduced, and designers can now dedicate a larger proportion of their time and attention to improving the efficiency and cost of PD solutions, rather than inventing "work-arounds."

Figure 29:
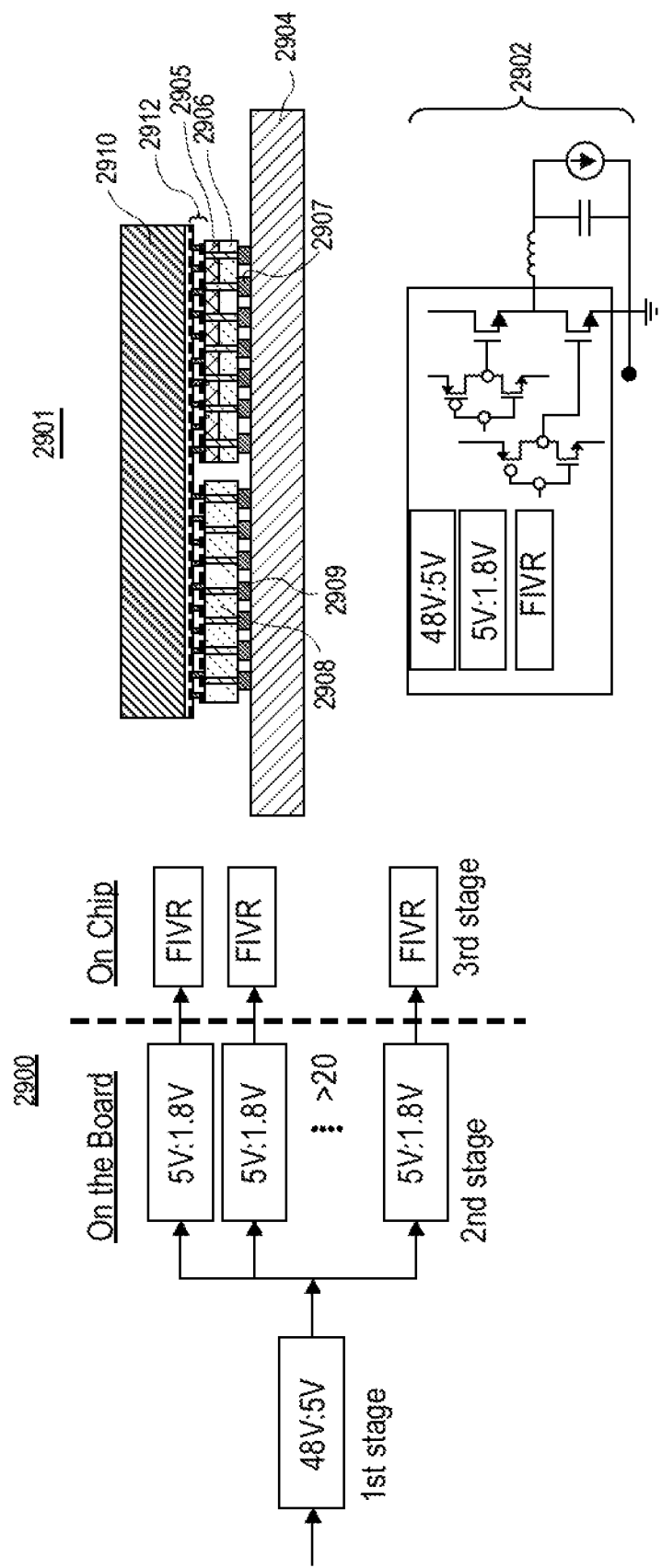
FIG. 29 includes a schematic, a cross-sectional view of a semiconductor package, and a circuit diagram representing a power delivery solution, in accordance with an embodiment of the present disclosure.

In an example, FIG. 29 includes a schematic 2900, a cross-sectional view of a semiconductor package 2901, and a circuit diagram 2902 representing a power delivery solution, in accordance with an embodiment of the present disclosure.

Referring to FIG. 29, the schematic 2900 includes a first stage 48V:5V converter, a second stage (on board) with a plurality of (e.g., greater than 20) 5V:1.8V converters, and a third stage (on chip) with a plurality of voltage regulators. The semiconductor package 2901 includes a package substrate 2904 having a base die chiplets thereon. For example, a first base die chiplet is a hybrid GaN device layer 2905 (e.g., 6V/48V GaN voltage regulator, VR) and CMOS layer 2906, and may include through structure vias. The first base die chiplet is coupled to the package substrate 2904 by a plurality of microbumps or interconnects 2907. A second base die chiplet 2908, such as a chiplet having another function, is coupled to the package substrate 2904 by a plurality of microbumps or interconnects 2909. A compute complex die 2910 is coupled to the base die chiplets through a plurality of microbumps or interconnects 2912. The circuit diagram 2902 represents a GaN power delivery chiplet including the GaN device layer 2905 and CMOS layer 2906.

Figure 30:
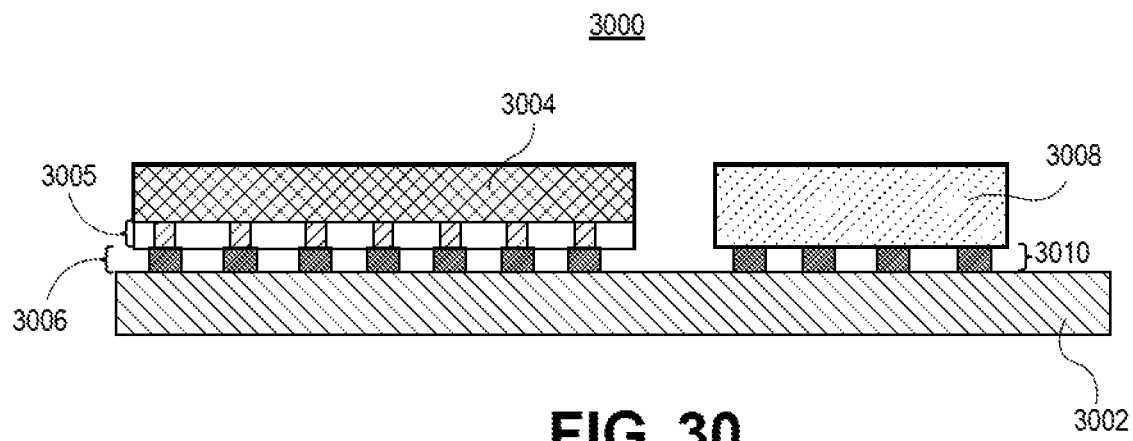
FIG. 30 illustrates a cross-sectional view of a GaN multi-chip package (MCP), in accordance with an embodiment of the present disclosure.

In another example, a packaged solution includes a GaN die having only GaN power transistors, and a driver and controller are on a separate Si CMOS die on the package. FIG. 30 illustrates a cross-sectional view of a GaN multi-chip package (MCP) 3000, in accordance with an embodiment of the present disclosure. Referring to FIG. 30, the GaN MCP 3000 includes a package substrate 3002. A GaN FET die 3004 (such as an nFET die) with contacts pads 3005 is coupled to the package substrate 3002 by a plurality of microbumps or interconnects 3006. A Si CMOS die 3008 (such as a driver and controller die) is coupled to the package substrate 3002 by a plurality of microbumps or interconnects 3010.

Figure 31:
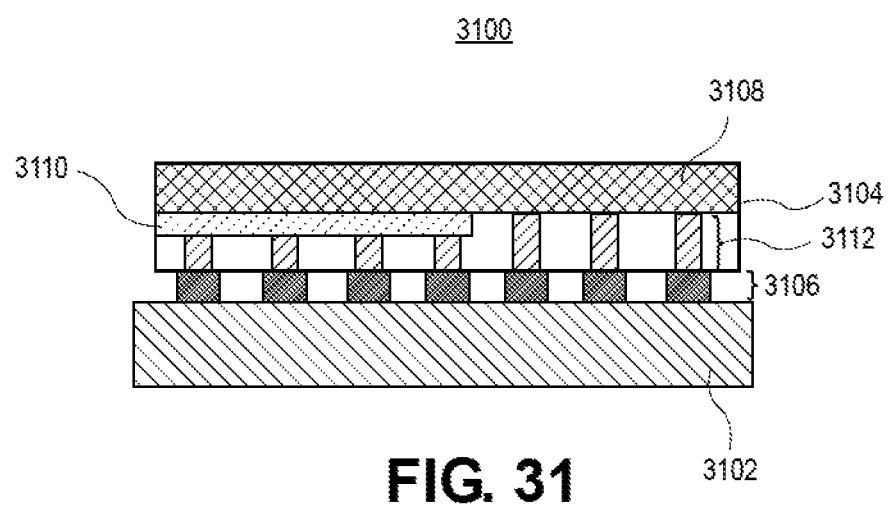
FIG. 31 illustrates a cross-sectional view of a GaN plus Si CMOS package, in accordance with an embodiment of the present disclosure.

In another example, Si CMOS is co-integrated on the same die as the GaN power transistors, enabling on-die driver and controller functions. FIG. 31 illustrates a cross-sectional view of a GaN plus Si CMOS package 3100, in accordance with an embodiment of the present disclosure. Referring to FIG. 31, the GaN plus Si CMOS package 3100 includes a package substrate 3102. A hybrid die 3104 with contacts pads 3112 is coupled to the package substrate 3102 by a plurality of microbumps or interconnects 3106. The hybrid die 3104 includes a GaN FET layer 3108 and a Si CMOS layer 3110.

Figure 32:
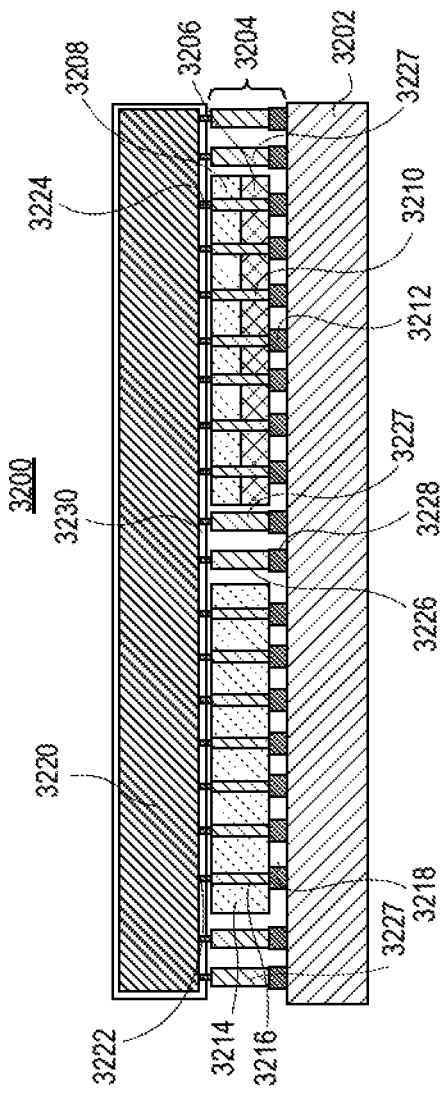
FIG. 32 illustrates a cross-sectional view of a GaN chiplet plus Omnidirectional-Interconnect (ODI) package, in accordance with an embodiment of the present disclosure.

In another example, a copper pillar that connects a compute complex to a package directly without having to route through a chiplet is included in a package substrate. Such an Omnidirectional-Interconnect (ODI) connectivity provides a lower resistance path than having to go through the through structure vias (TSVs) of a chiplet. FIG. 32 illustrates a cross-sectional view of a GaN chiplet plus Omnidirectional-Interconnect (ODI) package 3200, in accordance with an embodiment of the present disclosure. The semiconductor package 3200 includes a package substrate 3202 having base die chiplets thereon. For example, a GaN power delivery chiplet 3204 including a GaN device layer 3206 and a Si-based CMOS layer 3208, and may include through structure vias 3210. The GaN power delivery chiplet 3204 is coupled to the package substrate 3202 by a plurality of microbumps or interconnects 3212. A second base die chiplet 3214, such as a chiplet having another function, and which may include through structure vias 3216 is coupled to the package substrate 3202 by a plurality of microbumps or interconnects 3218. A compute complex die 3220 is coupled to the GaN power delivery chiplet 3204 through a plurality of microbumps or interconnects 3224, and to the second base die chiplet 3214 by a plurality of microbumps or interconnects 3222. An interconnect 3226, which may be referred to as an Omnidirectional-Interconnect (ODI), is between the GaN power delivery chiplet 3204 and the second base die chiplet 3214. The interconnect 3226 is coupled to the package substrate 3202 by microbump or interconnect 3228. The compute complex die 3220 is coupled to the interconnect 3226 by a microbump or interconnect 3230. In an embodiment, additional such interconnects 3226 (labeled herein as interconnects 3227) can be included in one or more locations such as: (a) as additional interconnects 3227 between the GaN power delivery chiplet 3204 and the second base die chiplet 3214, (b) at an opposing side of the GaN power delivery chiplet 3204, and/or (c), at an opposing side of the second base die chiplet 3214, all of which are depicted.

Figure 33:
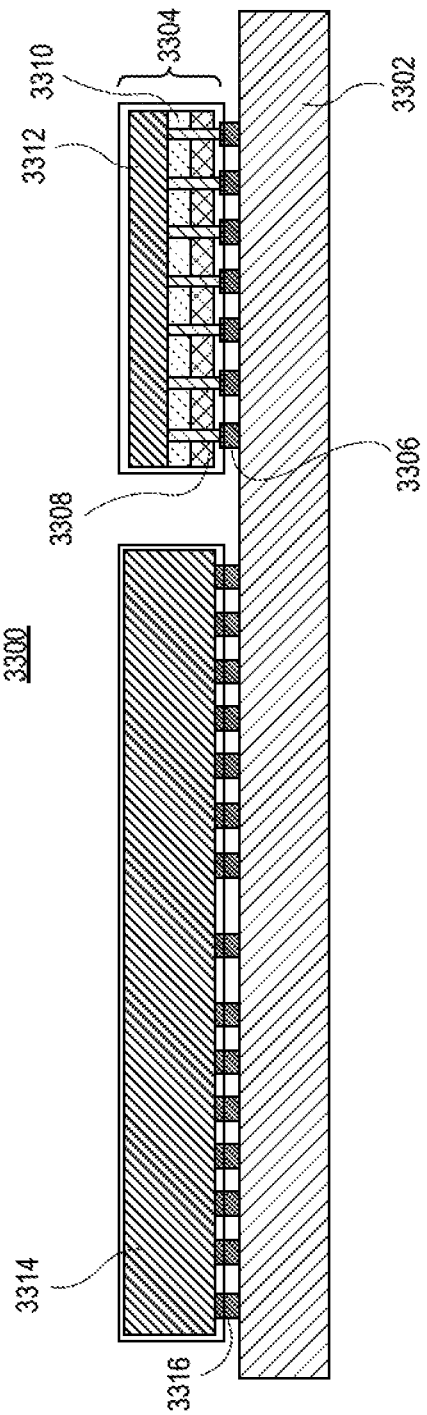
FIG. 33 illustrates a cross-sectional view of a GaN chiplet and compute complex package, in accordance with an embodiment of the present disclosure.

In another example, signals and power have are routed through package traces between a compute complex and a GaN power delivery die in a package substrate. FIG. 33 illustrates a cross-sectional view of a GaN chiplet and compute complex package 3300, in accordance with an embodiment of the present disclosure. The semiconductor package 3300 includes a package substrate 3302 having a GaN power delivery chiplet 3304 thereon. The GaN power delivery chiplet 3304 includes a substrate or carrier 3312, a GaN device layer 3308 and a Si-based CMOS layer 3310, and may include through structure vias. The GaN power delivery chiplet 3304 is coupled to the package substrate 3302 by a plurality of microbumps or interconnects 3308. A compute complex die 3314 is coupled to the package substrate 3302 by a plurality of microbumps or interconnects 3316.

Figure 34:
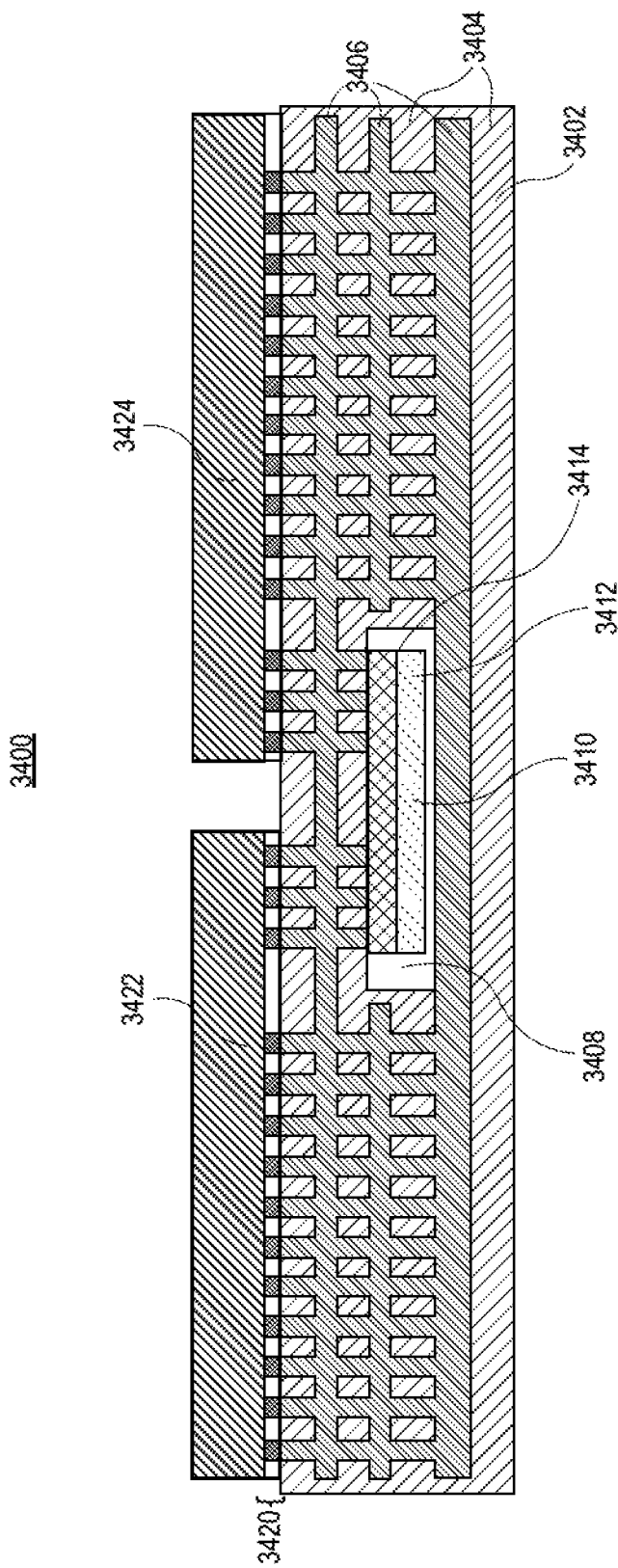
FIG. 34 illustrates a cross-sectional view of a semiconductor package including an embedded GaN power delivery chiplet bridge, in accordance with an embodiment of the present disclosure.

In another example, a GaN power delivery chiplet or die is embedded in a package and forms a bridge between a compute complex and a companion die which could be an analog IC or RF IC. FIG. 34 illustrates a cross-sectional view of a semiconductor package 3400 including an embedded GaN power delivery chiplet bridge, in accordance with an embodiment of the present disclosure. The semiconductor package 3400 includes a package substrate 3402 including a plurality of dielectric layers 3404 and metallization layers 3406. A cavity is within the plurality of dielectric layers 3404 and metallization layers 3406. A GaN power delivery chiplet 3410 is in the cavity. The GaN power delivery chiplet 3410 includes a GaN device layer 3414 and a Si-based CMOS layer 3412. A compute complex die 3422 and a companion die 3424 (such as an analog IC or RF IC) are coupled to the package substrate 3402 by a plurality of microbumps or interconnects 3420. In an embodiment, the compute complex die 3422 and the companion die 3424 are coupled to bond pads, interconnects or pillars on the GaN power delivery chiplet 3410 in the cavity, e.g., for power delivery.

Figure 35:
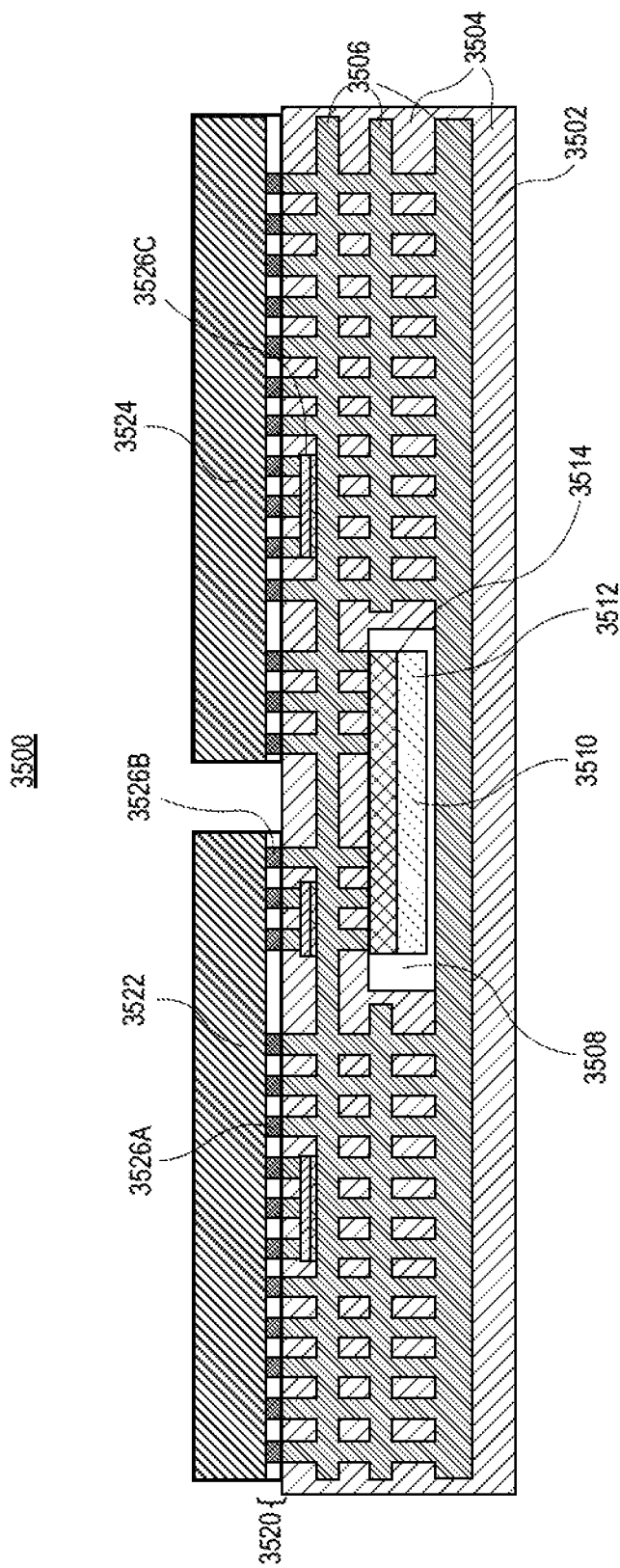
FIG. 35 illustrates a cross-sectional view of a semiconductor package including an embedded GaN power delivery chiplet bridge and embedded capacitors, in accordance with an embodiment of the present disclosure.

In another example, FIG. 35 illustrates a cross-sectional view of a semiconductor package including an embedded GaN power delivery chiplet bridge and embedded capacitors, in accordance with an embodiment of the present disclosure. The semiconductor package 3500 includes a package substrate 3502 including a plurality of dielectric layers 3504 and metallization layers 3506. A cavity is within the plurality of dielectric layers 3504 and metallization layers 3506. A GaN power delivery chiplet 3510 is in the cavity. The GaN power delivery chiplet 3510 includes a GaN device layer 3514 and a Si-based CMOS layer 3512. A compute complex die 3522 and a companion die 3524 (such as an analog IC or RF IC) are coupled to the package substrate 3502 by a plurality of microbumps or interconnects 3520. In an embodiment, the compute complex die 3522 and the companion die 3524 are routed to the GaN power delivery chiplet 3510 in the cavity, e.g., for power delivery. In an embodiment, a first package thin film capacitor 3526A is embedded in the package substrate 3502 at a location beneath the compute complex die 3522. A second package thin film capacitor 3526B is embedded in the package substrate 3502 at a location beneath the compute complex die 3522 and over the GaN power delivery chiplet 3510. A third package thin film capacitor 3526C is embedded in the package substrate 3502 at a location beneath the companion die 3524.

Figure 36:
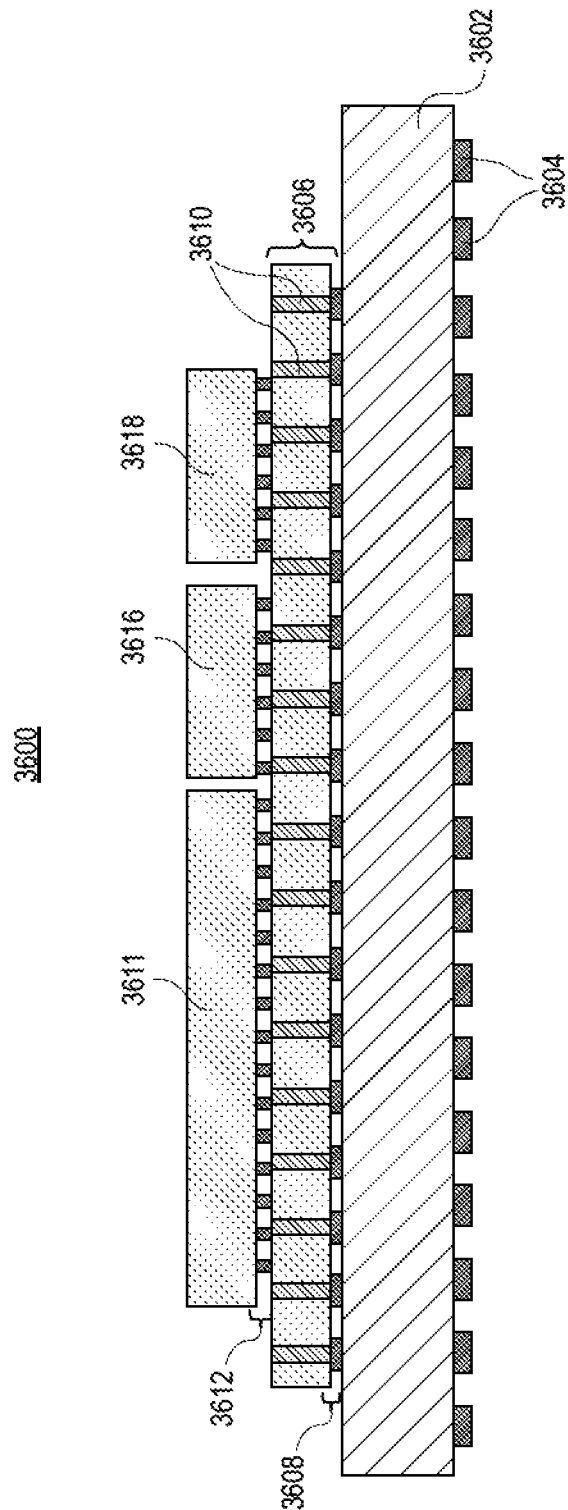
FIG. 36 illustrates a cross-sectional view of a GaN chiplet base die package, in accordance with an embodiment of the present disclosure.

In another example, a package substrate includes a GaN integrated with CMOS base die having other dies thereon. FIG. 36 illustrates a cross-sectional view of a GaN chiplet base die package 3600, in accordance with an embodiment of the present disclosure. The semiconductor package 3600 includes a package substrate 3602 having interconnects 3604 such as solder balls on a bottom surface thereof. The package substrate 3602 has a GaN power delivery base die 3606 on a top surface thereof. The GaN power delivery base die 3606 includes a GaN device layer and a Si-based CMOS layer, and may include through structure vias 3610. The GaN power delivery base die 3606 is coupled to the package substrate 3602 by a plurality of microbumps or interconnects 3608. One or more dies can be coupled to the GaN power delivery base die 3606. For example, in one embodiment, an IO complex die 3614, a graphics die 3616, and a cores die 3618 are coupled to the GaN power delivery base die 3606, e.g., by a plurality of microbumps or interconnects.

In a seventh aspect, back end of line (BEOL) embedded micro-voltage regulators are described.

To provide context, package or die integrated voltage regulators such as fully integrated voltage regulators (FIVR) enable significant improvement in processing power efficiency by enabling fast response to varying compute loads and by reducing ohmic power loss in a power path from a motherboard to a package. To provide the best possible transient and path loss performance, the regulator needs to be as close to the load as possible. Furthermore, it may be preferable to use a separate analog/high voltage process for the regulator in order to achieve the best possible conversion efficiency. At the full CPU core level, one of the best heterogeneous integration for such regulators is using an Omnidirectional-Interconnect (ODI), examples of which are described above. To further improve the efficiency, it may be preferable to have such regulation at a finer granularity within the processing core itself (e.g., to operate the different proprietary or unique units, which may be referred to as intellectual property units or IPs, at their optimum voltage levels at the current frequency). Currently, this is achieved through monolithic local power gates or on-die low dropout regulators (LDOs). However, they can suffer from performance limitations due to the requirement of using the same digital process technology as the CPU. In the present disclosure, implementations to address such issues through advanced heterogeneous integration of micro-regulator chiplets in processor die BEOL layers are described.

To provide further context, disadvantages of previous solutions include: (1) Regarding local power gates: they consume relatively small area and are relatively simple in design. However, the input power routing needs to be routed to the power gates on the die through all the metallization stack then routed back up to the power distribution layers. This can result in significant added resistance and routing blockage. Additionally, power gates do not allow voltage control which may impact the ON power efficiency of its associated IP. Furthermore, the power gates need to be made relatively large to have small resistance and to avoid thermal issues. This can consume area on the main die that may otherwise be better utilized by digital devices. (2) Regarding local LDOs: they consume larger area and require more complex design than power gates. However, they allow locally regulating the voltage to maximize the power efficiency for the given operating frequency. The monolithic implementation suffers from similar limitations as power gates. (3) Regarding local LDOs/FIVR/power gates using BEOL active devices: a recent approach to address the previous challenges involves enabling monolithic integration of active devices in the BEOL layers. Such BEOL devices include laser crystallized poly-silicon, carbon nanotubes or wide bandgap semiconductors such as InGaZnO (IGZO). However, to date, such devices do not possess comparable performance as crystalline devices for voltage regulation. As such, their main benefit is reducing the routing overhead at the expense of worse power delivery performance compared to monolithic implementations. Additionally, since depositing and processing such materials is typically performed over a whole wafer, it may result in significant utilization limitations.

In accordance with embodiments of the present disclosure, integration of specialized micro-chiplets implemented using a process optimized for power delivery (e.g., GaN or other III-V devices in combination with power delivery passives) within the BEOL layers of the processor is described. In an example, such a structure can enable significantly improved power efficiency and design simplicity for client, server and/or graphics applications by separating the power and logic processes. This can be achieved through: (1) enabling optimum power efficiency at the IP level; (2) significantly reducing (or eliminating) the routing blockage and additional resistive losses compared to monolithically integrated regulators/power gates; and/or (3) a die level process enabling selecting an optimum device technology and associated passives to provide a co-optimized full system.

One or more embodiments described herein build on concepts regarding the integration of active chiplets within one or more BEOL layers and the associated high-power devices, an example of which is described below in association with FIG. 37. A chiplet can support direct connections to a main die lower metal layers through the bottom interface and connections to the top metal layers through the top interface. In some implementations, one of the interfaces may not have electrical contacts and the connections are made through the top interface. This may help reduce the cost by avoiding the need to fabricate TSVs in the chiplet.

Figure 37:
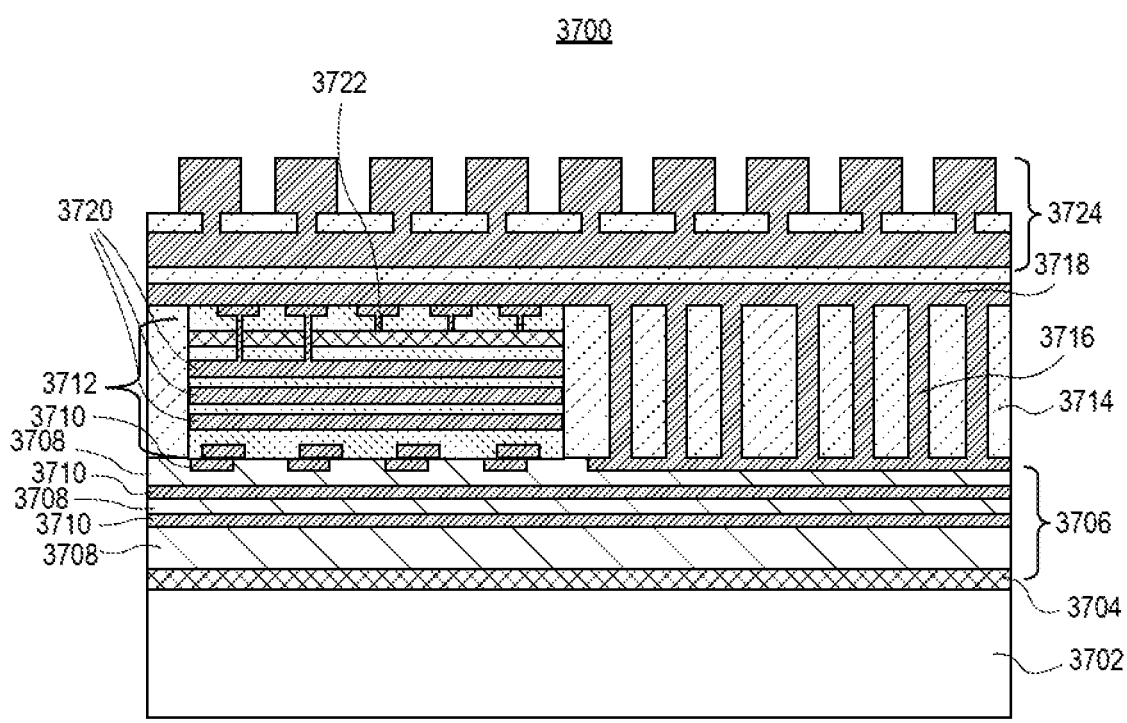
FIG. 37 illustrates a cross-sectional view of an integrated circuit structure including an integrated micro chiplet structure, in accordance with an embodiment of the present disclosure.

As an exemplary architecture, FIG. 37 illustrates a cross-sectional view of an integrated circuit structure including an integrated micro chiplet structure, in accordance with an embodiment of the present disclosure.

Referring to FIG. 37, an integrated circuit structure 3700 includes a substrate or wafer 3702, such as a silicon substrate, having a passivation layer 3704 thereon. Lower BEOL layers 3706 include alternating dielectric layers 3708 and metallization layers 3710. A dielectric or insulating layer or body 3714 is on the lower BEOL layers 3706. An intermediate metallization layer 3718 is on the dielectric or insulating layer or body 3714. Through vias 3716 extend through the dielectric or insulating layer or body 3714, and couple the intermediate metallization layer 3718 to the lower BEOL layers 3706. A micro chiplet structure 3712 is in a cavity in the dielectric or insulating layer or body 3714. In one embodiment, the micro chiplet structure 3712 is directly between and electrically coupled to the intermediate metallization layer 3718 and to the lower BEOL layers 3706. In an embodiment, the micro chiplet structure 3712 includes metallization layers 3720 and a passivation layer 3722, but does not include through vias. Upper metallization layers, dielectric layers and external contacts (shown collectively as 3724) are included on the intermediate metallization layer 3718.

In relation to some embodiments, micro-regulator integration and benefits are described. As an example of an implementation of micro-regulators/power gates as compared to a monolithic implementation, FIG. 38 illustrates cross-sectional views of (a) a structure with a monolithic implementation and (b) a structure with integrated micro-regulators/power gates using BEOL embedded micro-chiplets, in accordance with an embodiment of the present disclosure.

Figure 38:
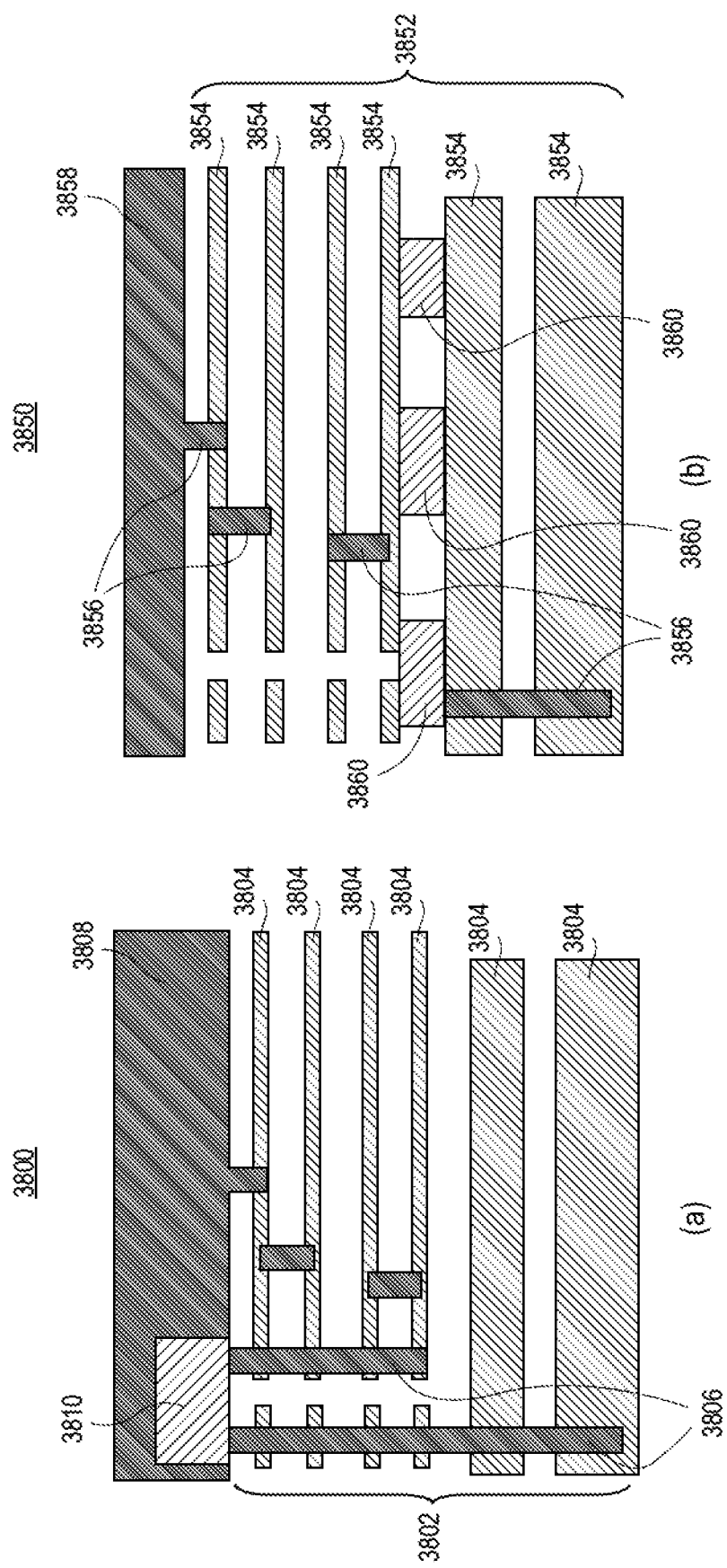
FIG. 38 illustrates cross-sectional views of (a) a structure with a monolithic implementation and (b) a structure with integrated micro-regulators/power gates using BEOL embedded micro-chiplets, in accordance with an embodiment of the present disclosure.

Referring to part (a) of FIG. 38, a structure 3800 having monolithic regulators requires power to be routed from top ones of a plurality of metal layers 3804 through all of an interconnect stack 3802 by vias 3806 to an IP region 3808 having a device 3810 where it is switched (e.g., for power gates, PG) or regulated (e.g., for LDOs). This approach can be associated with several issues: (1) some of the valuable low level fine pitch routing resources are consumed to allow low resistance and high reliability routing to the power devices; (2) even with such provisions the additional resistive parasitics can remain significant; (3) the power gates/LDOs need to use the main die process which is typically not well optimized for power; (4) the PG or LDO are relatively high power density areas which may require fabricating the overall PG/LDO device area larger to avoid local concentrated hot spots that may impact performance or reliability; and/or (5) such devices may consume significant die area of relatively high cost advanced node process.

In an embodiment, with reference to part (b) of FIG. 38, a structure 3850 includes metal layers 3854 in an interconnect stack 3852 having by vias 3856 there through. An IP region 3858 is above the interconnect stack 3852. BEOL embedded micro-chiplets 3860, such as GaN microchiplets, are included in the interconnect stack 3852.

With reference again to part (b) of FIG. 38, in an embodiment, by integrating power conversion chiplets at the interface, many of the issues described in association with part (a) of FIG. 38 can be resolved: (1) the routing consumption is significantly reduced; (2) the resistive parasitics are almost eliminated; (3) different process may be used for such chiplets that may be better optimized for power; (4) the thermal issues is reduced due to the higher efficiency of the optimized devices leading to reduced heat and, since the devices are closer to the thick BEOL layers, they may use some of the power planes as heat spreaders; and/or (5) the main wafer silicon can be better utilized.

In relation to some embodiments, micro regulator topologies and implementations are described. Regarding a low dropout regulator (LDO), in one or more embodiments, using devices with improved power delivery FOM such as GaN in the configuration discussed in the previous section can allow smaller device size and improved efficiency since the undesired voltage drop across the LDO is reduced. Furthermore, fast switching GaN devices may allow the LDO to operate in charge pump mode where it constantly monitors the output capacitor voltage and turns on when it drops below certain level. This approach allows much improved power efficiency and can be enabled by the low switching parasitics of GaN or other III-V devices.

Regarding power gates, in one or more embodiments, chiplets for power gates can provide the benefits described above. The fast and low power switching may allow improved power control granularity (e.g., turn off and on much more often compared to regular power gates). This can enable improved overall power efficiency since the power gates do not need to remain ON in anticipation for incoming loads but rather more dynamically turn ON as the need arises.

Figure 39:
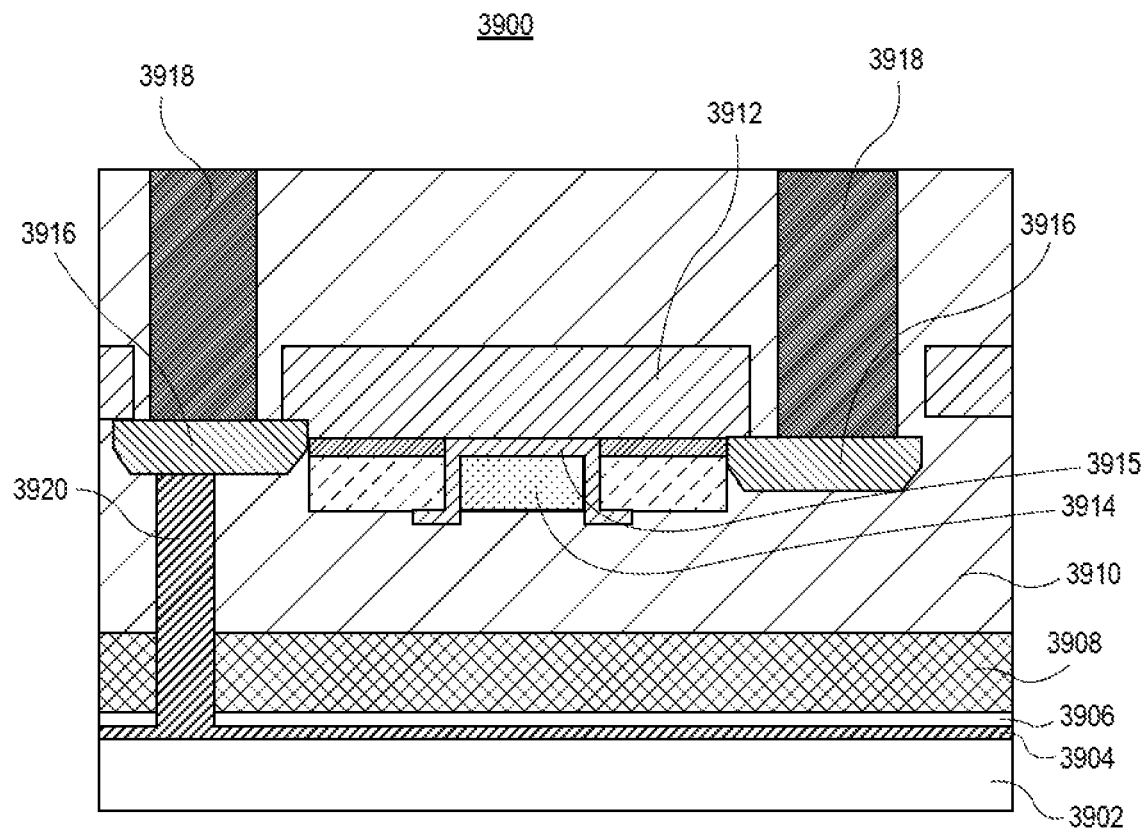
FIG. 39 illustrates a cross-sectional view of a GaN bottom gated device and associated metal-insulator-metal (MIM) capacitor and interconnect, in accordance with an embodiment of the present disclosure.

Regarding switched capacitors, in one or more embodiments, the improved FOM can enable higher efficiency switching capacitors especially at low power and/or if lower ripple voltage is needed. There can be special benefits for switched capacitor as BEOL devices since a MIM capacitor layer is typically at the BEOL and very close to the micro chiplet. This arrangement can allow for much lower interconnect parasitics and routing requirements compared to standard on-die switching capacitors. Furthermore, in an embodiment, the chiplet itself has an integrated MIM capacitor that can allow for higher density and can reduce the requirements on the on-die switched capacitor. Several possible locations for the on-chiplet MIM capacitor are possible. In one embodiment, an exemplary location that is easy to integrate and provides good flexibility in the material selection is shown in FIG. 39, described below. A MIM capacitor is integrated on the chiplet substrate under a buried oxide layer. The substrate may be the same substrate as the one used for device build-up or may be a hybrid bonded substrate attached after the device build up is completed.

FIG. 39 illustrates a cross-sectional view of a GaN bottom gated device and associated metal-insulator-metal (MIM) capacitor and interconnect, in accordance with an embodiment of the present disclosure.

Referring to FIG. 39, an integrated circuit structure 3900 includes a buried oxide layer 3908, such as a silicon oxide layer, above a substrate 3902, such as a silicon substrate. A metal-insulator-metal (MIM) capacitor structure 3904 is included below an upper portion 3906 of the substrate 3902. A dielectric layer 3910, such as a low-k dielectric layer, is on the buried oxide layer 3908. A gate structure including a gate electrode 3914 and gate dielectric layer 3915, which may be within a trench in an insulating structure as is depicted, are within the dielectric layer 3910. The gate structure can be on, or within, or through, a polarization layer as is depicted, such as a layer of aluminum gallium nitride (AlGaN), aluminum indium nitride (AlInN), aluminum indium gallium nitride (AlInGaN) or indium gallium nitride (InGaN). A GaN layer 3912 is on the polarization layer. Source or drain structures 3916 are on either side of the gate structure. Source or drain contacts 3918 extend from a top of integrated circuit structure 3900. A gate contact can be formed in a trench from a top of integrated circuit structure 3900 at a location into or out of the page from the perspective shown in FIG. 39. A metal interconnect via 3920 couples one of the source or drain structures 3916 to the 3904.

In relation to some embodiments, Buck regulators/LC regulators are described. Buck regulators can offer the best performance for CPU compute requirements (e.g., good efficiency over wide operating voltage, fast transient response, low ripple etc.). A chiplet approach can lend itself favorably to standard FIVR implementations with on-package inductors, an exemplary structure of which is described below in association with FIG. 40. In such cases, the FIVR microchiplets may be operated in tandem to provide more uniform voltage distribution across the core and avoid the typical cantilever IR drop. It is to be appreciated that some stat-of-the-art designs split the regulators in two across the core to address the IR drop issue. However, with the FIVR microchiplets, such an option may be extended further to finer granularity and allow improved power efficiency.

Figure 40:
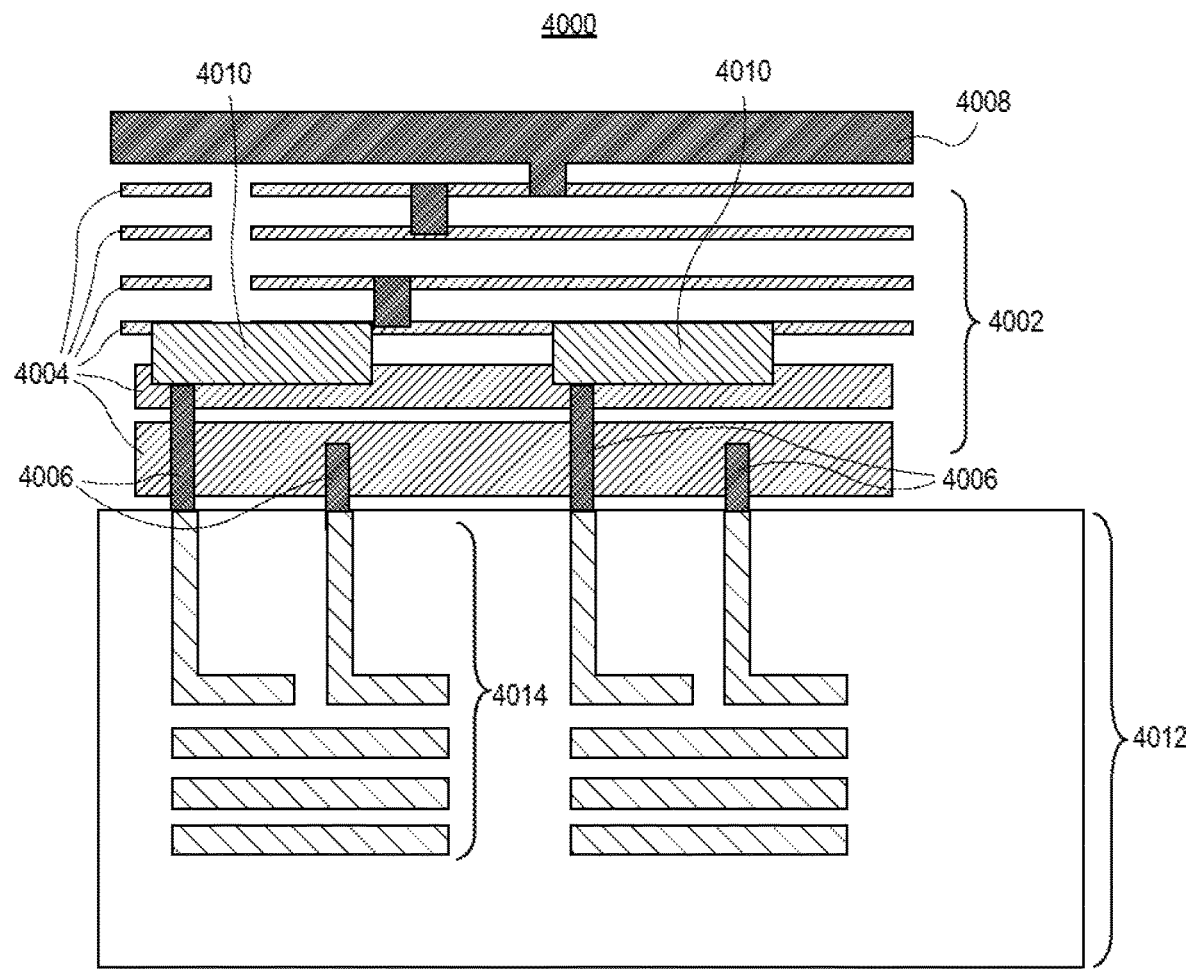
FIG. 40 illustrates a cross-sectional view of a structure including BEOL embedded GaN fully integrated voltage regulator (FIVR) micro-chiplets, in accordance with an embodiment of the present disclosure.

FIG. 40 illustrates a cross-sectional view of a structure including BEOL embedded GaN fully integrated voltage regulator (FIVR) micro-chiplets, in accordance with an embodiment of the present disclosure.

Referring to FIG. 40, a structure 4000 includes metal layers 4004 in an interconnect stack 4002 having by vias 4006 there through. An IP region 4008 is above the interconnect stack 4002. BEOL GaN FIVR micro-chiplets 4010 are included in the interconnect stack 4002. The interconnect stack 4002 is on or coupled to a substrate or layer 4012 having inductor structures 4014 therein.

In relation to some embodiments, on-die thin film magnetic inductors can allow for further disaggregation and avoid size and area limitations associated with on-package inductors. An example is described below in association with FIG. 41. In this example, a full magnetic loop may be formed around/through the chiplet and enable much smaller overall form factor and avoid the need to bump out to the package. The microchiplet may also include input and/or output capacitor that may further simplify the design for the rest of the chip. The magnetic inductors may be used in conjunction with package inductors, e.g., the on-die inductors may be used for low power and package inductors use for high power.

Figure 41:
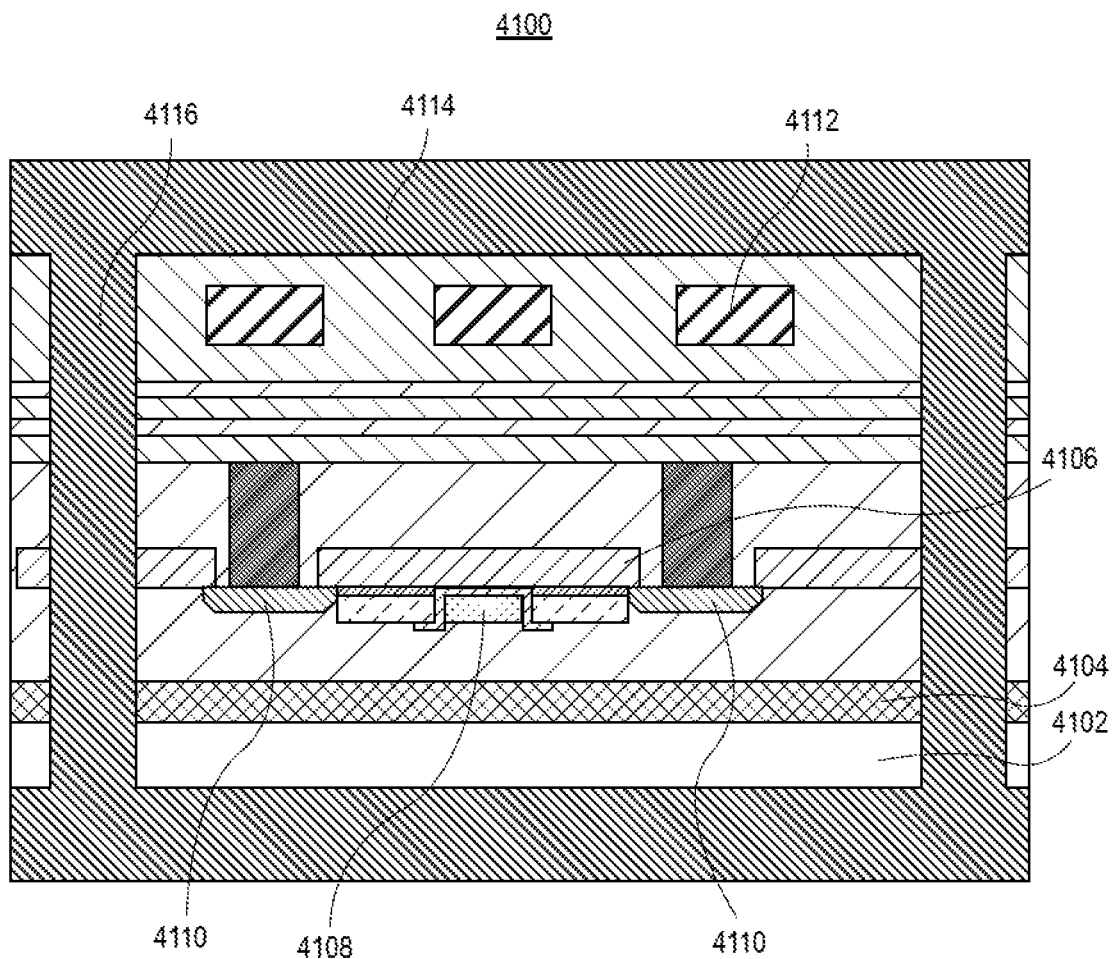
FIG. 41 illustrates a cross-sectional view of a GaN bottom gated device and associated FIVR providing a FIVR micro-chiplet, in accordance with an embodiment of the present disclosure.

FIG. 41 illustrates a cross-sectional view of a GaN bottom gated device and associated FIVR providing a FIVR microchiplet, in accordance with an embodiment of the present disclosure.

Referring to FIG. 41, an integrated circuit structure 4100 includes a buried oxide layer 4104, such as a silicon oxide layer, above a substrate 4102, such as a silicon substrate. A dielectric layer, such as a low-k dielectric layer, is on the buried oxide layer 4104. A gate structure including a gate electrode 4114 and gate dielectric layer, which may be within a trench in an insulating structure as is depicted, are within the dielectric layer. The gate structure can be on, or within, or through, a polarization layer as is depicted, such as a layer of aluminum gallium nitride (AlGaN), aluminum indium nitride (AlInN), aluminum indium gallium nitride (AlInGaN) or indium gallium nitride (InGaN). A GaN layer 4106 is on the polarization layer. Source or drain structures 4110 are on either side of the gate structure. Source or drain contacts can extend from a top of integrated circuit structure 4100. A gate contact can be formed in a trench from a top of integrated circuit structure 4100 at a location into or out of the page from the perspective shown in FIG. 41. Power traces/inductor loops 4112 are included above the GaN layer 4106. Magnetic laminations 4114 are at a bottom and at a top of the structure 4100. Magnetic vias 4116 couple the magnetic laminations 4114 at the bottom and at the top of the structure 4100.

In relation to some embodiments, microchiplet construction is described. A chiplet may be manufactured on any favorable semiconductor and associated build up layers. It may be a single device strata monolithic chip or may have middle strata or multi-strata construction, as example of which is described below in association with FIG. 42, which may help with providing connections to both sides of the chiplet. This arrangement may be particularly useful in the proposed configuration since control signals will be come from the main die using relatively small vias and the power switching terminals will be connected to the other side of the BEOL layers (facing the package), allowing very low resistance interconnect to the package (e.g., for inductors) or to the top BEOL layers (for power distribution).

Figure 42:
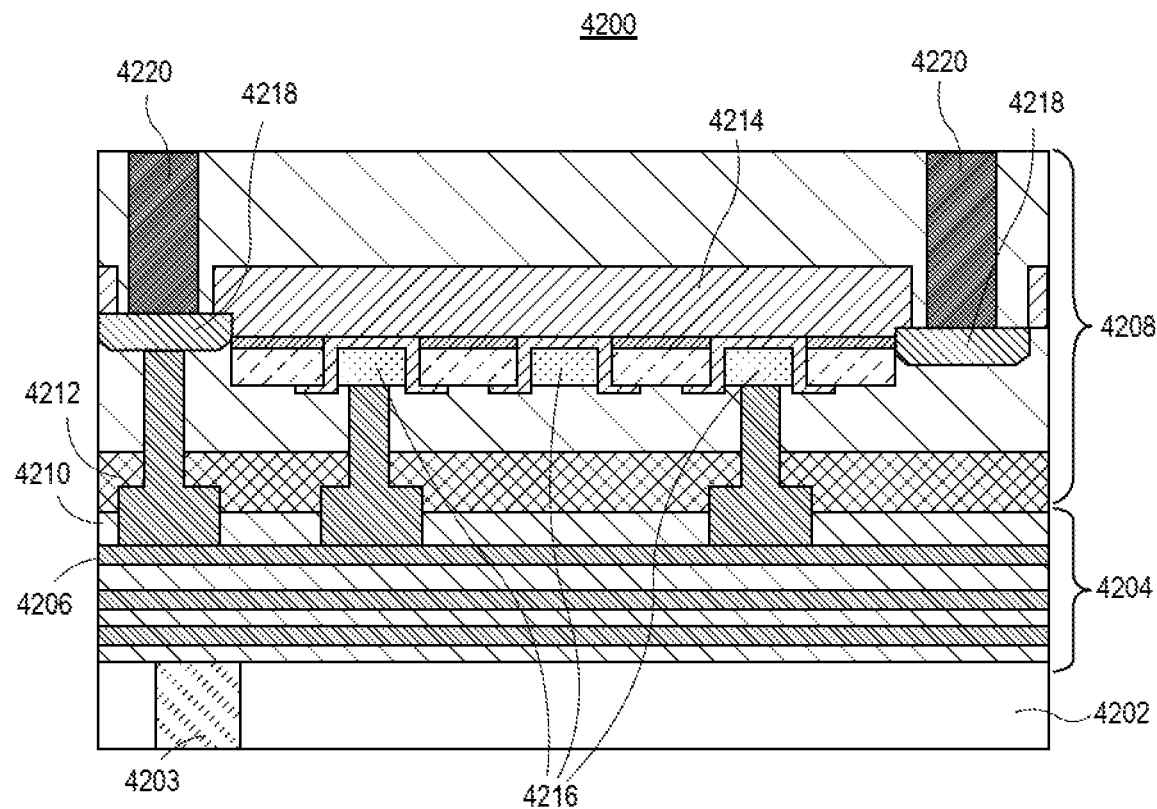
FIG. 42 illustrates a cross-sectional view of a GaN bottom gated multi-gate architecture with a devices-middle construction allowing connections to both sides, in accordance with an embodiment of the present disclosure.

FIG. 42 illustrates a cross-sectional view of a GaN bottom gated multi-gate architecture with a devices-middle construction allowing connections to both sides, in accordance with an embodiment of the present disclosure.

Referring to FIG. 42, an integrated circuit structure 4200 includes a substrate 4202, such as a silicon substrate, having a through silicon via (TSV) structure 4203 there through. An interconnect structure 4204 is over the substrate 4202. The interconnect structure includes metallization layers 4206. A GaN-based structure 4208 is over the interconnect structure 4204. A hybrid bonding interface 4210, which may include conductive bumps, pads, pillars, etc., is between the GaN-based structure 4208 and the interconnect structure 4204. A buried oxide layer 4212, such as a silicon oxide layer, is above the hybrid bonding interface 4210. A dielectric layer, such as a low-k dielectric layer, is on the buried oxide layer 4212. A plurality of gate structures 4216 is within a trench in an insulating structure. The gate structures 4216 are on, or within, or through, a polarization layer. A GaN layer 4214 is on the polarization layer. Source or drain structures 4218 are on either side of the plurality of gate structures 4216. Source or drain contacts 4220 extend from a top of integrated circuit structure 4200. Gate contacts can be formed in trenches from a top of integrated circuit structure 4200 at a location into or out of the page from the perspective shown in FIG. 42.

It is to be appreciated that the layers and materials described above in association with back end of line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers may be formed by CVD, PVD, or by other deposition methods.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 43:
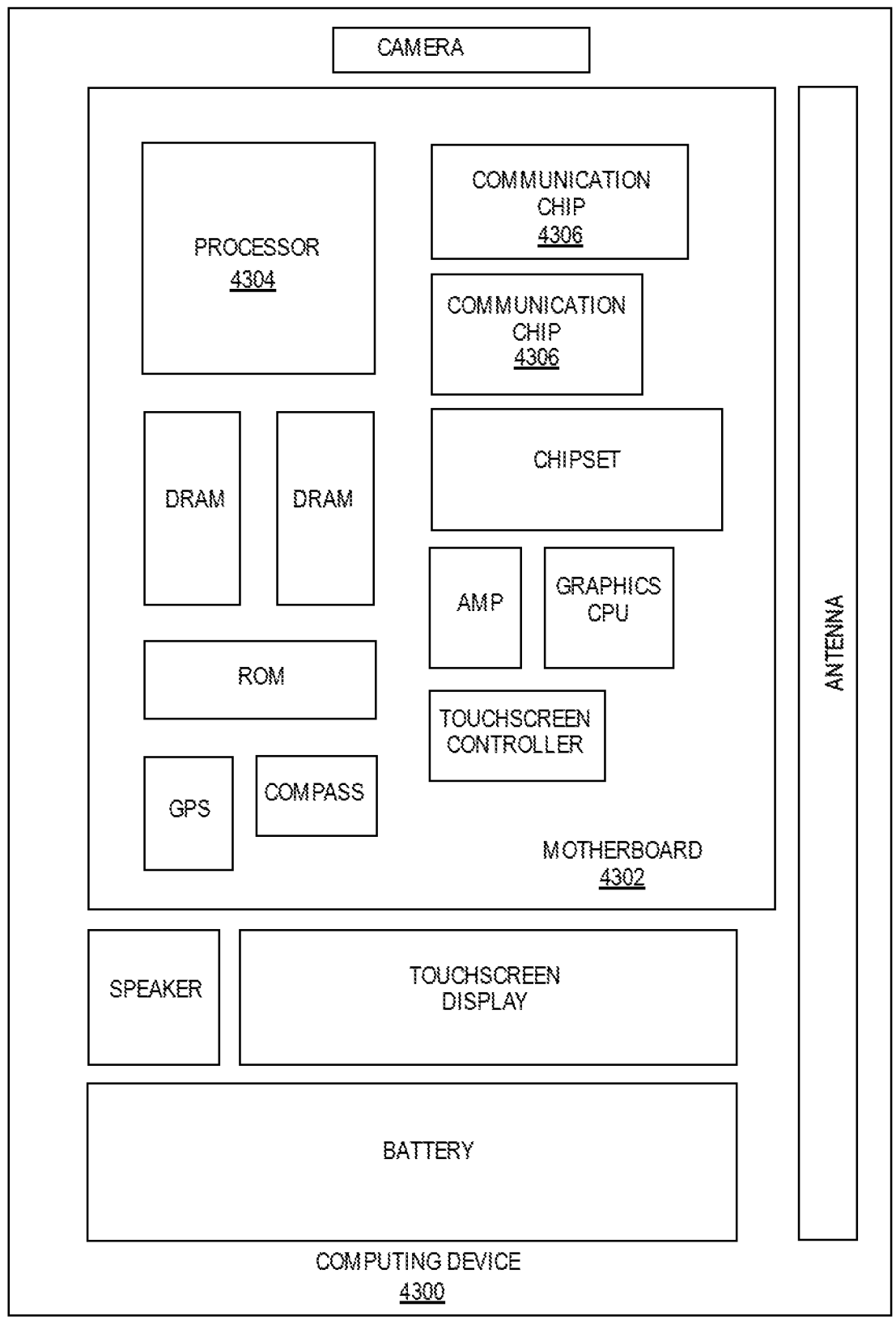
FIG. 43 illustrates a computing device in accordance with one implementation of the disclosure.

FIG. 43 illustrates a computing device 4300 in accordance with one implementation of the disclosure. The computing device 4300 houses a board 4302. The board 4302 may include a number of components, including but not limited to a processor 4304 and at least one communication chip 4306. The processor 4304 is physically and electrically coupled to the board 4302. In some implementations the at least one communication chip 4306 is also physically and electrically coupled to the board 4302. In further implementations, the communication chip 4306 is part of the processor 4304.

Depending on its applications, computing device 4300 may include other components that may or may not be physically and electrically coupled to the board 4302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 4306 enables wireless communications for the transfer of data to and from the computing device 4300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 4306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 4300 may include a plurality of communication chips 4306. For instance, a first communication chip 4306 may be dedicated to shorter range wireless communications such as Wi-Fi and Bluetooth and a second communication chip 4306 may be dedicated to longer range wireless communications such as GPS, EDGE, GPRS, CDMA, WiMAX, LTE, Ev-DO, and others.

The processor 4304 of the computing device 4300 includes an integrated circuit die packaged within the processor 4304. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 4306 also includes an integrated circuit die packaged within the communication chip 4306. In accordance with another implementation of the disclosure, the integrated circuit die of the communication chip is built in accordance with implementations of the disclosure.

In further implementations, another component housed within the computing device 4300 may contain an integrated circuit die built in accordance with implementations of embodiments of the disclosure.

In various embodiments, the computing device 4300 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 4300 may be any other electronic device that processes data.

Figure 44:
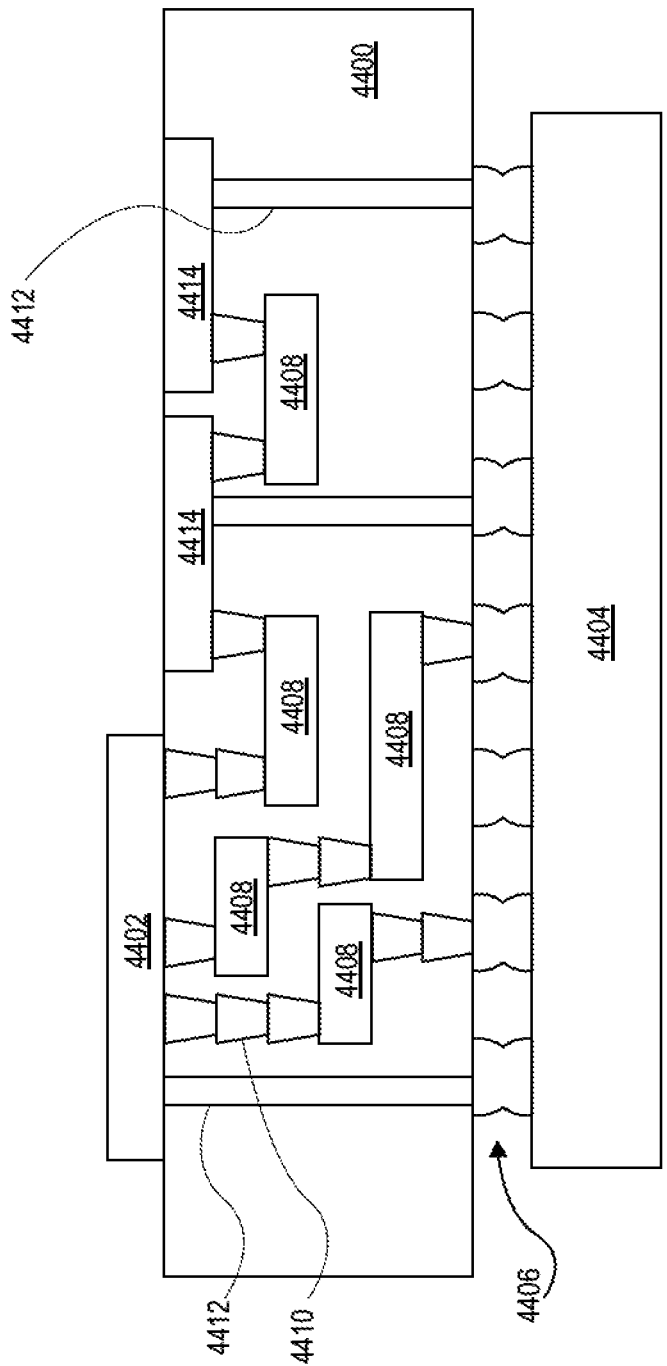
FIG. 44 illustrates an interposer that includes one or more embodiments of the disclosure.

FIG. 44 illustrates an interposer 4400 that includes one or more embodiments of the disclosure. The interposer 4400 is an intervening substrate used to bridge a first substrate 4402 to a second substrate 4404. The first substrate 4402 may be, for instance, an integrated circuit die. The second substrate 4404 may be, for instance, a memory module, a computer motherboard, or another integrated circuit die. Generally, the purpose of an interposer 4400 is to spread a connection to a wider pitch or to reroute a connection to a different connection. For example, an interposer 4400 may couple an integrated circuit die to a ball grid array (BGA) 4406 that can subsequently be coupled to the second substrate 4404. In some embodiments, the first and second substrates 4402/4404 are attached to opposing sides of the interposer 4400. In other embodiments, the first and second substrates 4402/4404 are attached to the same side of the interposer 4400. And in further embodiments, three or more substrates are interconnected by way of the interposer 4400.

The interposer 4400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 4408 and vias 4410, including but not limited to through-silicon vias (TSVs) 4412. The interposer 4400 may further include embedded devices 4414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 4400. In accordance with embodiments of the disclosure, apparatuses or processes disclosed herein may be used in the fabrication of interposer 4400 or in the fabrication of components included in the interposer 4400.

Figure 45:
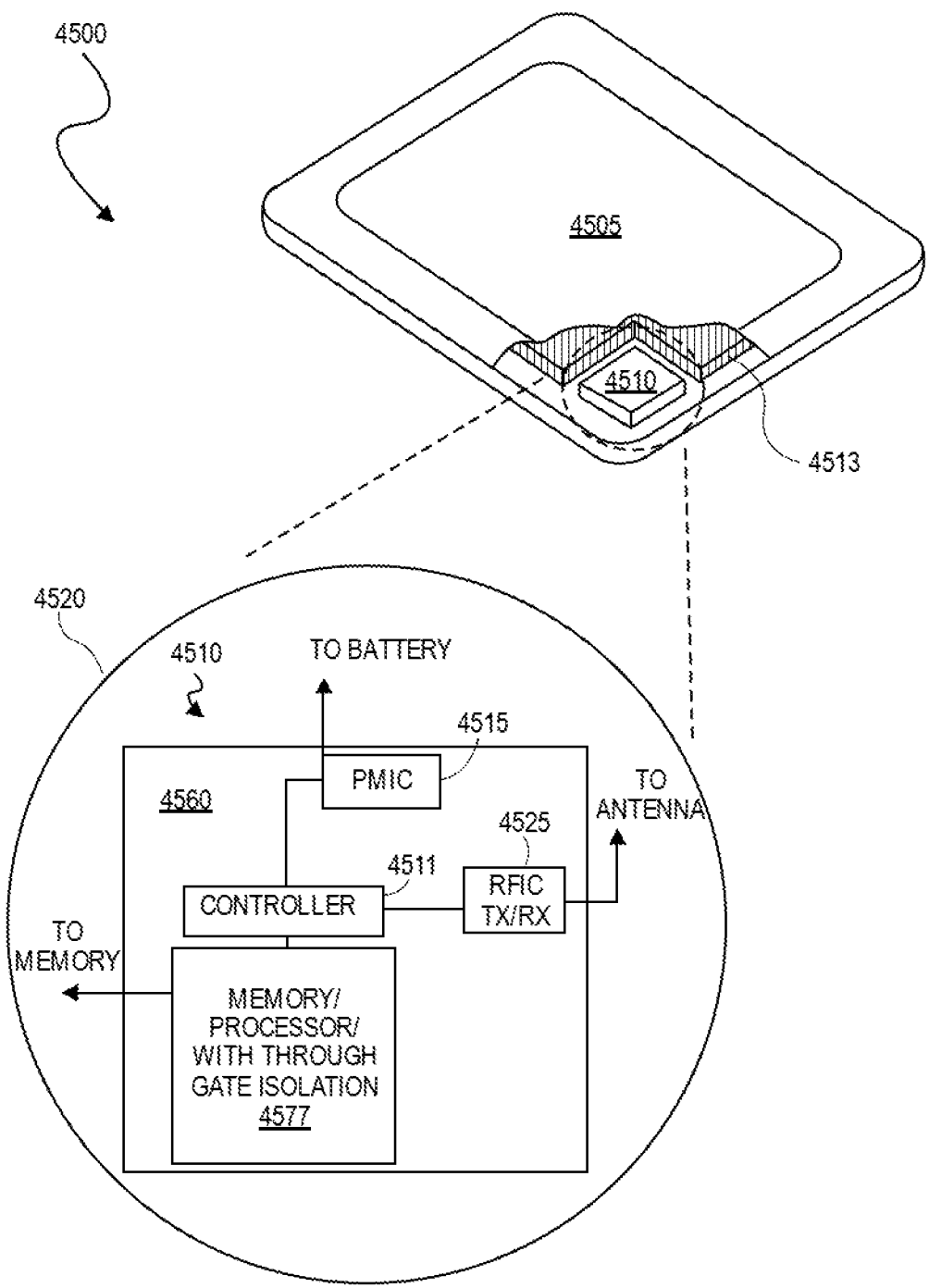
FIG. 45 is an isometric view of a mobile computing platform employing an IC fabricated according to one or more processes described herein or including one or more features described herein, in accordance with an embodiment of the present disclosure.

FIG. 45 is an isometric view of a mobile computing platform 4500 employing an integrated circuit (IC) fabricated according to one or more processes described herein or including one or more features described herein, in accordance with an embodiment of the present disclosure.

The mobile computing platform 4500 may be any portable device configured for each of electronic data display, electronic data processing, and wireless electronic data transmission. For example, mobile computing platform 4500 may be any of a tablet, a smart phone, laptop computer, etc. and includes a display screen 4505 which in the exemplary embodiment is a touchscreen (capacitive, inductive, resistive, etc.), a chip-level (SoC) or package-level integrated system 4510, and a battery 4513. As illustrated, the greater the level of integration in the system 4510 enabled by higher transistor packing density, the greater the portion of the mobile computing platform 4500 that may be occupied by the battery 4513 or non-volatile storage, such as a solid state drive, or the greater the transistor gate count for improved platform functionality. Similarly, the greater the carrier mobility of each transistor in the system 4510, the greater the functionality. As such, techniques described herein may enable performance and form factor improvements in the mobile computing platform 4500.

The integrated system 4510 is further illustrated in the expanded view 4520. In the exemplary embodiment, packaged device 4577 includes at least one memory chip (e.g., RAM), or at least one processor chip (e.g., a multi-core microprocessor and/or graphics processor) fabricated according to one or more processes described herein or including one or more features described herein. The packaged device 4577 is further coupled to the board 4560 along with one or more of a power management integrated circuit (PMIC) 4515, RF (wireless) integrated circuit (RFIC) 4525 including a wideband RF (wireless) transmitter and/or receiver (e.g., including a digital baseband and an analog front end module further includes a power amplifier on a transmit path and a low noise amplifier on a receive path), and a controller thereof 4511. Functionally, the PMIC 4515 performs battery power regulation, DC-to-DC conversion, etc., and so has an input coupled to the battery 4513 and with an output providing a current supply to all the other functional modules. As further illustrated, in the exemplary embodiment, the RFIC 4525 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 4577 or within a single IC (SoC) coupled to the package substrate of the packaged device 4577.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include gallium nitride (GaN) three-dimensional integrated circuit technology.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a layer including gallium and nitrogen, a plurality of gate structures over the layer including gallium and nitrogen, a source region on a first side of the plurality of gate structures, a drain region on a second side of the plurality of gate structures, the second side opposite the first side, and a drain field plate above the drain region wherein the drain field plate is coupled to the source region.

Example embodiment 2: The integrated circuit structure of example embodiment 1, wherein a voltage associated with the drain field plate is different from a gate voltage associated with the plurality of gate structures.

Example embodiment 3: The integrated circuit structure of example embodiment 1, wherein the drain field plate is coupled to ground.

Example embodiment 4: The integrated circuit structure of example embodiment 1, 2 or 3, wherein the drain field plate has a top surface, wherein the top surface of the drain field plate is substantially coplanar with a top surface of the plurality of gate structures.

Example embodiment 5: The integrated circuit structure of example embodiment 1, 2, 3 or 4, wherein one or more of the plurality of gate structures has a T-shaped gate structure.

Example embodiment 6: The integrated circuit structure of example embodiment 1, 2, 3, 4 or 5, further including a drain metal contact wherein at least a portion of the drain field plate is located laterally between the drain metal contact and the plurality of gate structures.

Example embodiment 7: An integrated circuit structure includes a layer including gallium and nitrogen, the layer including gallium and nitrogen above a buried oxide layer, the buried oxide layer above a substrate. One or more gate structures are beneath the layer including gallium and nitrogen. A source region is laterally adjacent the layer including gallium and nitrogen on a first side of the one or more gate structures. A drain region is laterally adjacent the layer including gallium and nitrogen on a second side of the one or more gate structures, the second side opposite the first side.

Example embodiment 8: The integrated circuit structure of example embodiment 7, further including a source contact extending from above the GaN layer to the source region, and a drain contact extending from above the GaN layer to the drain region.

Example embodiment 9: The integrated circuit structure of example embodiment 7 or 8, wherein the one or more gate structures is a plurality of gate structures.

Example embodiment 10: The integrated circuit structure of example embodiment 7 or 8, wherein the one or more gate structures is a single gate structure.

Example embodiment 11: The integrated circuit structure of example embodiment 7, 8, 9 or 10, wherein at least one of the one or more gate structures has a T-shaped gate structure.

Example embodiment 12: An integrated circuit structure includes a layer including gallium and nitrogen, the layer including gallium and nitrogen above a buried oxide layer, the buried oxide layer above a substrate. A source region is laterally adjacent the layer including gallium and nitrogen on a first side of the gate structure. A drain region is laterally adjacent the layer including gallium and nitrogen on a second side of the gate structure, the second side opposite the first side.

Example embodiment 13: The integrated circuit structure of example embodiment 12, further including a source contact extending from above the layer including gallium and nitrogen to the source region, and a drain contact extending from above the GaN layer to the drain region.

Example embodiment 14: The integrated circuit structure of example embodiment 12 or 13, further including a through structure via (TSV) adjacent the layer including gallium and nitrogen.

Example embodiment 15: The integrated circuit structure of example embodiment 14, wherein the through structure via (TSV) is coupled to a ground plane below the layer including gallium and nitrogen.

Example embodiment 16: The integrated circuit structure of example embodiment 12 or 13, further including a T-shaped gate contact coupled to the gate structure.

Example embodiment 17: The integrated circuit structure of example embodiment 12, 13 or 16, further including an air gap above the layer including gallium and nitrogen.

Example embodiment 18: An integrated circuit structure includes a layer or substrate having a first region and a second region, the layer or substrate including gallium and nitrogen. A GaN-based device is in or on the first region of the layer or substrate including gallium and nitrogen. A CMOS-based device is over the second region of the layer or substrate including gallium and nitrogen. The CMOS-based device includes a channel layer or channel structure bonded to the GaN layer or substrate by a bonding layer.

Example embodiment 19: The integrated circuit structure of example embodiment 18, further including an interconnect structure coupling the GaN-based device and the CMOS-based device.

Example embodiment 20: The integrated circuit structure of example embodiment 18 or 19, wherein the GaN-based device includes a polarization layer, source or drain structures on first and second sides of the polarization layer, and a gate structure on, partially through, or entirely through the polarization layer.

Example embodiment 21: The integrated circuit structure of example embodiment 18, 19 or 20, wherein the channel layer or channel structure of the CMOS-based device includes an NMOS region above a PMOS region.

Example embodiment 22: The integrated circuit structure of example embodiment 21, wherein the PMOS region includes a vertical stack of horizontal nanowires or nanoribbons including silicon and germanium, a gate dielectric around the vertical stack of horizontal nanowires or nanoribbons including silicon and germanium, and gate electrode around the gate dielectric.

Example embodiment 23: The integrated circuit structure of example embodiment 21 or 22, wherein the NMOS region includes a vertical stack of horizontal nanowires or nanoribbons including silicon, a gate dielectric around the vertical stack of horizontal nanowires or nanoribbons including silicon, and gate electrode around the gate dielectric.

Example embodiment 24: The integrated circuit structure of example embodiment 18, 19 or 20, wherein the channel layer or channel structure of the CMOS-based device includes a PMOS region above an NMOS region.

Example embodiment 25: The integrated circuit structure of example embodiment 24, wherein the PMOS region includes a vertical stack of horizontal nanowires or nanoribbons including silicon and germanium, a first gate dielectric around the vertical stack of horizontal nanowires or nanoribbons including silicon and germanium, and a first gate electrode around the first gate dielectric, and wherein the NMOS region includes a vertical stack of horizontal nanowires or nanoribbons including silicon, a second gate dielectric around the vertical stack of horizontal nanowires or nanoribbons including silicon, and a second gate electrode around the gate dielectric.

Example embodiment 26: A semiconductor package includes a package substrate. A first integrated circuit (IC) die is coupled to the package substrate. The first IC die includes a GaN device layer and a Si-based CMOS layer.

Example embodiment 27: The semiconductor package of example embodiment 26, wherein the first IC die is coupled to the package substrate by a plurality of first interconnects.

Example embodiment 28: The semiconductor package of example embodiment 26 or 27, wherein the first IC die includes through structure vias.

Example embodiment 29: The semiconductor package of example embodiment 26, 27 or 28, further including a second IC die coupled to the package substrate.

Example embodiment 30: The semiconductor package of example embodiment 29, further including a plurality of second interconnects coupled to and extending from the package substrate, and a third IC die over and coupled to the first IC die and to the plurality of second interconnects, wherein the third IC die is coupled to the first IC die by through structure vias of the first IC die.

Example embodiment 31: The semiconductor package of example embodiment 30, wherein the plurality of second interconnects is located between the first and second IC dies.

Example embodiment 32: The semiconductor package of example embodiment 30 or 31, wherein the first IC die includes a GaN power delivery chiplet, wherein the second IC die includes a base die chiplet, and wherein the third IC die includes a complex compute die.

Example embodiment 33: The semiconductor package of example embodiment 26, 27, 28 or 29, further including one or more IC dies coupled to a top surface of the first IC die.

Example embodiment 34: The semiconductor package of example embodiment 33, wherein at least one of the one or more IC dies is an IC die selected from the group consisting of an IO complex die, a graphics die, and a compute cores die.

Example embodiment 35: A semiconductor package includes a package substrate having a plurality of dielectric layers and metallization layers. A cavity is within the plurality of dielectric layers and metallization layers of the package substrate. A GaN power delivery chiplet is in the cavity of the package substrate. The GaN power delivery chiplet includes a GaN device layer and a Si-based CMOS layer. A first die is coupled to the package substrate and to the GaN power delivery chiplet. A second die is coupled to the package substrate and to the GaN power delivery chiplet.

Example embodiment 36: The semiconductor package of example embodiment 35, wherein the first die is a compute complex die, and the second die is a companion die selected from the group consisting of an analog IC or an RF IC.

Example embodiment 37: The semiconductor package of example embodiment 35 or 36, further including one or more package thin film capacitors embedded in the package substrate.

Example embodiment 38: The semiconductor package of example embodiment 37, wherein a first of the package thin film capacitors is between the compute complex die and the GaN power delivery chiplet.

Example embodiment 39: An integrated circuit structure includes a substrate. A lower back end of line (BEOL) structure is above the substrate, the BEOL structure including alternating dielectric layers and metallization layers. An insulating layer is on the lower BEOL structure. An intermediate metallization layer is on the insulating layer. A micro chiplet structure is in a cavity in the insulating layer. An upper BEOL structure including a dielectric layer, a metallization layer and external contacts is on the intermediate metallization layer.

Example embodiment 40: The integrated circuit structure of example embodiment 39, wherein the micro chiplet structure is directly between and electrically coupled to the intermediate metallization layer and to the lower BEOL structure.

Example embodiment 41: The integrated circuit structure of example embodiment 39 or 40, wherein the micro chiplet structure is a GaN-based structure.

Example embodiment 42: The integrated circuit structure of example embodiment 39, 40 or 41, wherein the micro chiplet structure includes metallization layers and a passivation layer.

Example embodiment 43: The integrated circuit structure of example embodiment 39, 40, 41 or 42, wherein the micro chiplet structure does not include through vias.

Example embodiment 44: The integrated circuit structure of example embodiment 39, 40, 41, 42 or 43, further including through vias extending through the insulating layer.

Example embodiment 45: The integrated circuit structure of example embodiment 44, wherein the through vias electrically couple the intermediate metallization layer and the lower BEOL structure.

What is claimed is:

1. A semiconductor package, comprising:
a package substrate;
a first integrated circuit (IC) die coupled to the package substrate, the first IC die comprising a GaN device layer and a Si-based CMOS layer, wherein the package substrate is a ceramic package substrate or an organic package substrate;
a plurality of interconnects coupled to and extending from the package substrate; and
a second IC die over and coupled to the first IC die and to the plurality of interconnects, wherein the second IC die is coupled to the first IC die by through structure vias of the first IC die.

2. The semiconductor package of claim 1, wherein the first IC die is coupled to the package substrate by a plurality of second interconnects.

3. The semiconductor package of claim 1, further comprising:
a third IC die coupled to the package substrate.

4. The semiconductor package of claim 3, wherein the plurality of interconnects is located between the first and third IC dies.

5. The semiconductor package of claim 4, wherein the first IC die comprises a GaN power delivery chiplet, wherein the third IC die comprises a base die chiplet, and wherein the second IC die comprises a complex compute die.

6. The semiconductor package of claim 1, further comprising:
one or more additional IC dies coupled to a top surface of the first IC die.

7. The semiconductor package of claim 6, wherein at least one of the one or more additional IC dies is an IC die selected from the group consisting of an IO complex die, a graphics die, and a compute cores die.

8. A semiconductor package, comprising:
a package substrate comprising a plurality of dielectric layers and metallization layers;
a cavity within the plurality of dielectric layers and metallization layers of the package substrate;
a GaN power delivery chiplet in the cavity of the package substrate, the GaN power delivery chiplet comprising a GaN device layer and a Si-based CMOS layer;
a first die coupled to the package substrate and to the GaN power delivery chiplet; and
a second die coupled to the package substrate and to the GaN power delivery chiplet.

9. The semiconductor package of claim 8, wherein the first die is a compute complex die, and the second die is a companion die selected from the group consisting of an analog IC or an RF IC.

10. The semiconductor package of claim 8, further comprising:
one or more package thin film capacitors embedded in the package substrate.

11. The semiconductor package of claim 10, wherein a first of the package thin film capacitors is between the compute complex die and the GaN power delivery chiplet.

12. An integrated circuit structure, comprising:
a substrate;
a lower back end of line (BEOL) structure above the substrate, the BEOL structure comprising alternating dielectric layers and metallization layers;
an insulating layer on the lower BEOL structure;
an intermediate metallization layer on the insulating layer;
a micro chiplet structure in a cavity in the insulating layer;
an upper BEOL structure comprising a dielectric layer, a metallization layer and external contacts, the upper BEOL structure on the intermediate metallization layer.

13. The integrated circuit structure of claim 12, wherein the micro chiplet structure is directly between and electrically coupled to the intermediate metallization layer and to the lower BEOL structure.

14. The integrated circuit structure of claim 12, wherein the micro chiplet structure is a GaN-based structure.

15. The integrated circuit structure of claim 12, wherein the micro chiplet structure comprises metallization layers and a passivation layer.

16. The integrated circuit structure of claim 15, wherein the micro chiplet structure does not include through vias.

17. The integrated circuit structure of claim 12, further comprising:

through vias extending through the insulating layer.

18. The integrated circuit structure of claim 17, wherein the through vias electrically couple the intermediate metallization layer and the lower BEOL structure.

19. A semiconductor package, comprising:

a package substrate;

a first integrated circuit (IC) die coupled to the package substrate, the first IC die comprising a GaN device layer and a Si-based CMOS layer;

a second IC die coupled to the package substrate;

a plurality of second interconnects coupled to and extending from the package substrate; and a third IC die over and coupled to the first IC die and to the plurality of second interconnects, wherein the third IC die is coupled to the first IC die by through structure vias of the first IC die, wherein the plurality of second interconnects is located between the first and second IC dies, wherein the first IC die comprises a GaN power delivery chiplet, wherein the second IC die comprises a base die chiplet, and wherein the third IC die comprises a complex compute die.

20. A semiconductor package, comprising:

a package substrate;

a first integrated circuit (IC) die coupled to the package substrate, the first IC die comprising a GaN device layer and a Si-based CMOS layer; and one or more IC dies coupled to a top surface of the first IC die, wherein at least one of the one or more IC dies is an IC die selected from the group consisting of an IO complex die, a graphics die, and a compute cores die.

21. A semiconductor package, comprising:

a package substrate;

a first integrated circuit (IC) die coupled to the package substrate, the first IC die comprising a GaN device layer and a Si-based CMOS layer, wherein the package substrate is a ceramic package substrate or an organic package substrate;

a second IC die coupled to the package substrate;

a plurality of interconnects coupled to and extending from the package substrate; and a third IC die over and coupled to the first IC die and to the plurality of interconnects, wherein the third IC die is coupled to the first IC die by through structure vias of the first IC die.

* * * * *